United States Patent
Shih et al.

Patent Number: 5,757,655
Date of Patent: May 26, 1998

[54] METHOD AND SYSTEM FOR PRODUCING DYNAMIC PROPERTY FORMS AND COMPACTING PROPERTY DATABASES

[75] Inventors: Bohr-Winn Shih, Meridian; John Stuart Mullin, Sr., Boise, both of Id.

[73] Assignee: Micron Technology, Inc., Boise, Id.

[21] Appl. No.: 701,529

[22] Filed: Aug. 26, 1996

[51] Int. Cl.$^6$ .................................................. G06F 17/50
[52] U.S. Cl. ................................ 364/489; 364/468.28
[58] Field of Search ................................. 364/488, 489, 364/490, 491, 468.28

[56] References Cited

U.S. PATENT DOCUMENTS

| | | | |
|---|---|---|---|
| 4,813,013 | 3/1989 | Dunn | 364/900 |
| 4,965,741 | 10/1990 | Winchell et al. | 364/513 |
| 5,095,441 | 3/1992 | Hooper et al. | 364/489 |
| 5,111,413 | 5/1992 | Lazansky et al. | 364/578 |
| 5,150,308 | 9/1992 | Hooper et al. | 364/489 |
| 5,164,908 | 11/1992 | Igarashi | 364/491 |
| 5,164,911 | 11/1992 | Juran et al. | 364/578 |
| 5,212,650 | 5/1993 | Hooper et al. | 364/489 |
| 5,262,959 | 11/1993 | Chkoreff | 364/489 |
| 5,367,468 | 11/1994 | Fukasawa et al. | 364/468 |
| 5,510,998 | 4/1996 | Woodruff et al. | 364/489 |
| 5,517,421 | 5/1996 | Jimbo et al. | 364/491 |
| 5,519,630 | 5/1996 | Nishiyama et al. | 364/490 |
| 5,544,067 | 8/1996 | Rostoker et al. | 364/489 |
| 5,610,828 | 3/1997 | Kodosky et al. | 364/489 |
| 5,610,833 | 3/1997 | Chang et al. | 364/491 |
| 5,623,417 | 4/1997 | Iwasaki et al. | 364/488 |
| 5,655,109 | 8/1997 | Hamid | 395/500 |

*Primary Examiner*—Kevin J. Teska
*Assistant Examiner*—Leigh Marie Garbowski
*Attorney, Agent, or Firm*—Schwegman, Lundberg, Woessner & Kluth, P.A.

[57] ABSTRACT

A method and system for producing property forms for use in creating design schematics for an integrated circuit using computer-aided design apparatus wherein property forms are produced using a unique sophisticated cell library. The library includes a parameter database that includes base level component description format parameters which provide all of the information that is needed for creating the parameter labels, prompts, data boxes, selectors, etc. for property forms for each logic gate defined in a cell library and for a plurality of operating modes. This allows a single cell library to be used in the creation of a design schematic while permitting parameters of all logic gate instances to be specified at any one of three different design levels or modes, including a mode in which only the drive strength of n-channel type devices is specified, a mode in which the drive strengths of N and P type devices are specified, and a mode in which all of the parameters of all devices are specified. The information displayed on the property form can be customized by the user by entering customizing values for one or more of the base level parameters.

33 Claims, 45 Drawing Sheets

| | |
|---|---|
| ("inv" | 1) |
| ("inv_en" | 2) |
| ("mux" | 1) |
| ("2mux" | 2) |
| 1202 — ("2nand" | 2) |
| ("3nand" | 3) |
| ("2nor" | 2) |
| ("3nor" | 3) |
| ("2xor" | 4) |
| ("2xnor" | 4) |
| ("aoi21" | 3) |
| ("aoi22" | 4) |
| ("aoi22" | 4) |
| ("aoi221" | 5) |
| ("aoi31" | 4) |
| ("oai21" | 3) |
| ("oai22" | 4) |
| ("oai221" | 5) |
| 934a — ("oai31" | 4) |
| (t | 1) |

("invi", NA=1 PA=1)
("inv_g", NA=1 PA=1)
("inv_en", NA=2 PA=2 NB=2 PB=2)
("mux", NA=1 PA=1)
("2mux", NA=1 PA=1 NB=1 PB=1)
("2nand", NA=2 PA=1 NB=2 PB=1)
("2nand_bal", NA=1 PA=1 NB=1 PB=1)
("3nand", NA=3 PA=1 NB=3 PB=1 NC=3 PC=1)
("3nand_bal", NA=1 PA=1 NB=1 PB=1 NC=1 PC=1)
("4nand", NA=4 PA=1 NB=4 PB=1 NC=4 PC=1 ND=4 PD=1)
("5nand", NA=5 PA=1 NB=5 PB=1 NC=5 PC=1 ND=5 PD=1 NE=5 PE=1)
("2nor", NA=1 PA=2 NB=1 PB=2)
("2nor_bal", NA=1 PA=1 NB=1 PB=1)
("3nor", NA=1 PA=3 NB=1 PB=3 NC=1 PC=3)
("3nor_bal", NA=1 PA=1 NB=1 PB=1 NC=1 PC=1)
("4nor", NA=1 PA=4 NB=1 PB=4 NC=1 PC=4 ND=1 PD=4)
("5nor", NA=1 PA=5 NB=1 PB=5 NC=1 PC=5 ND=1 PD=5 NE=1 PE=5)
("2xor", NA=2 PA=2 NB=2 PB=2 NC=2 PC=2 ND=2 PD=2)
("2xnor", NA=2 PA=2 NB=2 PB=2 NC=2 PC=2 ND=2 PD=2)
("aoi21", NA=2 PA=2 NB=2 PB=2 NC=2 PC=2 ND=2 PD=2)
("aoi22", NA=2 PA=2 NB=2 PB=2 NC=2 PC=2 ND=2 PD=2)
("aoi221", NA=2 PA=3 NB=2 PB=3 NC=2 PC=3 ND=2 PD=3 NE=1 PE=3)
("aoi31", NA=3 PA=2 NB=3 PB=2 NC=3 PC=2 ND=2 PD=1)
("oai21", NA=2 PA=2 NB=2 PB=2 NC=2 PC=2 ND=1 PD=2)
("oai22", NA=2 PA=2 NB=2 PB=2 NC=2 PC=2 ND=2 PD=2)
("oai221", NA=3 PA=2 NB=3 PB=2 NC=3 PC=2 ND=3 PD=2 NE=3 PE=1)
("oai31", NA=2 PA=3 NB=2 PB=3 NC=2 PC=3 ND=2 PD=1)

```
; ©1996, Micron Technology, Inc.
procedure ( MScdfGateCreateBaseParam (LIBRARY)
    prog( ( libId cdfId category)
        unless( libId = dmOpenLib( LIBRARY )
            error("Could not open library %s."LIBRARY)
            return ( nil )
        )
        foreach( CATG setof(category libId->category member(
                category->name list("INV" "MUX" "NAND" "NOR" "XOR" "LOGIC")))
            foreach ( cellId CATG->members
                when ( cdfId = cdfGetBaseCellCDF( cellId )
                    cdfDeleteCDF( cdfId ))
                cdfId = cdfCreateBaseCellCDF( cellId )
                MS_cdfGateCreate( cidId )
                cdfSaveCDF( cdfId )
            )
        )
    )
)
```

FIG. 30

```
3001  procedure ( MS_cdfGateCreate ( cdfId)
3002       cdfCreateParam ( cdfId
3003            ?name           "useGateSize"
3004            ?prompt         "useGateSize"
3005            ?type           "boolean"
3006            ?defValue       t
3007            ?display        "_MS_CDF_DEV"
3008       )
3009       cdfCreateParam ( cdfId   ; number of gate inputs - 2nand = 2, 2nand_en = 2.
3010            ?name           "inputs"
3011            ?prompt         " inputs"
3012            ?type           "int"
3013            ?defValue       MS_cdfGateCount ( cdfId->id->name)
3014            ?display        "_MS_CDF_DEV"
3015            ?editable       "nil"
3016            ?dontSave       "t"
3017       )
3018       cdfCreateParam ( cdfId   ; drive strength of an equivalent inverter
3019            ?name           "Wp"
3020            ?prompt         "Wp (drive strength)"
3021            ?type           "string"
3022            ?defValu        "iPar ( \"PNR\") * iPar ( \"Wn\")"
3023            ?parseAsCEL     "yes"
3024            ?parseAsNumber  "yes"
3025            ?display        strcat ( "cdfgData->gateSize->value=\"N,P\" ||"
3026                                     "cdfgData->gateSize->value=\"explicit\"")
3027            ?editable       "cdfgData->gateSize->value=\"N,P\""
3028       )
3029       cdfCreateParam ( cdfId   ; drive strength of an equivalent inverter
3030            ?name           "Wn"
3031            ?prompt         "Wn (drive strength)"
3032            ?type           "string"
3033            ?defValue       "iPar (\"NDEFW\")"
3034            ?parseAsCEL     "yes"
3035            ?parseAsNumber  "yes"
3036            ?editable       strcat ( "cdfgData->gateSize->value=\"N\" ||"
3037                                     "cdfgData->gateSize->value=\"N,P\"")
3038       )
3039;©Micron Technology, Inc. 1996
```

FIG. 30A

```
3040    cdfCreateParam ( cdfId    ; always explicit
3041            ?name             "Lp"
3042            ?prompt           "Lp"
3043            ?type             "string"
3044            ?defValue         "iPar (\"PDEFL\")"
3045            ?parseAsCEL       "yes"
3046            ?parseAsNumber    "yes"
3047            ?display          strcat ( "cdfgData->gateSize->value=\"N,P\" ||  "
3048                                       "cdfgData->gateSize->value=\"explicit\ ")
3049            ?editable         "cdfgData->gateSize->value=\"N,P\""
3050    )
3051    cdfCreateParam ( cdfId    ; always explicit
3052            ?name             "Ln"
3053            ?prompt           " Ln"
3054            ?type             "string"
3055            ?defValue         "iPar (\"NDEFL\")"
3056            ?parseAsCEL       "yes"
3057            ?parseAsNumber    "yes"
3058            ?display          "strcat ( "cdfgData->gateSize->value=\ "N, P\" ||"
3059                                        "cdfgData->gateSize->value=\ "explicit\")
3060            ?editable         "cdfgData->gateSize->value=\"N, P\""
3061    )
3062    for ( i 1 cdfId->inputs->value
3063            MS_cdfGateExplicit ( cdfId getchar ( "ABCDEFGHI" i ) )
3064    )
3065    cdfCreateParam ( cdfId              ; gate bn property
3066            ?name             "bnP"
3067            ?prompt           " bnP"
3068            ?type             "string"
3069            ?defValue         "iPar (\"bnPLib\")"
3070            ?display          "_MS_CDF_DEV"
3071            ?editable         "nil"
3072            ?parseAsCEL       "yes"
3073    )
3074;©Micron Technology, Inc. 1996
```

FIG. 30B

| | | |
|---|---|---|
| 3075 | cdfCreateParam ( cdfId | ; gate bn property |
| 3076 | ?name | "bnN" |
| 3077 | ?prompt | " bnN" |
| 3078 | ?type | "string" |
| 3079 | ?defValue | "iPar (\"bnNLib\")" |
| 3080 | ?display | "_MS_CDF_DEV" |
| 3081 | ?editable | "nil" |
| 3082 | ?parseAsCEL | "yes" |
| 3083 | ) | |
| 3084 | cdfCreateParam ( cdfId | ; gate bn display |
| 3085 | ?name | "bnPDisplay" |
| 3086 | ?prompt | " bnP" (Bulk node PMOS) |
| 3087 | ?type | "radio" |
| 3088 | ?choices | _MS_CDF_POWER_LIST |
| 3089 | ?defValue | car(_MS_CDF_POWER_LIST) |
| 3080 | ?dontSave | "t" |
| 3090 | ) | |
| 3091 | cdfCreateParam ( cdfId | ; gate bn display |
| 3092 | ?name | "bnNDisplay" |
| 3093 | ?prompt | " bnN" (Bulk node NMOS) |
| 3094 | ?type | "radio" |
| 3095 | ?choices | _MS_CDF_GROUND_LIST |
| 3096 | ?defValue | car(_MS_CDF_GROUND_LIST) |
| 3097 | ?dontSave | "t" |
| 3098 | ) | |
| 3099 | cdfId->formInitProc = "MScdfGateIP" | |
| 30100 | cdfId->doneProc    = "MScdfGateDP" | |

30101; ©Micron Technology, Inc. 1996

FIG. 30C

```
3101    ; ©1996, Micron Technology, Inc.
3102    procedure ( MS_cdfGateExplicit ( cdfId letter)
3103             ; letter is the suffix to be added to the parameters. ie A, B, ...
3104                ; labels
3105    cdfCreateParam ( cdfId
3106             ?name          strcat ( "stackP" letter)
3107             ?prompt        strcat ( "stackP" letter)
3108             ?type          "string"
3109             ?defValue      MS_cdfGateStack ( cdfId strcat ("P" letter))
3110             ?display       "_MS_CDF_DEV"
3111             ?editable      "nil"
3112             ?dontSave      "t"
3113    )
3114    cdfCreateParam( cdfId
3115             ?name          strcat ( "stackN" letter)
3116             ?prompt        strcat ( "stackN" letter)
3117             ?type          "string"
3118             ?defValue      MS_cdfGateStack ( cdfId strcat ("N" letter))
3119             ?display       "_MS_CDF_DEV"
3120             ?editable      "nil"
3121             ?dontSave      "t"
3122    )
3123    cdfCreateParam( cdfId
3124             ?name          strcat ( "wp" letter)
3125             ?prompt        strcat ( "wp" letter)
3126             ?type          "string"
3127             ?defValue      "strcat ( "iPar ( \ "Wp\")"
3128                               evalstring (strcat ( "cdfId->stackP" letter "->value")) )
3129             ?parseAsCEL    "yes"
3130             ?parseAsNumber "yes"
3131             ?display       "cdfgData->gateSize->value=\ "explicit\""
3132             ?editable      "cdfgData->gateSize->value=\ "explicit\""
3133    )
```

FIG. 31

```
3134  cdfCreateParam ( cdfId
3135        ?name           strcat ( "wn" letter)
3136        ?prompt         strcat ( "wn" letter)
3137        ?type           "string"
3138        ?defValue       strcat ( "iPar ( \"Wn\")"
3139                            evalstring (strcat ("cdfId->stackN" letter "->value")) )
3140        ?parseAsCEL     "yes"
3141        ?parseAsNumber  "yes"
3142        ?display        "cdfgData->gateSize->value==\"explicit\""
3143        ?editable       "cdfgData->gateSize->value==\"explicit\""
3144  )
3145  cdf CreateParam ( cdf Id
3146        ?name           strcat ( "lp" letter)
3147        ?prompt         strcat ( "lp" letter)
3148        ?type           "string"
3149        ?defValue       "iPar (\"Lp\")"
3150        ?parseAsCEL     "yes"
3151        ?parseAsNumber  "yes"
3152        ?display        "cdfgData->gateSize->value==\"explicit\""
3153        ?editable       "cdfgData->gateSize->value==\"explicit\""
3154  )
3155  cdfCreateParam ( cdfId
3156        ?name           strcat ( "ln" letter)
3157        ?prompt         strcat ( "ln" letter)
3158        ?type           "string"
3159        ?defValue       "iPar (\"Ln\")"
3160        ?parseAsCEL     "yes"
3161        ?parseAsNumber  "yes"
3162        ?display        "cdfgData->gateSize->value==\"explicit\""
3163        ?editable       "cdfgData->gateSize->value==\"explicit\""
3164  )
3165  ; ©1996, Micron Technology, Inc.
```

FIG. 31A

```
; ©1996, Micron Technology, Inc.
procedure (MScdfLibCreateBaseParam (LIBRARY)
        prog ( (libId cdfId)
              libId = dbOpenLib (LIBRARY)
              when (cdfId = cdfGetBaseLibCDF (libId)
                    cdfDeleteCDF (cdfId)
              )
              cdfId = cdfCreateBaseLibCDF (libId)
              foreach (param _MS_CDF_LIB_PARAMS_ALL
                    MScdfLibCreateParam (param)
              )
              cdfId->buttonFieldWidth    =    340
              cdfId->fieldWidth          =    400
              cdfId->fieldHeight         =    35
              cdfId->promptWidth         =    155
              cdfId->paramEvaluate       =    "nil nil nil nil t"
              cdfId->paramLabelSet       =    "nil"
              cdfId->paramDisplayMode    =    "parameter"
              cdfId->paramSimType        =    "DC"
              cdfId->paramSimTime        =    "0"
              cdfId->termDisplayMode     =    "netName"
              cdfId->termSimType         =    "DC"
              cdfId->termSimTime         =    "0"
              cdfId->netNameType         =    "schematic"
              cdfId->instDisplayMode     =    "instName"
              cdfId->instNameType        =    "schematic"
              cdfId->simInfo             =    list (nil)
              cdfSaveCDF (cdfId)
              dbCloseLib (libId)
              return (t)
        )
)
```

FIG. 32

```
3300  ;©1996, Micron Technology, Inc.
3301  procedure (MScdfLibCreateParam (param @optional value)
3302     if (member (param '(_MS_CDF_GLOBAL_VAR) then
3303           param = get_string (param)
3304           ; .simrc global variables
3305           let ( ()
3306                 cdfCreateParam (cdfId
3307                       ?name             param
3308                       ?prompt           strcat (" " param)
3309                       ?type             "string"
3310                       ?defValue         if (value then value else "1")
3311                       ?parseAsCEL       "yes"
3312                       ?parseAsNumber    "yes"
3313                       ?display          "MS_CDF_DEV"
3314                       ?editable         "nil"
3315                       ?dontSave         "t"
3316                 )
3317           )
3318     else
3319           ;everything but .simrc global variables
3320           case (param
3321                 ( (gateSize)
3322                       cdfCreateParam (cdfId
3323                             ?name             "gateSize"
3324                             ?prompt           "gateSize"
3325                             ?type             "radio"
3326                             ?choices          '("N" "N,P" "explicit")
3327                             ?defValue         if (value value "N")
3328                             ?use              "cdfgData ->useGateSize"
3329                             ?callback         "MScdfGateModeCB ()"
3230                       )
3331                 )
3332                 (   (toolFilter)
3333                       cdfCreateParam (cdfId
3334                             ?name             "toolFilter"
3335                             ?prompt           "toolFilter"
3336                             ?type             "radio"
3337                             ?choices          '(" " "lvs" "hsp" "all")
3338                             ?defValue         if (value value " ")
3339                             ?dontSave         "t"
3340                             ?use              " "
3341                       )
3342                 )
3343                 (   (m)
3344                       cdfCreateParam (cdfId
```

FIG. 33

| | | | |
|---|---|---|---|
| 3345 | | ?name | "m" |
| 3346 | | ?prompt | "m (local multiplier)" |
| 3347 | | ?type | "string" |
| 3348 | | ?defValue | if (value then value else "1") |
| 3349 | | ?editable | "t" |
| 3350 | | ?parseAsCEL | "yes" |
| 3351 | | ?parseAsNumber | "yes" |
| 3352 | | ?display | "member (cdfgData->toolFilter->value (\ "hsp\" \ "all\"))" |
| 3353 | | ?use | "t" |
| 3354 | | ) | |
| 3355 | ) | | |
| 3356 | ( | (bnPLib bnNLib) | |
| 3357 | | param = get_string (param) | |
| 3358 | | cdfCreateParam (cdfId | |
| 3359 | | ?name | param |
| 3360 | | ?prompt | strcat (" " param) |
| 3361 | | ?type | "radio" |
| 3362 | | ?choices | case ( param |
| 3363 | | | (("bnPLib") _MS_CDF_POWER_LIST) |
| 3364 | | | (("bnNLib") _MS_CDF_GROUND_LIST) |
| 3365 | | ?defValue | if (value then value |
| 3366 | | | else |
| 3367 | | | case (param |
| 3368 | | | ( ("bnPLib")car(_MS_CDF_POWER_LIST)) |
| 3369 | | | ( ("bnNlib") car (_MS_CDF_GROUND_LIST))) |
| 3370 | | | ) |
| 3371 | | ?display | "_MS_CDF_DEV" |
| 3372 | | ?dontSave | "t" |
| 3373 | | ) | |
| 3374 | ) | | |
| 3375 | ( | (paramX) | |
| 3376 | | cdfCreateParam (cdfID | |
| 3377 | | ?name | "paramX" |
| 3378 | | ?prompt | "paramX" |
| 3379 | | ?type | "string" |
| 3380 | | ?defValue | "" |
| 3381 | | ?editable | "t" |
| 3382 | | ?parseAsCEL | "yes" |
| 3383 | | ?parseAsNumber | "yes" |
| 3384 | | ?display | "_MS_CDF_DEV" |
| 3385 | | ?use | "t |
| 3386 | | ) | |
| 3387 | ) | | |
| 3388 ; ©1996, Micron Technology, Inc. | | | |

FIG. 33A

```
3392        (       (paramY)
3393                cdfCreateParam (cdfID
3394                    ?name           "paramY"
3395                    ?prompt         "paramY"
3396                    ?type           "string"
3397                    ?defValue       ""
3398                    ?editable       "t"
3399                    ?parseAsCEL     "yes"
33100                   ?parseAsNumber  "yes"
33101                   ?display        "_MS_CDF_DEV"
33102                   ?use            "t
33103               )
33104       )
33105   )
33106 )
33107 ; ©1996, Micron Technology, Inc.
```

FIG. 33B

```
; ©1996, Micron Technology, Inc.
procedure (MScdfLibCreateUserParam (LIBRARY)
    prog ( (libId cdfId)
        if( stringp ( LIBRARY) then
            libId = dmOpenLib (LIBRARY)
        else
            libId = LIBRARY
        when (cdfId = cdfGetUserLibCDF (libId)
            cdfDeleteCDF (cdfId)
        )
        when( cdfId = cdfCreateUserLibCDF (libId)
        foreach (param _MS_CDF_LIB_PARAM_ALL
            if (boundp (param) then
                if (numberp (eval (param)) then
                    value = printstring (eval (param))
                else
                    if (stringp (eval (param))) then
                        value = eval (param)
                    else
                        printf ("%s: data type is not allowed\n" param)
                    )
                )
                MScdfLibCreateParam (param value)
            )
        )
        return (t)
    )
)
```

FIG. 34

```
Procedure ( MScdfGateIP ( cdfDataId)
  println(cdfDataId)
  prog( (bnList par parN parS val cmd)
    bnList = ' (bnP bnN)
    if( cdfgForm->_formName == "Edit Object Properties" then
      iIInst = cdfgForm->objId
      cdfDataId->bnPDisplay->value - cdsParam("-bnP")
      cdfDataId->bnPDisplay->value - cdsParam("-bnN")
      return(nil)
    )
    if( cdfgForm->_formName == "Add Component" then
      foreach( par cfdDataId->parameters
        parN = par->name
        parS = "makesymbol" ( parN)
        unless (member ( parS _MS_CDF_LIB_PARAM_ALL)
          if( member( parS bnList) then
            if boundp( parS) then
              sprintf( cmd "cdfDataId->%sDisplay->value = %s parS parS)
              evalstring(cmd )
            else
              sprintf(cmd "cdfDataId->%sDisplay->value = cdfDataId->%sLib->value"parS parS)
              evalstring(cmd )
            )
          else
            if( boundp( parS)  then
              if numberp( eval(parS) ) then
                val = "get_string"( eval(parS))
                sprintf( cmd "cdfDatId->%s->value = \"%s\\" ", parN, val)
              else
                val = eval (parS)
                sprintf( cmd "cdfDatId->%s->value = \"%s\\" ", parN, val)
              )
              printf("%s\n"cmd)
              evalstring( cmd)
            )
          )
        )
      )
    else
      return(nil)
    )
  )
);©1996, Micron Technology, Inc.
```

FIG. 35

```
; ©1996, Micron Technology, Inc.
procedure( MScdfGateModeCB()
  prog( (illnst i prefix command cmd)
    if( cdfgForm->_formName == "Add Component" then
      return(nil)
    )
    if( cdfgForm->_formName == "Edit Object Properties" then
      unless (schObjPropForm->objId return (nil)
      illnst = schObjPropForm->objId
        if( cdfgData->gateSize->value == "N" then
        cdfgData->Wn->value = cdsParam("-Wn")
    )
    if ( cdfgData->gateSize->value == "N,P" then
      foreach ( param ' "Wp" "Wn" "Lp" "Ln")
        sprintf ( command "errsetstring(cdfgData->%s->value) == nil" param)
        if ( evalstring( command) then
          sprintf ( command "cdfgData->%s->value"= cdsParam (\"-%s\") param param)
          evalstring( command)
        )
      )
    )
    if ( cdfgData->gateSize->value == "explicit" then
      for ( i 1 cdfgData->inputs->value
        foreach ( prefix ' ("wp" "wn" "lp" "ln")
          param = strcat ( prefix getchar ( "ABCDEFGHI" i))
          sprintf ( command "errsetstring(cdfgData->%s->value) == nil" param)
          if ( evalstring ( command) then
            sprintf (command "cdsParam(\"-%s\")" param)
            printf ("%s == %s\n" command evalstring ( command) )
            sprintf ( command "cdfgData->%s->value= cdsParam (\"-%s\)" param param)
            evalstring ( command)
          )
        )
      )
    )
  )
  return(t)
  )
)
```

FIG. 36

```
;©1996, Micron Technology, Inc.
procedure( MScdfGateDP( dbId)
   case( cdfgData->gateSize->value
      ( "N"
         MS_cdfGateVerifyN ( dbId)
         MS_cdfGatePurgeNP( dbId)
         MS_cdfGatePurgeExplicit( dbId)
      )
      ("N,P"
         MS_cdfGateVerifyNP( dbId)
         MS_cdfGatePurgeExplicit( dbId)
      )
      ( "explicit"
         MS_cdfGateVerifyExplicit( dbId)
      )
   )
   MS_cdfGateVerifyBulk( dbId)
)
```

FIG. 37

```
3800 ;©1996, Micron Technology, Inc.
3801 procedure( MS_cdfGateVerifyN( dbId)
3802   prog( (ilInst param command paramX)
3803     ilInst = dbId
3804     sprintf( command "dbId->paramX = cdfgData->Wn->defValue")
3805     evalstring( command)
3806     sprintf( command,
3807       "evalstring(cdsParam(\"-Wn\"))"==evalstring(cdsParam(\-paramX\"))")
3808     if( evalstring( command) then
3809       dbDeletePropByName( dbId param)
3810     )
3811   )
3812 )
3813 procedure( MS_cdfGateVerifyNP( dbId)
3814   prog( (ilInst param command paramX)
3815     ilInst = dbId
3816     foreach( param '("Wp" "Wn" "Lp" "Ln")
3817       sprintf( command "cdfgData->%s->value" param)
3818       if( evalstring( command) then
3819         sprintf( command "dbId->paramX = cdfgData->%s->defValue" param)
3820         evalstring( command)
3821         sprintf( command,
3822           "evalstring(cdsParam(\"-%s\"))"==evalstring(cdsParam(\"-paramX\"))" param)
3823         if( evalstring( command) then
3824           dbDeletePropByName( dbId param)
3825         )
3826       )
3827     )
3828   )
3829 )
```

FIG. 38

```
3830 procedure( MS_cdfGateVerifyExplicit( dbId)
3831   prog( (illnst param command paramX)
3832     illnst = dbId
3833     for( i 1 cdfgData->inputs->value
3834       foreach( prefix '("wp" "wn" "lp" "ln")
3835         sprintf( param strcat( prefix getchar("ABCDEFGHI" i)))
3836         sprintf ( command "cdfgData->%s->value" param)
3837         if( evalstring( command) then
3838           sprintf( command "dbId->paramX = cdfgData->%s->defValue" param)
3839           evalstring( command)
3840           sprintf( command,
3841             "numberp( readstring( cdsParam(\"-%s\")))", param)
3842           if( evalstring( command) then
3843             sprintf ( command,
3844             "evalstring(cdsParam(\"-%s\"))==evalstring(cdsParam(\"paramX\"))" param)
3845           else
3846             sprintf( command, "cdsParam(\"-%s\") == cdsParam(\"-paramX\")" param)
3847           )
3848           if( evalstring( command) then
3849             dbDeletePropByName( dbId param)
3850           )
3851         )
3852       )
3853     )
3854   )
3855 )
3856 ; ©1996, Micron Technology, Inc.
```

FIG. 38A

```
; ©1996, Micron Technology, Inc.
procedure( MS_cdfGatePurgeNP( dbId)
    foreach( prop '("Wp " "Ln" "Lp ")
        dbDeletePropByName( dbId prop)
    )
)
```

FIG. 39

```
; ©1996, Micron Technology, Inc.
procedure( MS_cdfGatePurgeExplicit( dbId)
    for( i 1 cdfgData->inputs->value
        foreach( prop '("wp " "wn" "lp" "ln")
            dbDeletePropByName( dbId strcat( prop getchar( "ABCDEFGHI" i)))
        )
    )
)
```

FIG. 40

```
;©1996, Micron Technology, Inc.
procedure (MS_cdfGateVerifyBulk (dbID)
prog ( (ilInst param command paramX)
    ilInst = dbID
    foreach (param '("bnN" "bnP")
        sprintf (command "cdfgData ->%s->value" param)
        if (evalstring (command) then
            sprintf (command."dbID->paramX = cdfgData->%s->defValue" param)
            evalstring (command)
            sprintf (command,
                "cdfgData->%sDisplay->value==cdsParam(\"-paramX\")" param)
            if (evalstring (command) then
                dbDeletePropByName (dbID param)
        else
            sprintf (command "dbID->%s = cdfgData->%sDisplay->value" param param)
            evalstring (command)
        )
    )
    dbDeletePropByName (dbID "paramX")
    dbDeletePropByName (dbID "paramY")
)
```

FIG. 41

METHOD AND SYSTEM FOR PRODUCING DYNAMIC PROPERTY FORMS AND COMPACTING PROPERTY DATABASES

A portion of the disclosure of this patent document contains material which is subject to copyright protection. The copyright owner has no objection to the facsimile reproduction by anyone of the patent document or the patent disclosure, as it appears in the Patent and Trademark Office patent files or records, but otherwise reserves all copyrights whatsoever.

FIELD OF THE INVENTION

The present invention relates generally to the design of integrated circuits using computer-aided design apparatus, and in particular, the present invention relates to a method and system for producing property forms and compacting property databases in the computer-aided design of circuit design schematics, and wherein a unique sophisticated cell library is created which provides a parameter database that allows schematic design to be conducted in a plurality of design modes.

BACKGROUND OF THE INVENTION

In designing integrated circuits using computer-aided design apparatus, a design engineer produces a schematic of the integrated circuit that is being designed by selecting specific devices or sub-circuits from a device library and interconnecting the terminals of the devices or sub-circuits as required to form the schematic. The device library contains digital data for producing representations of common devices or sub-circuits. The devices and sub-circuits are categorized in the library by design parameters and/or operating characteristics. Selection of a device or sub-circuit from the device library causes a representation of the selected device or sub-circuit to be displayed on the screen of a display unit.

Different design methodologies are used in the design of integrated circuit memory devices depending upon the type of integrated circuit device that is being designed. For example, in designing dynamic random access memory (DRAM) devices, circuit designers generally specify logic gates of such circuits in terms of their drive strengths. However, in designing static random access memory (SRAM) devices, circuit designers generally specify components of such circuits in terms of device parameters, such as channel length and width for the field-effect transistors that form the integrated circuit memory. Because the two design methodologies are based on different hierarchies, two device libraries are required, one library for use in the design of DRAM type memory devices and a separate library for use in the design of SRAM type memory devices. In many cases, a circuit designer may have to access both libraries during the design process. The need to access two different device libraries makes the circuit design process less efficient.

For the reasons stated above, and for other reasons stated below which will become apparent to those skilled in the art upon reading and understanding the present specification, there is a need in the art to be able obtain logic gate drive strength and/or device parameters from a single cell library for use in creating a circuit schematic for an integrated circuit.

SUMMARY OF THE INVENTION

The present invention provides a method and system for producing property forms for use in creating a design schematic for an integrated circuit that is being designed using a computer-aided design apparatus. In accordance with the invention, a parameter database is provided that stores parameter data representing at least parameter labels and default expressions for parameter values for component description format parameters for the devices that form each of a plurality of circuits defined in a cell library and for each of a plurality of design modes. One of the design modes is selected and a circuit to be placed on the design schematic selected from the cell library. Then, the parameter database is accessed to obtain parameter data representing the parameter labels and the parameter default expressions for component description format of the selected circuit and for the selected design mode. The parameter data obtained is provided to the property form so that the property form includes parameter labels and parameter default expressions for component description format parameters of the current instance of the selected circuit for the selected design mode.

In accordance with another aspect of the invention, a value for at least one component description format parameter that is indicated by a default expression on the property form is entered onto the property form to produce design data for the current instance of the selected circuit, and the design data is saved in a further database. The saving of the design data includes compacting the further database.

In accordance with a further aspect of the invention, the parameter database is created by accessing at least one data structure to obtain first data indicating the number of devices that form each of a plurality of logic gates defined in the cell library and second data indicating the number of inputs for each of the logic gates defined in the cell library. The data is used to create for each of the logic gates, and for each of a plurality of design modes, a first set of component description format parameters, each set of the first set of parameters being unique to a different one of the logic gates. Then, a second set of component description format parameters is created for each of the logic gates and for each design mode. The parameters of second set of parameters being the same for all of the logic gates. The first and second sets of parameters provide the parameter data for the parameter database.

Further in accordance with the invention, there is provided a method and system for producing a property form for use in the creation of a design schematic for an integrated circuit that is being designed using a computer-aided design apparatus. In accordance with the invention, there is provided a parameter database storing base level parameter data representing at least parameter labels and standard default values for the component description format parameters for devices that form each of a plurality of circuits that are contained in a cell library. A customizing database is provided for storing customizing values for parameter default values for the parameters. A user level parameter database is created by accessing the parameter database to obtain the base level parameter data for a selected circuit. Then, for each parameter having a customizing value stored in the customizing database, the standard default value for the parameter is replaced with the customizing value so that the user level parameter database contains the customized value for the parameter. The user level parameter data is provided to the property form being produced.

In accordance with another aspect of the invention, there is provided a computer program product comprising a computer usable medium having computer readable program code means embodied therein for use in controlling a computer in the creation of a property form for use in the creation of a design schematic using a computer-aided design apparatus. The computer readable program code means in the computer program product includes computer readable program code means for causing a computer to provide a parameter database storing parameter data representing at least parameter labels and default expressions for parameter values for component description format parameters for the devices that form each of a plurality of circuits defined in a cell library and for each of a plurality of design modes. The invention further includes computer readable program code means for causing a computer to select one of the design modes and computer readable program code means for causing a computer to select a circuit to be placed on the design schematic. The invention further includes computer readable program code means for causing a computer to access the parameter database to obtain parameter data representing the parameter labels and the parameter default expressions for the component description format parameters of the selected circuit and for the selected design mode. In addition, computer readable program code means is provided for causing a computer to provide the parameter data obtained to the property form so that the property form includes parameter labels and parameter default expressions for component description format parameter of the current instance of the selected circuit for the selected design mode, and computer readable program code means is provided for causing a computer to enter onto the property form a value for at least one of the component description format parameters that is indicated by a parameter default expression on the property form to produce design data for the current instance of the selected circuit.

BRIEF DESCRIPTION OF THE DRAWINGS

FIG. 12 illustrates the information contained in the look-up structure Gate Count;

FIG. 13 illustrates the information contained in the look-up structure Gate Stack;

FIG. 30 is a listing of an exemplary code segment for the procedure "MScdfGateCreateBaseParam( )";

FIGS. 30A, 30B and 30C are a listing of an exemplary code segment for the procedure MS_cdfGateCreate;

FIGS. 31 and 31A are a listing of an exemplary code segment for the procedure MS_cdfGateExplicit;

FIG. 32 is a listing of an exemplary code segment for the procedure MScdfLibCreateBaseParam( );

FIGS. 33, 33A and 33B are a listing of an exemplary code segment for the procedure MScdfLibCreateParam( );

FIG. 34 is a listing of an exemplary code segment for the procedure MScdfLibCreateUserParam( );

FIG. 35 is a listing of an exemplary code segment for the procedure MScdfGateIP( );

FIG. 36 is a listing of an exemplary code segment for the procedure MScdfGateModeCB( );

FIG. 37 is a listing of an exemplary code segment for the procedure MScdfGateDP( );

FIGS. 38 and 38A are a listing of an exemplary code segment for procedures MS_cdfGateVerifyN; MS_cdfGateVerifyNP; and MS_cdfGateVerifyExplicit;

FIG. 39 is a listing of an exemplary code segment for the procedure MS_cdfGatePurgeNP;

FIG. 40 is a listing of an exemplary code segment for the procedure MS_cdfGatePurgeExplicit; and FIG. 41 is a listing of an exemplary code segment for the procedure MS_cdfGateVerifyBulk( ).

DESCRIPTION OF THE PREFERRED EMBODIMENT

In the following detailed description of the preferred embodiment, reference is made to the accompanying drawings which form a part hereof, and in which is shown by way of illustration a specific preferred embodiment in which the invention may be practiced. The preferred embodiment is described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the appended claims.

Device Representation

Figure 1:
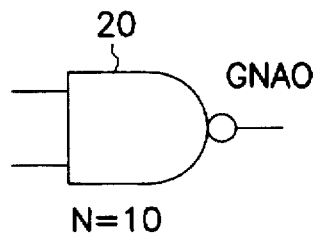
FIG. 1 is a symbol for a logic gate having parameters specified in terms of its drive strength for n-channel devices that form the logic gate.

The present invention is described with reference to an application for creating a circuit schematic that includes an instance GNA0 of a conventional NAND gate, the symbol 20 of which is shown in FIG. 1. However, as will be shown, in accordance with one aspect of the invention, a database is created which permits a single unique sophisticated library of logic gates or other circuits to be used with conventional schematic design tools. The design tools receive user-supplied functions, also provided by the invention, allowing schematic design to be conducted on the basis of logic gate drive strength and/or device parameters, using a single cell library.

Logic gates can be added to a circuit schematic based on drive strength or on an explicit basis. In the former mode, the logic gate being placed on a schematic is represented by a symbol of the logic gate, such as NAND gate GNA0, having its drive strength specified. Conventionally, the drive strength is represented by the width of the gate region of the n-channel transistors that form the logic gate. In this mode, when a logic gate is called from a cell library, the information that is displayed on the screen is as shown in FIG. 1.

Figure 3:
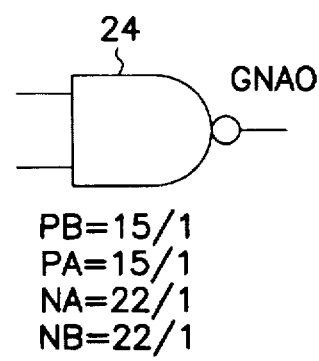
FIG. 3 is a symbol for a logic gate having devices specified in terms of channel widths and lengths for the n-channel and p-channel devices that form the logic gate.

The logic gate can also be represented on an explicit level in which the width and length of the elements, including n-channel and p-channel transistors, that form the logic gate are specified. When a logic gate is called from a cell library, the information that is displayed at the explicit level is as shown in FIG. 3 for NAND gate GNA0. Known schematic design tools require separate device libraries for these two modes of design.

Operating Modes

In accordance with the invention, a database is created which permits a single standard cell library to be used, allowing logic gates to be specified either by drive strength or in terms of explicit parameters. The invention automatically converts from drive strength to explicit parameters or from explicit parameters to drive strength in response to mode selection commands provided by the circuit designer. In addition, the invention provides an intermediate design level in which gate elements, such as NAND gate GNA0 shown in FIG. 2, can be specified in terms of the drive strengths for the n-channel transistors and the p-channel transistors that form the logic gate. Thus, in one embodiment, the invention provides three design levels or modes, hereinafter referred to as "N mode", "NP mode", and "Explicit mode". In N mode (FIG. 1), gate size is specified in terms of one single drive strength for the gate. In NP mode (FIG. 2), the gate size is specified in terms of the drive strengths for two types of devices, i.e., the n-channel and the p-channel devices, that form the logic gate. In Explicit mode (FIG. 3) the parameters of each gate device are specified in terms of parameters for all of the devices that form the logic gate.

Figure 2:
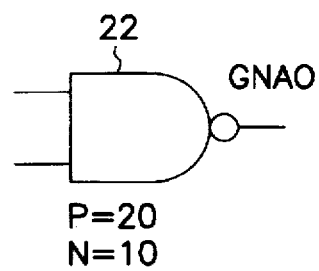
FIG. 2 is a symbol for a logic gate having parameters specified in terms of drive strengths for n-channel and p-channel devices that form the logic gate.

To illustrate this, reference is made to FIGS. 1–3. FIG. 1 illustrates the symbol 20 that is displayed on the display screen of a computer-aided design (CAD) apparatus for the NAND gate GNA0 when the N mode is selected. Contained within the symbol 20 is the notation "10", which indicates that the NAND gate GNA0 has a drive strength of ten.

Figure 1A:
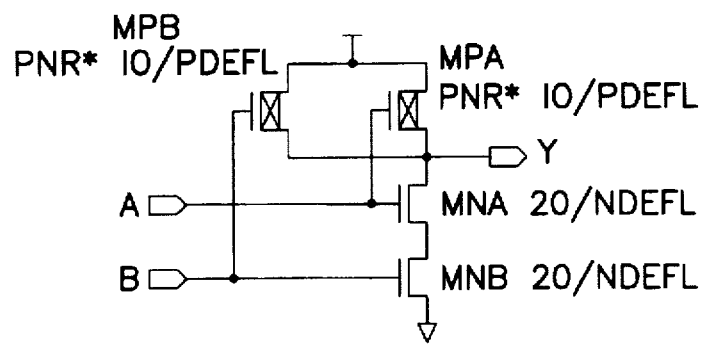
FIG. 1A is a schematic circuit diagram for the logic gate of FIG. 1.

The NAND gate GNA0 also can be represented by the schematic of FIG. 1A. As shown in FIG. 1A, the NAND gate GNA0 includes p-channel transistors MPA and MPB and n-channel transistors MNA and MNB. The gates of MPA and MNA are commonly connected to a node A. Thus, the suffix "A""A" for the transistors MPA and MNA. The gates of MPB and MNB are commonly connected to a node B. Thus, the suffix "B""B" for the transistors MPB and MNB. The sources of MPA and MPB are connected to a voltage source vcc in the conventional manner. The drains of MPA and MPB are commonly connected to a node Y. MNA and MNB are connected in series between node Y and ground. In the example, the widths wnA and wnB of the n-channel transistors MNA and MNB are specified as being "20" and the lengths lnA and lnB of MNA and MNB are default values as indicated by the notations NDEFL. The drive strength Wn for the NAND gate GNA0 is expressed by the default expression iPar("NDEFW") which is equal to "10" in the example. The drive strength of the logic gate expressed in terms of lengths LnA and LnB of the n-channel transistors is given by default expression iPar("NDEFL").

The expression "iPar( )" is a function in a parameter passing environment known as Cadence Expression Language (CEL). The function "iPar( )" passes parameters locally, obtaining the value of the parameter from the current instance or from a library database that is created in accordance with the invention as will be described.

For the p-channel transistors, the drive strength Wp is specified in terms of a ratio of the width of the n-channel transistors. The drive strength Wp is expressed as "iPar (PNR)*iPar(Wn)". The term "PNR" represents the nominal ratio of device sizes between P-type and N-type. In the example, the term PNR is equal to 1.5 and as will be shown, the drive strength Wp of the p-channel transistors is "15" in the example. The drive strength of the logic gate expressed in terms of lengths LpA and LpB of the p-channel transistors is given by default expression iPar("PDEFL").

Figure 2A:
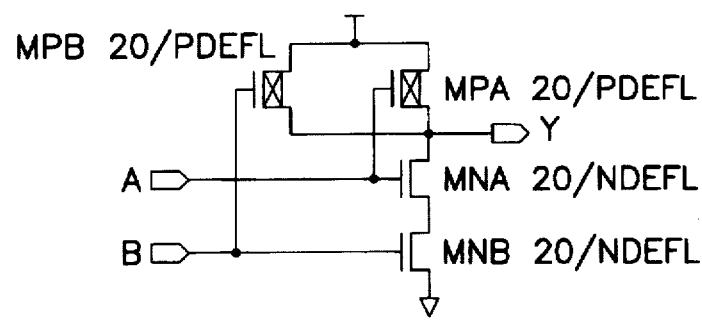
FIG. 2A is a schematic circuit diagram for the logic gate of FIG. 2.

FIG. 2 illustrates the symbol 22 that is displayed on the display screen of a computer-aided design (CAD) apparatus when the NP mode is selected for the NAND gate GNA0. In this mode, the symbol 22 for NAND gate GNA0 includes the notations "P=20" and "N=10". The notation "P=20" indicates the drive strength of the p-channel devices and corresponds to the width of the p-channel devices. The notation "N=10" is the drive strength for n-channel devices of the logic gate, as indicated in FIG. 1, and is derived from the channel widths of the n-channel devices. Referring now to FIG. 2A, the detailed schematic for NAND gate GNA0 is the same as that of FIG. 1A, except that the designations for the p-type transistors have been changed to indicate that the drive strength of each p-channel transistor is specified as being "20" in the example.

Figure 3A:
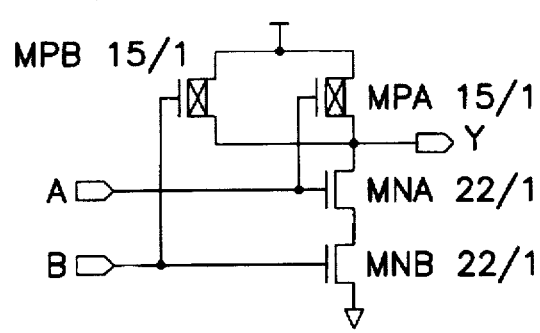
FIG. 3A is a schematic circuit diagram for the logic gate of FIG. 3.

FIG. 3 illustrates the symbol 24 that is displayed on the display screen of a computer-aided design (CAD) apparatus when the Explicit mode is selected for the NAND gate GNA0. In this mode, the symbol 24 for NAND gate GNA0, which is shown in FIG. 3, includes the notations "PB=15/1" and "PA=15/1" which indicate that the p-channel transistors have a width of "15" and a length of "1" in the example. The gate GNA0 also includes the notations "NA=22/1" and "NB="22/1" which mean that the n-channel transistors have a width of "22" and a length of "1" in the example. Referring to FIG. 3A, in this mode, the lengths of the p-channel transistors and the n-channel transistors are specified as being "1".

Property Forms

Figure 4:
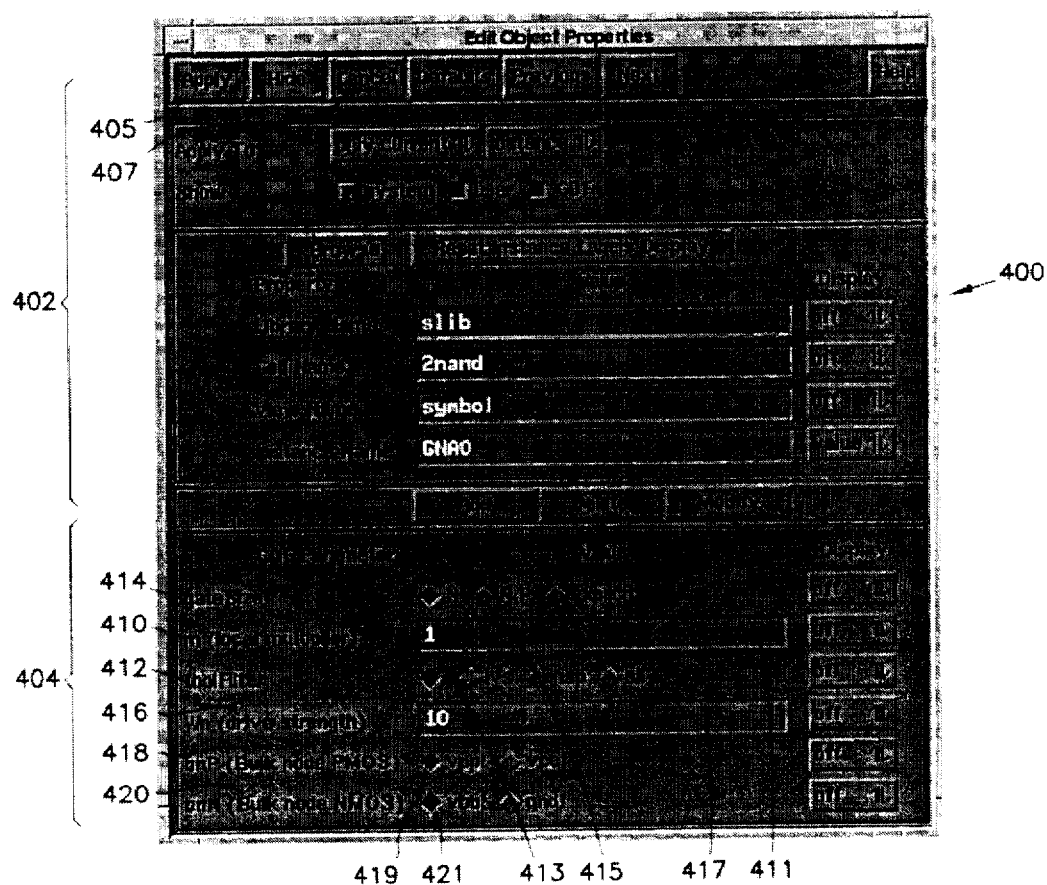
FIG. 4 is a representation of a property form produced by the form interface provided by the invention for N mode.

In adding a gate to a schematic, the parameters of the gate are displayed on an "Edit Object Properties" screen or "property form", such as property form 400 shown in FIG. 4. The upper portion of the property form illustrated in FIG. 4, i.e., the portion of the property form 400 indicated by the bracket 402, corresponds to the property form that is produced by a schematic design programs, or design tool, such as the DF2 schematic design programs commercially available from Cadence Design Systems, Inc., San Jose, Calif. Such a schematic design tool produces the information contained in the upper portion 402 of the property form, specific data, such as the library name, "slib"; the cell name "2nand"; the view name "symbol" and the instance name "GNA0" being produced in response to data supplied by the circuit designer in selecting a gate instance for placing on a schematic.

The invention customizes the property form provided by the schematic design tool by providing the information that appears on the lower portion 404 of the screen 400 which includes labels for user-defined component description format (cdf) parameters, and values for the library cdf parameters. The library cdf parameters include "m", "ToolFilter" and "gateSize". The library cdf parameters are displayed on the form as prompts "m (local multiplier)" 410, "tool Filter" 412, and "gateSize" 414. Also, gate level parameters are displayed as "Wn (drive strength)" 416, "bnP (Bulk node)" 418 and "bnN (Bulk node)" 420. These library cdf parameters, or library level parameters, are created by procedures provided by the invention.

In the exemplary embodiment, the values for these user-defined parameters are specifiable as follows. The local multiplier "m" can be any numerical value. The choices for the tool Filter are " " (i.e., none), "lvs", "hsp", and "all". The choices for gateSize (or operating mode) are "N", "NP", and "explicit". The choices for the PMOS bulk node potential parameter bnP are "vpp!" and "vcc!". The choices for the NMOS bulk node potential parameter bnN are "vbb!" and "gnd!". In N mode, drive strength Wn is specified as the default expression iPar("NDEFW"). Additionally, in NP mode and Explicit mode, drive strength Wp is expressed in terms of the default expressions "iPar(PNR)*iPar(Wn)", iPar("PDEFL") and iPar("NDEFL"). Also, in Explicit mode, device parameters are expressed in terms of the default expressions iPar("Wp"), iPar("Wn"), iPar("Lp") and iPar ("Ln") for each device of the logic gate. The terms PNR, NDEFW, PDEFL, and NDEFL are global variables, the values of which are user-definable as will be described.

The parameter "m" (local multiplier) allows the circuit designer to apply a constant multiplier for simulation by entering a numerical value into databox 411. The parameter "ToolFilter" allows the circuit designer to select a simulator using a "radio" type selector 413 with the choices of tool filters being represented by symbols labeled "lvs", "hsp", "all" and an unlabeled symbol representing that no tool filter has been selected. The parameter "gateSize" allows the circuit designer to select the operating mode using a "radio" type selector 415 with the choices for the modes being represented by symbols labeled "N", "N, P" and "explicit". The value for the parameter drive strength "Wn", for example, is displayed in a data box 417 as the expression "iPar ("NDEFW")" unless a value for drive strength has been specified in which case the numerical value is displayed in data box 417. In the exemplary embodiment, the number "10" is being displayed in data box 417. The parameter "bnP" allows the circuit designer to select a bulk potential for PMOS devices using a "radio" type selector 419 with the choices of the potentials available being represented by symbols labeled "vpp!" and "vcc!". Similarly, the parameter "bnN" allows the circuit designer to select a bulk potential for NMOS devices using a "radio" type selector 421 with the choices of the potentials available being represented by symbols labeled "vbb!" and "gnd!". In the example, a default value of "1" is displayed in data box 411, no tool filter is specified, and N mode is selected as indicated at 415. Also, data box 417 is shown to include the number "10" for drive strength Wn for instance GNA0 of the NAND gate. Parameters "bnP" and "bnN" are specified as vpp! and vbb!, respectively, as indicated at 419 and 421.

Figure 5:
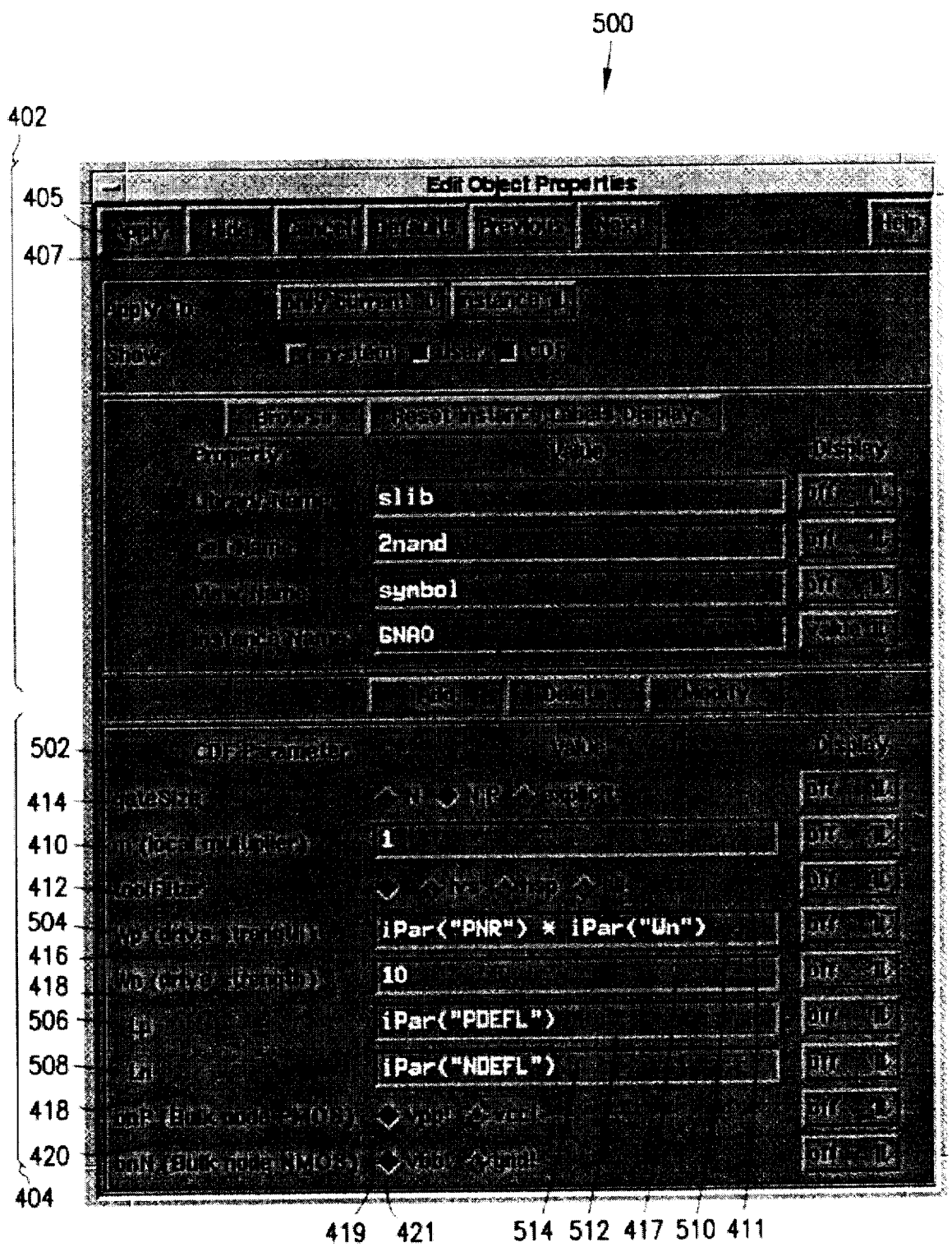
FIG. 5 is a representation of a property form produced by the form interface provided by the invention for NP mode with default values expressed in terms of default expressions.

To change from N mode to NP mode, the circuit designer selects the "N, P" for "gateSize" 414 on the property form. For NP mode, the property form can appear as the property form 500 illustrated in FIG. 5, in which default expressions are displayed, or as the property form 600 in FIG. 6, in which default expressions have been changed to numerical values. Referring to FIG. 5, as can be seen, the "gateSize" 414 has been changed to indicate, at 502, the selection of NP mode. Also, three labels 504, 506 and 508 have been added, along with respective data boxes 510, 512 and 514, with the boxes being provided to the right of the labels. One of the labels 504 is "Wp (drive strength)" and the corresponding data box 510 contains the default expression "iPar("PNR") *iPar("Wn")" for drive strength Wp. Another one of the labels 506 is "Lp" and corresponding data box 512 contains the default expression "iPar("PDEFL")". The third label 508 is "Ln" and the corresponding data box 514 contains the default expression "iPar("NDEFL")".

Figure 6:
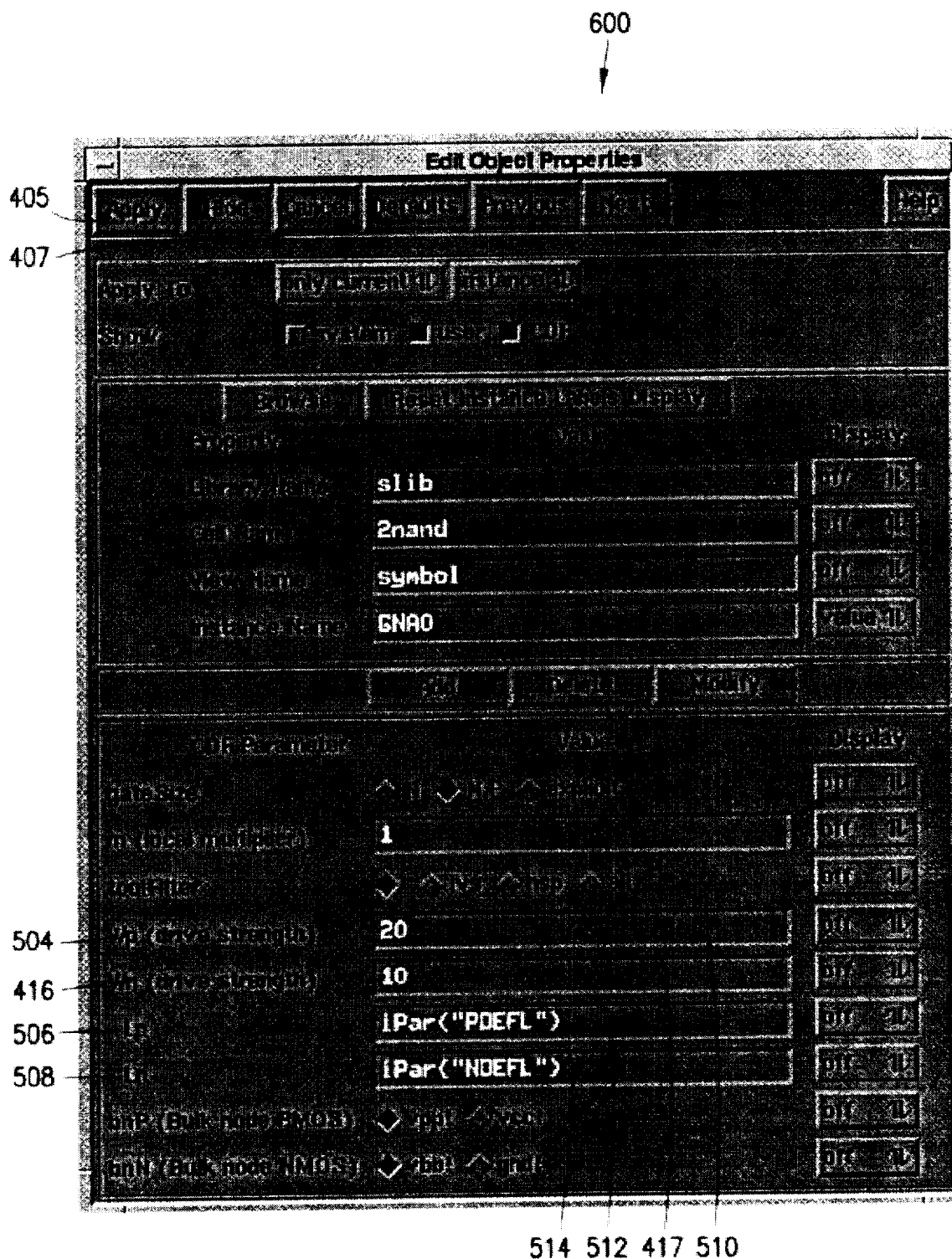
FIG. 6 is a representation of the property form of FIG. 5 and with some of the parameters specified by numerical values.

FIG. 6 illustrates how the appearance of the property form 600 for NP mode is changed when parameter data is entered into the data boxes 510, 512 and 514. In the example, a value of "20" is entered into box 510 for the drive strength parameter Wp. The parameter data contained on the property form 600 corresponds to the information that is provided on the symbol 22 in FIG. 2, wherein P=20 which represents the drive strength Wp for the p-channel transistors and N=10, which represents the drive strength Wn for the n-channel transistors.

Figure 7:
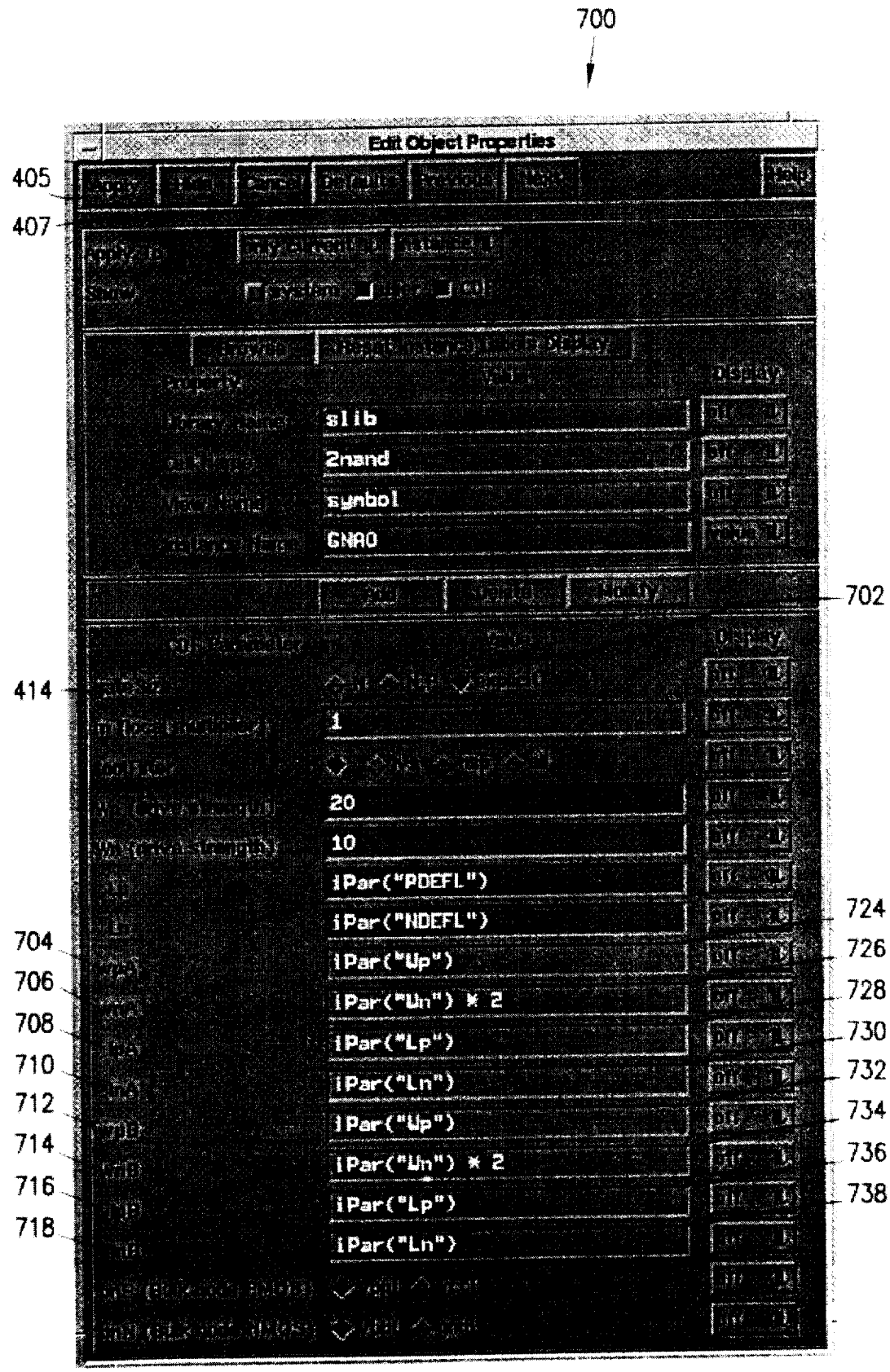
FIG. 7 is a representation of a property form produced by the form interface provided by the invention for Explicit mode.

To change from NP mode to Explicit mode, the circuit designer selects the position "explicit" in the gateSize selection function 414 on the property form 600. In explicit mode, the property form can appear as shown for the property form 700 illustrated in FIG. 7. Referring to FIG. 7, as can be seen, the "gateSize" indicator 414 indicates, at 702, the selection of Explicit mode. Also, eight labels 704, 706, 708, 710, 712, 714, 716 and 718 have been added, along with respective data boxes 724, 726, 728, 730, 732, 734, 736 and 738, with the boxes being provided to the right of the labels for entering values for device parameters, including channel widths wpA, wnA, wpB and wnB, and channel lengths lpA, lnA, lpB and lnB for transistors MPA, MNA, MPB and MNB. Label 704 is "wpA" and the corresponding data box 724 contains the default expression "iPar("Wp")" which means that the channel width wpA of MPA is specified in terms of the drive strength Wp. Label 706 is "wnA" and corresponding data box 726 contains the default expression "iPar("Wn")*2". Label 708 is "lpA" and the corresponding data box 728 contains the default expression "iPar("Lp")". Label 710 is "lnA" and corresponding data box 730 contains the default expression "iPar("Ln")". Label 712 is "wpB" and the corresponding data box 732 contains the default expression "iPar("Wp")". Label 714 is "wnB" and corresponding data box 734 contains the default expression "iPar("Wn")*2". Label 716 is "lpB" and the corresponding data box 736 contains the default expression "iPar("Lp")". Label 718 is "lnB" and corresponding data box 738 contains the default expression "iPar("Ln")".

Figure 8:
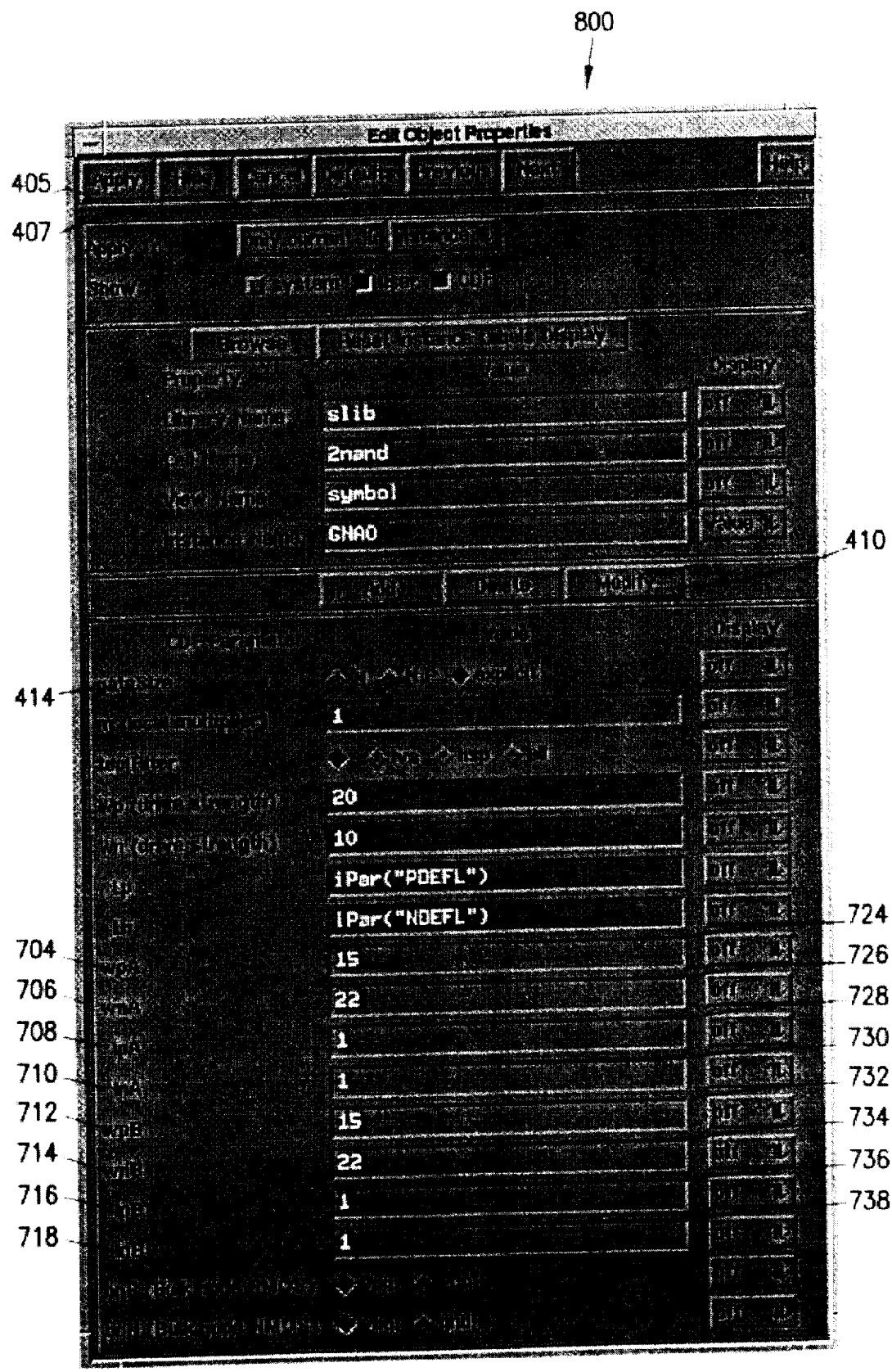
FIG. 8 is a representation of the property form of FIG. 7 and with some of the parameters specified by numerical values.

Referring now to FIG. 8, there is illustrated a property form 800 for Explicit mode when numerical values are entered in the data boxes 724, 726, 728, 730, 732, 734, 736 and 738. In the example, the number "15" has been entered into data box 724. The number "22" has been entered into data box 726. The number "1" is displayed in data boxes 728 and 730. The number "15" has been entered into data box 732. The number "22" has been entered into data box 734. The number "1" has been entered into data boxes 736 and 738. The parameter data contained on the property form 800 corresponds to the information that is provided for the gate GNA0 shown in FIG. 3.

The foregoing examples illustrate changes that are made in the property form for the different design modes which are selectable by the circuit designer. It is pointed out that the circuit designer can change to any mode at any time. For example, the circuit designer can change from Explicit mode either to NP mode or to N mode. Also, when in NP mode, the circuit designer can change back to N mode. In each case, the appropriate property form will be provided automatically. However, when values have been entered into the property form, such values will be shown rather than the default expressions.

For N mode, the drive strength Wn for the logic gate is related to the size of the n-channel devices and is given by the expression Wn="iPar("NDEFW")". The value of NDEFW is selected by the circuit designer. In the example, a non-default value of "10" has been selected for the parameter NDEFW. Thus, the drive strength Wn is equal to "10". In NP mode, the drive strength for the logic gate is expressed in terms of drive strength Wn and Wp for both n-channel devices and p-channel devices. The drive strength expressed in terms for the p-channel devices is given by the default expression Wp="iPar("PNR")*iPar("Wn")". In the example, "PNR" is equal to "1.5". Thus, in the example, the default value for Wp is equal to "15", but a value of "20" has been entered as shown in FIG. 6. Also, default values for Lp and Ln are selected to be "1.5" in the example, and so the default expression is displayed for parameters Lp and Ln as shown in FIG. 6. Note that in this description, the drive strengths are represented by upper case letters, such as Wn, Wp, Ln and Lp, whereas device sizes are represented are expressed in lower case letters for the prefixes of device parameters such as prefixes "wn" or "wp" of device parameters wnA, wnB, wpA, wpB, etc.

Computer System

Figure 9:
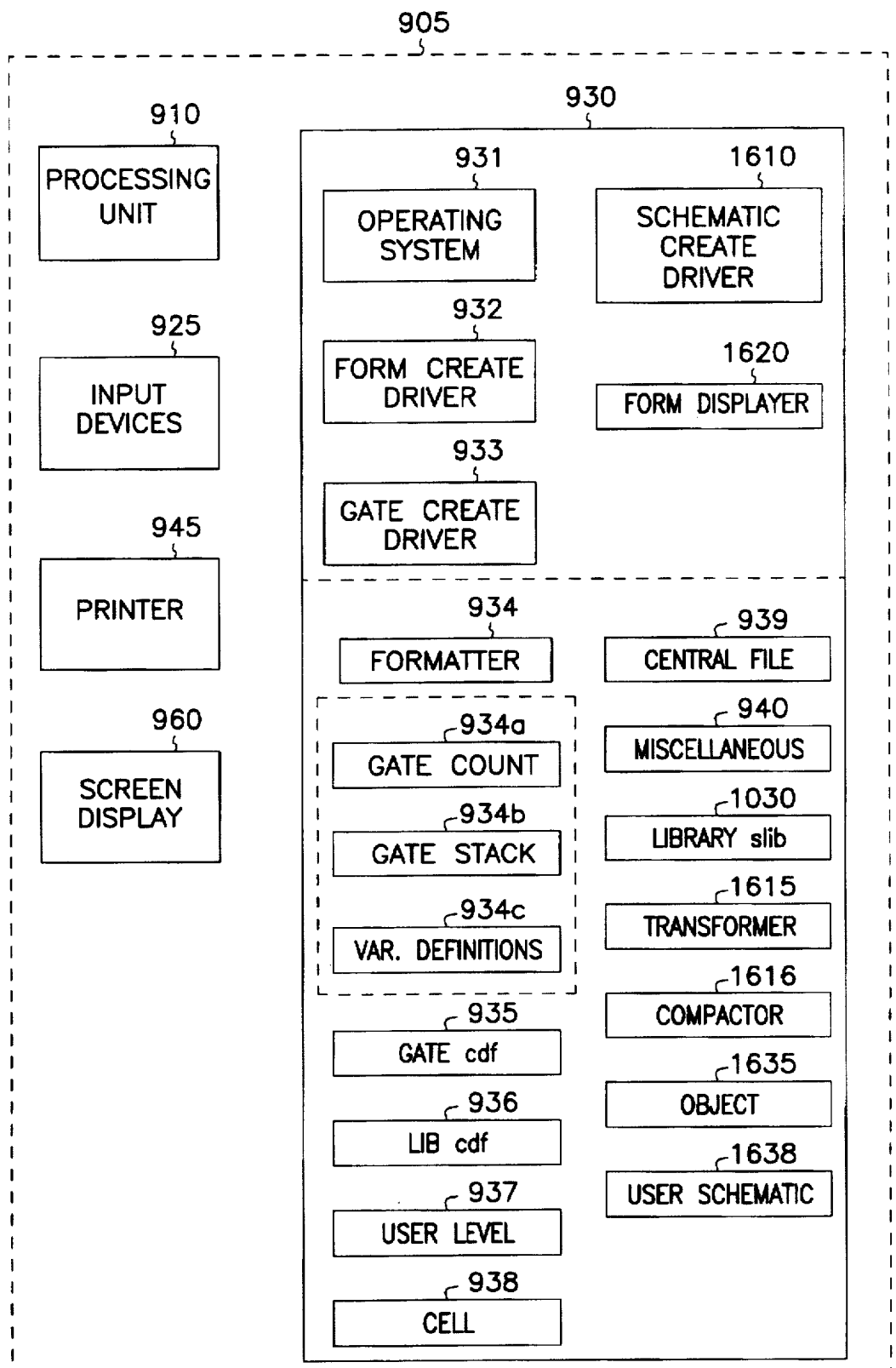
FIG. 9 is a block diagram of a computer system for creating a form database for use in creating circuit schematics in accordance with the invention.

FIG. 9 is a block diagram of a computer system 905 in which the present invention is capable of being executed. A processing unit 910 is connected to input devices 925 which can include a computer keyboard, a mouse and/or a digital drawing pad. The processing unit 910 is connected also to storage devices 930, a printer 945 and a display unit with a screen 960. Computer system 905 can be an engineering workstation such as that available from Sun Microsystems in Palo Alto, Calif. Typically, such workstation is connected to a local area network which provides access to the storage devices 930 and has Ethernet connections to the printer 945.

The storage devices 930 include programs and files of the computer system 905 which are used in the creation of a schematic database using the procedures provided by the invention. The programs and files of the computer system 905 include an operating system 931, a gate create engine including a form create driver 932 and a gate create driver 933, and a schematic create engine including a schematic create driver 1610, and a form displayer 1620.

The storage devices 930 also include programs and files provided by the invention including form create and gate create formatters 934, a gate cdf database 935, a library cdf database 936, user level data storage 937, cell database 938, a form transformer 1615, a database compactor 1616, an object database 1635 and a user schematic database 1638. Associated with the formatters 934 are a Gate Count data structure 934a, a Gate Stack data structure 934b, and a data structure 934c. Additional data storage include a central text file 939 ".simrc", miscellaneous data storage 940, a standard cell library slib 1030 and a user design library 1630. It is pointed out that although in the exemplary embodiment, the gate cdf database 935, the library cdf database 936 and the cell database 938 are illustrated as being a separate database, these databases are sub-databases of the library slib 1030.

Form Create Engine

Figure 10:
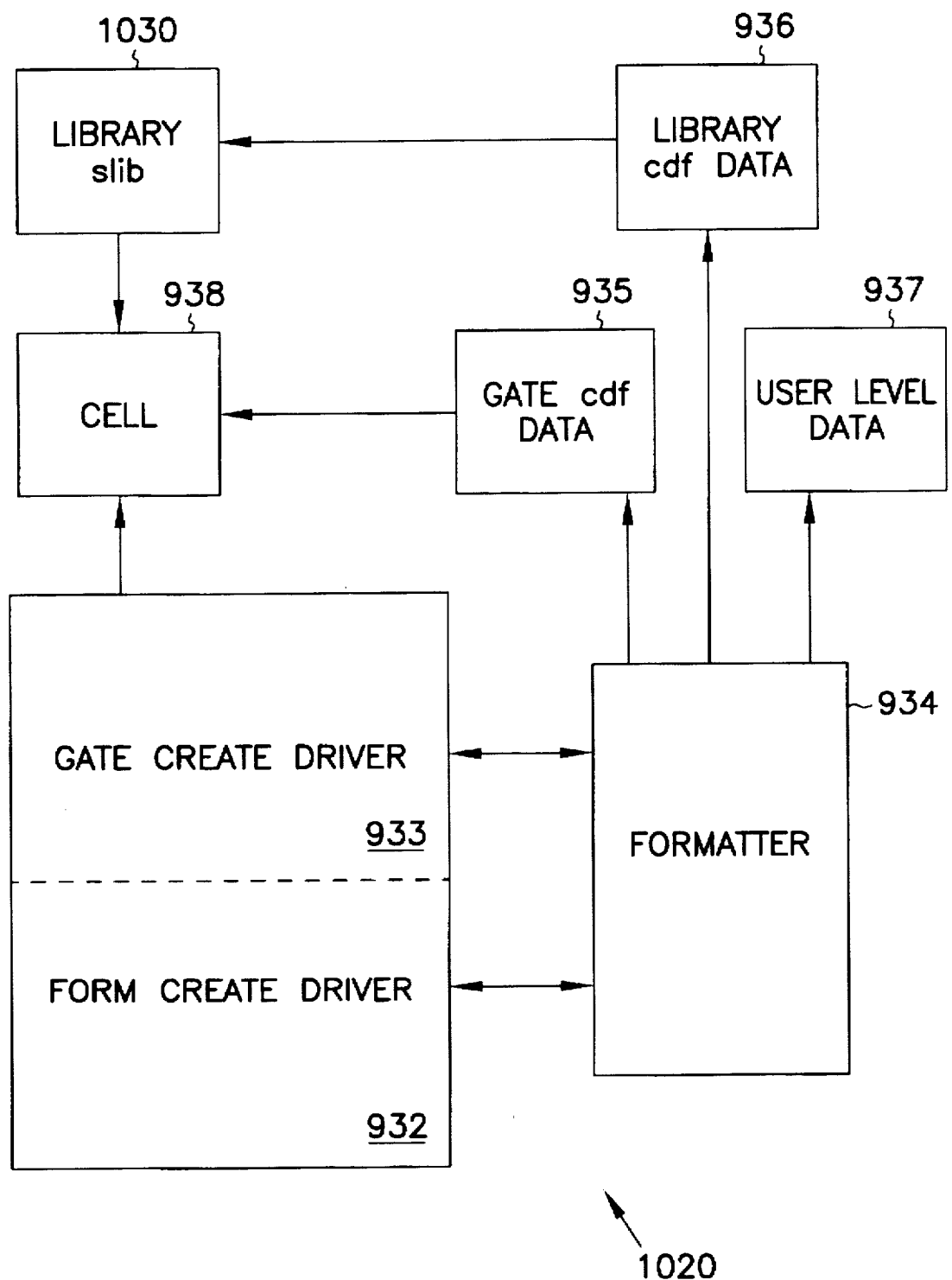
FIG. 10 is a block diagram of a form create engine including known form create and gate create drivers, and gate create and form create formatters provided by the invention.

FIG. 10 is a block diagram of the form create engine 1020 for creating a database for use in producing schematics in accordance with the invention. The form create engine 1020 includes conventional form create driver 932 and conventional gate create driver 933 which are provided, for example, as the skeleton programs of the DF2 schematic design programs commercially available from Cadence Design Systems, Inc., San Jose, Calif. The Cadence DF2 schematic design programs are adapted to receive user-supplied design functions.

The form create engine 1020 has associated therewith the standard library slib 1030 and a cell database 938, which is a sub-database of the library slib 1030. The library slib 1030 is the standard cell library for the instances or objects that can be placed on schematic by a circuit designer, such as, but not limited to, circuits or logic gates such as the logic gates listed in FIGS. 12 and 13, for example. Each cell database 938 contains a symbol database (for example, symbol 20 in FIG. 1), a schematic database (for example, the schematic shown in FIG. 1A) and a cdf parameter database 935.

The gate create and form create formatters 934 of the form create engine 1020, which are provided by the invention, provide user-supplied design functions to the gate create driver 933 and the form create driver 932 for creating the gate cdf database 935 and the library cdf database 936, and for using the cdf databases 935 and 936 for producing property forms for use in creating circuit schematics. The gate cdf database 935 is a sub-database of the cell database 938. The library cdf database 936 is a sub-database of the library slib 1030. The user level parameter data storage 937 stores user level data that is generated in response to opening the standard library 1030 as will be described.

The user-supplied functions provided by the formatters 934 of the invention include the procedures "MS_cdfGateCreateBaseParam( )", "MS_cdfGateCreate"; "MS_cdfGateExplicit"; "MScdfLibCreateBaseParam( )" and "MScdfLibCreateParam( )". These functions are used in creating the parameter database that comprises the gate cdf database 935 and the library cdf database 936 that are used in producing property forms for the three operating modes, N mode, NP mode, and Explicit mode. The formatters 934 include a further user-supplied function "MScdfLibCreateUserParam( )" that is used in customizing the property forms.

TABLE I

VARIABLE DEFINITIONS

LIBRARY = slib
_MS_CDF_DEV = 'nil
_MS_CDF_POWER_LIST = list ("vpp!""vcc!")
_MS_CDF_GROUND_LIST = list ("vbb!""gnd!")
_MS_CDF_LIB_PARAM_SET = '(gateSize m toolFilter bnPLib bnNLib paramX paramY)
_MS_CDF_GLOBAL_VAR = '(PNR NDEFW PDEFL NDEFL)
_MS_CDF_LIB_PARAM_ALL = append(_MS_CDF_GLOBAL_VAR_MS_CDF_LIB_PARAM_SET)

TABLE I illustrates variable definitions that are contained in the data structure 934c. The variable definitions are used in the procedures "MS_cdfGateCreate", "MS_cdfGateExplicit", MScdfLibCreateBaseParam( )", "MScdfLibCreateParam( )", "MScdfLibCreateUserParam( )" and other procedures, in producing the display forms. The data structure Gate Count 934a, the data structure Gate Stack 934b, and the data structure 934c preferably are program functions which comprise portions of the software programs of the formatters 934, and/or portions of the form transformer 1615 which will be described.

The variable definitions contained in the data structure 934c include the variable _MS_CDF_DEV, which is a display control parameter which, when set equal to "nil", prevents parameters from being displayed. The library database also includes lists of choices for the parameters bnP and bnN. In the exemplary embodiment, the choices for parameter bnP are "vpp!" and "vcc!" and are listed in a POWER list in that order, and the choices for parameter bnN are "vbb!" and "gnd!" and are listed in a GROUND list in that order. However, additional choices can be defined for the parameters bnP and bnN.

The data structure 934c also defines a list _MS_CDF_LIB_PARAM_SET, which is a set of library cdf parameters, including the parameters "gateSize", "m", "toolFilter", "bnPLib", "bnNlib", "paramX" and "paramY". The data structure 934c defines a list _MS_CDF_GLOBAL_VAR, which is a set of global variables, including "PNR", "NEDFW", "PDEFL", and "NDEFL". These two lists of variables are combined by a procedure "append" to form a variable "_MS_CDF_LIB_PARAM_ALL". The information contained in the data structure 934c is accessed by the formatters 934 in creating the parameter database and by the form transformer 1615 and other procedures in producing the display forms.

The form create driver 932, the gate create driver 933 and the formatters 934 can be software programs residing in computer system 905, or any other suitable media or computer program product that is capable of providing a computer readable program code. In one embodiment, the form create driver 932, the gate create driver 933 and the user-supplied functions which comprise the formatters 934 are written in SKILL code, a computer language provided by Cadence Design Systems, Inc., San Jose, Calif. In other embodiments, other computer languages, such as C++, Pascal, and SmallTalk computer languages can be used as well.

Database Creation

The user-supplied functions "MScdfGateCreateBaseParam( )"; "MS_cdfGateCreate"; "MS_cdfGateExplicit"; "MScdfLibCreateBaseParam( )" and "MScdfLibCreateParam( )" provided by the invention are used in creating the databases that are used in producing property forms for the three operating modes, N mode, NP mode, and Explicit mode. The gate cdf parameter database 935 contains information needed to produce a portion of the property forms for the three operating modes, for each of the cells or logic gates, for example, contained within the library slib 1030. The procedure "MScdfGateCreateBaseParam( )" steps through all the logic gates in the library slib 1030 using the procedures "MS_cdfGateCreate" and "MS_cdfGateExplicit" to create gate cdf parameters for all of the property forms for each logic gate in the library slib 1030, and for each of the three operating modes.

The library cdf parameter database 936 includes those parameters which are generic to all of the logic gates in the library slib 1030. The data contained in the library cdf parameter database 936 provides, for example, labels, data boxes and "radio" type selectors for displaying the cdf parameter information, and the default expressions for the global variables, on the property forms for the three operating modes as will be described after the description of the gate creation procedure.

Figure 11:
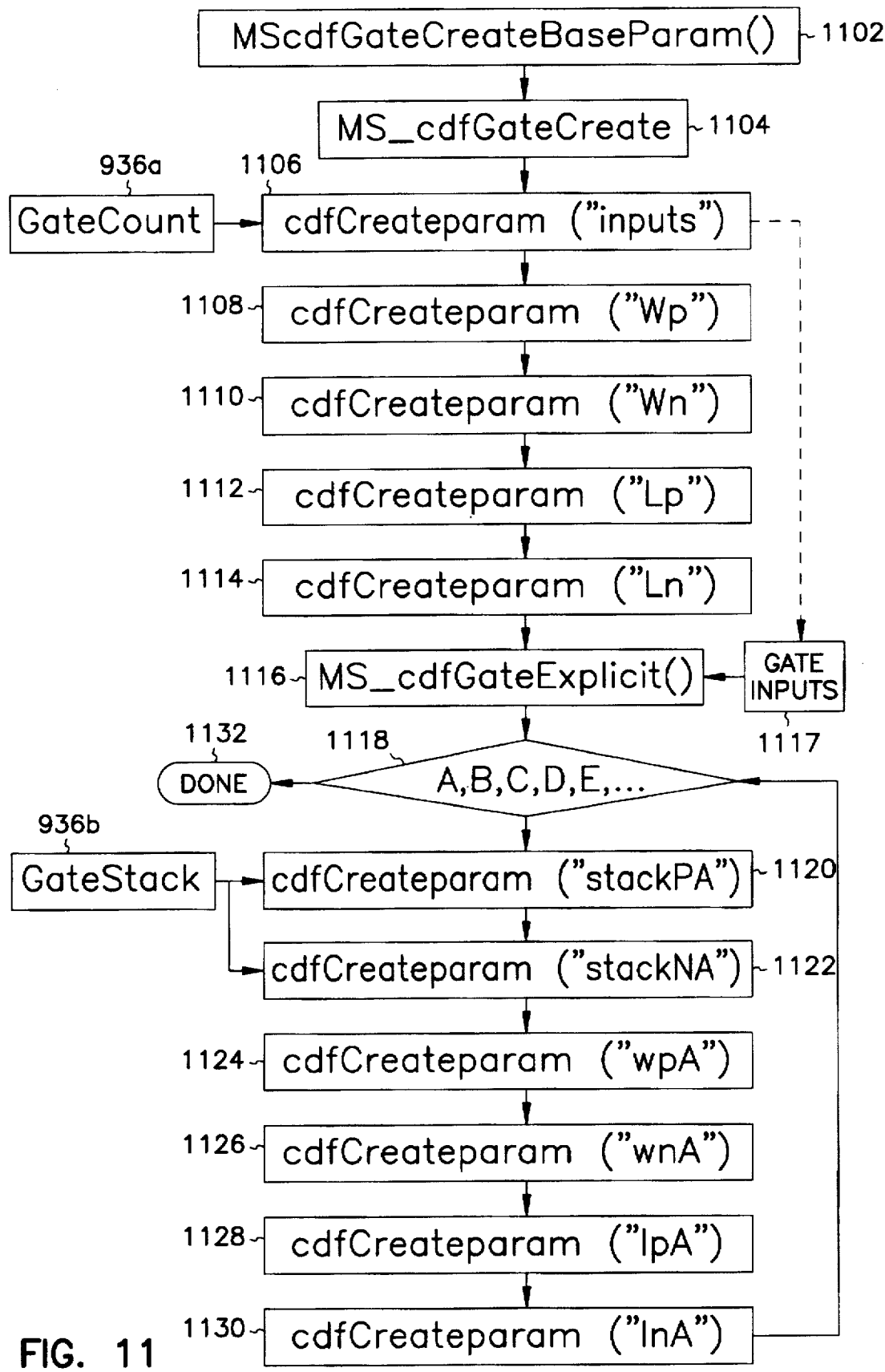
FIG. 11 is a process flow chart illustrating the operation of the form create engine in creating a form database for use producing property forms.

The following description of the gate creation procedure makes reference to FIGS. 9–11. FIG. 11 is a process flow chart illustrating the steps taken by the form create engine 1020 in creating the gate cdf database 935 that is used in creating design schematics, using the DF2 schematic design tool available from Cadence Design Systems, Inc.

Referring to FIGS. 9–11, the procedure "MScdfGateCreateBaseParam( )" of formatters 934 is entered at step 1102 and at step 1104 calls the procedure "MS_cdfGateCreate( )" control to the gate create driver 933 which executes a function "cdfCreateparam("inputs")" which accesses the look-up structure GateCount 934a to determine the number of inputs for the logic gate for which the property form database is being created. Referring to FIG. 12, in the look-up structure 934a, the inputs for each cell are listed and are indexed with the cell name. In the present example, NAND gate GNA0 is represented in the look-up structure as "2nand", which is indicated by reference numeral 1202, and has two inputs, as indicated by the number "2" in line 1202. The number of inputs for the current instance is used in creating the labels associated with the gate parameters.

Referring again to FIGS. 9–11, the procedure continues to step 1108 and creates the gate parameter Wp. In creating a parameter, such as parameter Wp, the information that is generated includes the prompt "Wp (drive strength)", and the data format or type. Also created is the default value "defValu" for the parameter, which is represented by the default expression "iPar("PNR")*iPar("Wn")" for parameter "Wp" in the example. This information is set forth in lines 3019–3021 of the source code, an exemplary code segment of which is provided in FIGS. 30A, 30B and 30C. The information or create parameter data for each of the cdf gate parameters that is created is set forth in the source code. The parameter data is stored in the gate cdf database 935. As there shown in lines 3022–3026, for example, other information that is produced in creating the parameter Wp includes "?display" which indicates the form in which the parameter value is displayed in certain operating modes. Additional information that is created for parameter Wp includes "?parseAsCEL", which enables Cadence Expression Language (CEL) capability to evaluate an expression; "?parseAsNumber" which enables a non-numerical parameter type to be treated as a number; and "?editable" which indicates that the user can edit the parameter on the display form. Similar information is produced for the other gate cdf parameters. Other information provided for some of the parameters includes, a display control parameter, MS_CDF_PARAM. When the display control parameter is true, the associated parameter will be displayed. When the display control parameter is not true, the associated parameter will not be displayed.

Then, the procedure continues to step 1110 and creates the gate parameter "Wn (drive strength)", providing similar information including the prompt "Wn (drive strength)" and the default expression, which is "iPar ("NDEFW")" for the parameter "Wn" in the exemplary embodiment. This data is stored in the gate cdf database 935.

The procedure continues to step 1112 and creates similar information for the gate parameters "Lp", including the prompt "Lp" and the default expression "iPar("PDEFL")". This data is stored in the gate cdf database 935. At step 1114, the procedure creates the parameter "Ln", including the prompt and the default expression "iPar("NDEFL")" for the parameter "Ln". This data is stored in the gate cdf database 935.

The procedure continues to step 1116 which calls the procedure "cdfGateExplicit( )" of the formatters 934. This procedure creates additional parameters for the property form for Explicit mode. This procedure returns a string that indicates by how much Wp and Wn have to be multiplied in order to retain equivalent drive strength of an inverter with the size Wn or Wp. Also, the procedure determines the number of devices that comprise the current gate instance by accessing the Gate Count look-up structure 934a, as represented by the block 1117 labeled "gate inputs", which information is provided by step 1106.

Digressing, with reference to FIG. 1A, the two p-channel transistors MPA and MPB, of instance "M", are connected in parallel between the voltage source vcc and node Y, whereas the two n-channel transistors MNA and MNB of instance "M", are connected in series between node Y and ground. Although the n-channel transistors have a channel width of "20", the effective channel width is "10". As shown in FIG. 1, the gate strength, which is represented by the width of the n-channel transistors is indicated as being "10". Consequently, when the n-channel transistors MNA and MNB are specified on an explicit level, the parameter drive strength "Wn", which is "10" in the example, has to be multiplied by "2". See, for example, the data in box 726 in FIG. 7. This information is contained in the look-up structure GateStack 934b (FIG. 13) which is accessed by the procedure "MScdfGateExplicit" in creating the suffix, A, B, C, etc. for the parameter labels for the device parameters wp, wn, lp and ln. In the present example, the procedure returns the parameter labels wpA, wnA, lpA and lnA, along with wpB, wnB, lpB and lnB. The Gate Count look-up structure 934a indicates the number devices that are included in the current gate instance.

Referring to FIGS. 11 and 13, steps 1118–1130 create suffixes for all instances of the current logic gate, with steps 1120–1130 being performed by the gate create driver 933. Step 1120 accesses the look-up structure Gate Stack 934b, shown in FIG. 13, to return a string that indicates by how much Wp has to be multiplied in order to retain equivalent drive strength of an inverter with the size wp. In the present example, the information for a 2-input NAND gate is contained in line 1302. The information that is provided by the look-up structure 934b is represented as: NA=2 PA=1, NB=2 and PB=1. This indicates that the drive strength Wp is multiplied by one to obtain the widths wpA and wpB of the two p-channel transistors PA and PB. In the present example, this results in no change in the way the parameters wpA and wpB are shown in data boxes 724 and 732 of FIG. 7 when Explicit mode is called. The multiplier data obtained by step 1120 is stored in the gate cdf database 935.

Similarly, step 1122 returns a string that indicates by how much Wn has to be multiplied in order to retain equivalent drive strength of an inverter with the size wn. The procedure again accesses the look-up structure GateStack 934b which is shown in FIG. 13, and determines that for the channel width parameters wnA and wnB of the two n-channel transistors NA and NB, drive strength Wn has to be multiplied by two. In the example, this fact is indicated in the data boxes 726 and 734 of FIG. 7 when Explicit mode is called. The multiplier data obtained by step 1122 is stored in the gate cdf database 935.

As the procedure continues, steps 1124–1130 perform a string concatenate function to add a letter suffix to each of the parameter labels. The first letter suffix "A", the second letter suffix is "B", etc. Step 1124, creates parameter wpA, at step 1126, creates parameter wnA, at step 1128, creates parameter lpA and, at step 1130, creates parameter lnA. The procedure then loops back to step 1118 which determines that a set of parameters with the suffix "B" has to be created for the present example. Accordingly, the same sequence is followed in creating parameters wpB, wnB, lpB and lnB. Because in the present example, all gate level parameters needed have been created, the procedure is done. The gate parameter data created by the procedure is stored in the gate cdf database 935.

The following description of the library parameter database creation procedures, including the procedures "MScdfLibCreateBaseParam( )" and "MScdfLibCreateParam( )", makes reference to FIGS. 9–10, 14 and 15. These procedures create a "base" level cdf database which is called the library cdf parameter database 936 and which is similar to the gate cdf parameter database 935 created by procedure MS_cdfGateCreate( ). Preferably, the library cdf parameter database 936 is created prior to creating the gate cdf parameter database 935. The library cdf parameter database 936 includes those parameters which are generic to all of the logic gates in the library slib 1030. In the exemplary embodiment, these parameters include "m" (local multiplier), "toolFilter", "gateSize", "bnPLib" (bulk potential for PMOS devices), "bnNLib " (bulk potential for NMOS devices), "paramX" and "paramY" whuch comprise a set of parameters called "_MS_CDF_LIB_PARAMS_SET". The library cdf parameter database also includes the four global variables PNR, NDEFW, PDEFL, and NDEFL. The global variables PNR, NDEFW, PDEFL, and NDEFL comprise a set of variables called "_MS_CDF_GLOBAL_VAR". The set "_MS_CDF_LIB_PARAM_SET" and the set "_MS_CDF_GLOBAL_VAR" comprise a group of parameters "_MS_CDF_LIB_PARAM_ALL".

The procedure "MScdfLibCreateBaseParam( )" creates the labels, data boxes and "radio" type selectors that are needed to display the library cdf parameters and the default expressions for the global variables. A process flow chart for the procedure "MScdfLibCreateBaseParam( )" is given in FIG. 14. A process flow chart for the procedure "MScdfLibCreateParam( )", which is called by the procedure "MScdfLibCreateBaseParam( )", is given in FIG. 15.

Figure 14:
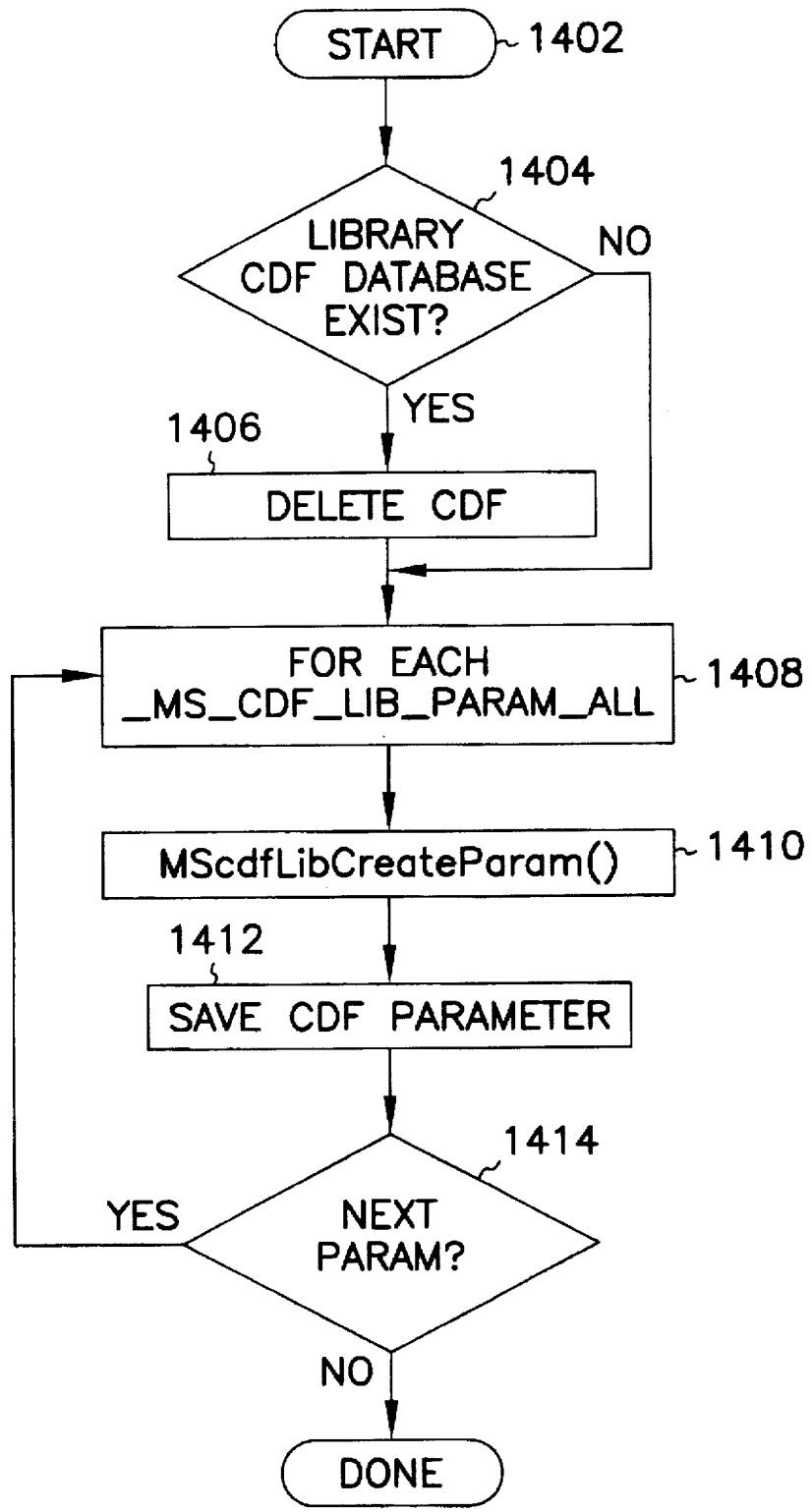
FIG. 14 is a process flow chart illustrating how the form create formatter creates a library cdf parameter database for use in producing property forms.

Referring to FIGS. 9-10 and 14, procedure "MScdfLibCreateBaseParam( )" is entered at step 1402. During updating of the library cdf database 936 to add logic gates or parameters, steps 1404-1406 are used to delete any previously created cdf parameter data from the library cdf database 936. The procedure deletes the library cdf database 936 if one exists. Any library cdf parameters that were previously created are deleted because steps 1408-1414 of the procedure re-create all of the library cdf parameters "m", "toolFilter", "gateSize","bnPLib", "bnNLib", "paramX" and "paramY" and the global variables PNR, NDEFW, PDEFL, and NDEFL. In creating each of the parameters, step 1410 calls the procedure "MScdfLibCreateParam( )" for creating each parameter and each global variable in sequence. Step 1412 saves the cdf parameter data in the library cdf database 936.

Figure 15:
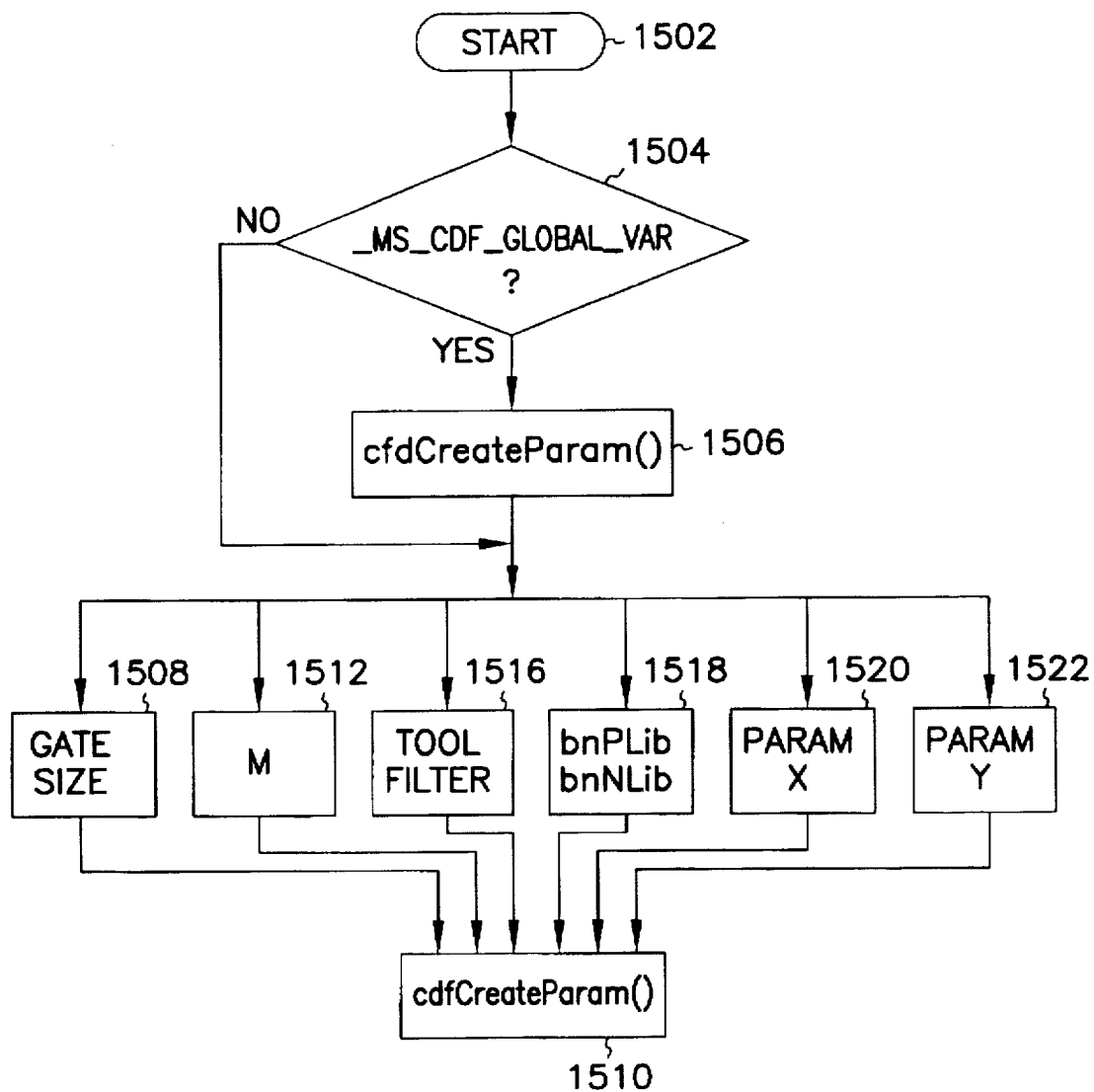
FIG. 15 is a process flow chart illustrating how the form create formatter creates parameters for the library cdf parameter database that is produced by the process of FIG. 14.

Referring to FIG. 15, the procedure "MScdfLibCreateParam( )" starts at step 1502. Step 1504 determines if the parameter being processed is a member of the group of variables "_MS_CDF_GLOBAL_VAR" and if so, step 1506 calls procedure "cdfCreateParam( )" which creates the parameter. In creating each of the global variables, the procedure creates a prompt, the default value for the parameter, the form in which the parameter is presented, and other information required to display the parameter. The information that is produced in creating the global variables and the library cdf parameters is similar to that created for the gate cdf parameters as is described above with reference to FIGS. 11 and 30A-30C. For the global variables and the library cdf parameters, this information is contained in the exemplary source code that is shown in FIGS. 33, 33A and 33B. By way of example, the global variables have a default value of "1" as is indicated at line 3310 (FIG. 33), unless some other value has been specified by the circuit designer. Other values can be applied to any of the global variables to customize a property form as will be shown. Therefore, there is no need to save global variables. Thus, the statement "dontSave", shown on line 3315 (FIG. 33) of the exemplary source code, is set to true ("t") which indicates that the parameter data for global variables are not saved. Note also, that for the library cdf parameters, such as "gateSize", include a radio type selection, as has been entered on line 3325 (FIG. 33). This permits selection of one of several choices, which for gateSize are the operating modes "N", "N,P" and "Explicit" as is indicated in line 3326, for example.

Steps 1508-1510 create the library cdf parameter "gateSize" for each logic gate. The default value is N mode in the exemplary embodiment. Steps 1512 and 1510 create the library cdf parameter "m" for each logic gate. The default value for parameter "m" is "1" in the exemplary embodiment. Steps 1516 and 1510 create the library cdf parameter "ToolFilter" for each logic gate. The default value for parameter "ToolFilter" is " " which, in the exemplary embodiment, represents that no tool filter has been selected. Steps 1518 and 1510 create the library cdf parameters "bnPLib" and "bnNLib" for each logic gate. Steps 1520 and 1510 create the library cdf parameter "paranX" and Steps 1522 and 1510 create the library cdf parameter "paramY". The choices for values for these parameters are contained in a list _MS_CDF_POWER_LIST which includes "vpp!" and "vcc!" in the exemplary embodiment, and a list _MS_CDF_GROUND_LIST which includes "vbb!" and "gnd!" in the exemplary embodiment. The default values vpp! and vbb! for parameters "bnPLib" and "bnNLib", respectively, are obtained from the lists _MS_CDF_POWER_LIST and _MS_CDF_GROUND_LIST. The parameter data created by these procedures is stored in the library cdf database 936.

After the foregoing procedures have been carried out, the parameter databases provided by the gate cdf parameter database 935 and the library cdf database 936 provide sufficient data for generating proper property forms for all of the logic gates in the library slib 1030 and for all three operating modes.

Schematic Create Engine

Figure 16:
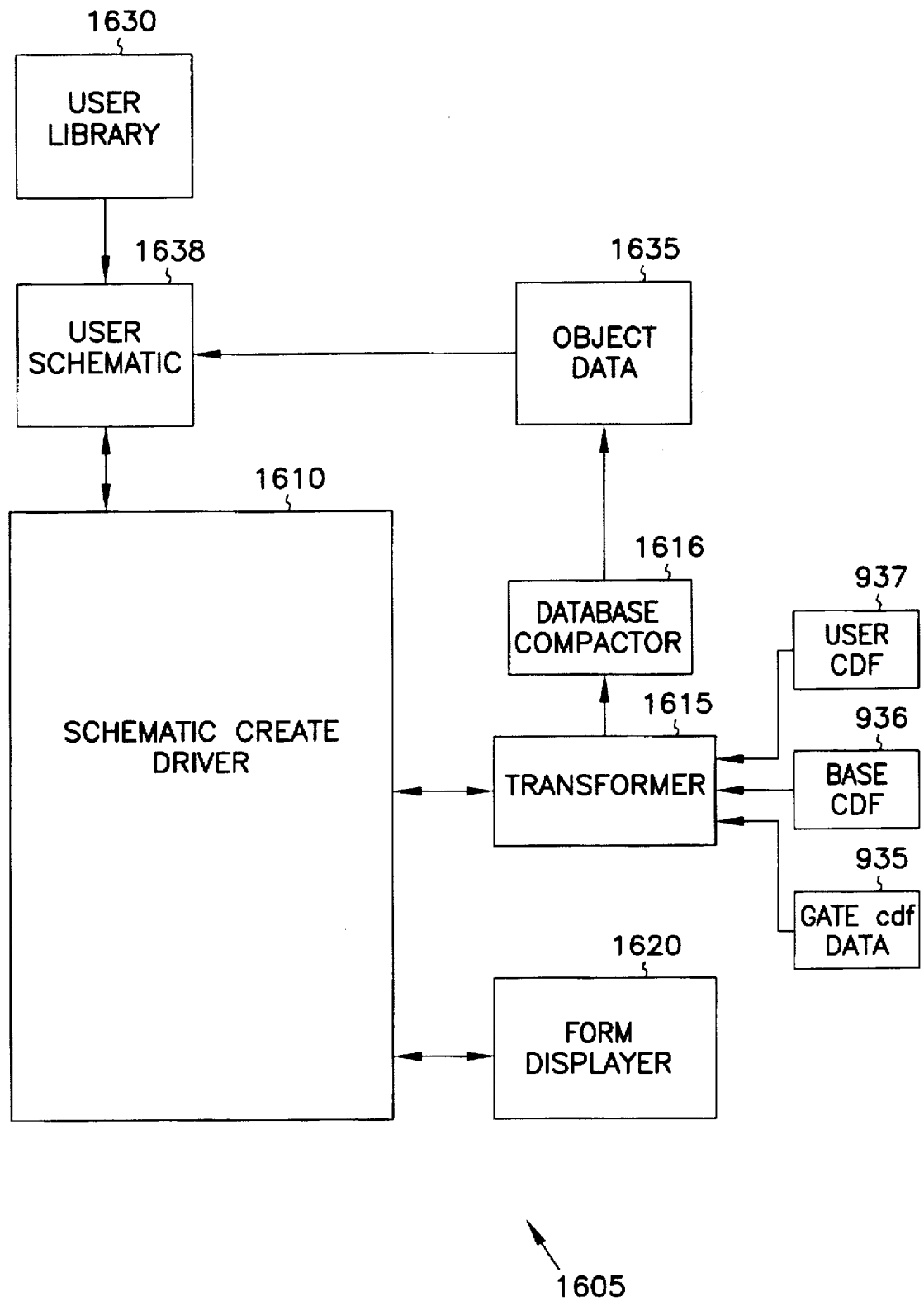
FIG. 16 is a block diagram of a schematic create engine including a known circuit schematic create driver, a known form displayer, and a property form transformer and a database compactor provided by the invention.

FIG. 16 is a block diagram of a schematic create engine 1605 for use in creating circuit schematics and which produces dynamic property forms in accordance with the invention using the gate cdf database 935, the library cdf database 936, and data stored in the user level parameter data storage 937. The schematic create engine 1605 includes a conventional circuit schematic create driver 1610 and a form displayer 1620. The schematic create engine also includes a form transformer 1615 and a database compactor 1616 which are provided by the invention. By way of example, the schematic create driver 1610 can be the DF2 schematic creation programs commercially available from Cadence Design Systems, Inc., San Jose, Calif. The form displayer 1620 supplies to the schematic create driver 1610 user-supplied functions which include the function schHiObjProperty( ), which produces the display forms. One suitable form displayer is commercially available from Cadence Design Systems, Inc. The form transformer 1615 supplies to the schematic create driver 1610 user-supplied functions which include functions "MScdfGateIP( )" and "MScdfGateModeCB( )". The form transformer 1615 accesses the gate cdf database 935, the library cdf database 936 and the data in the user level data storage 937 to obtain parameter data for use in producing property forms and changing the forms. The database compactor 1616 supplies to the schematic create driver 1610 a user-supplied function "MScdfGateDP( )" which compacts the data produced by user entry and the form transformer 1615.

The form create engine 1605 has associated therewith the user design library 1630 and a user schematic database 1638, which is a sub-database of the user library 1630. The user library 1630 contains design data for schematics designed by a circuit designer. The user schematic database 1638 contains for a plurality of instances or objects for schematics. An object database 1635, which is a sub-database of the user schematic 1638, stores parameter data for the current instance.

The schematic create driver 1610, the form transformer 1615, the database compactor 1616 and the form displayer 1620 can be software programs residing in computer system 905 (FIG. 9), or any other suitable media or computer program product that is capable of providing a computer readable program code. In one embodiment, schematic create driver 1610 and the user-supplied functions which comprise the form transformer 1615, the database compactor 1616 and the form displayer 1620 are written in SKILL code, a computer language provided by Cadence Design Systems, Inc., San Jose, Calif. In other embodiments, other computer languages, such as C++, Pascal, and SmallTalk computer languages can be used as well.

Schematic Creation

Figure 17:
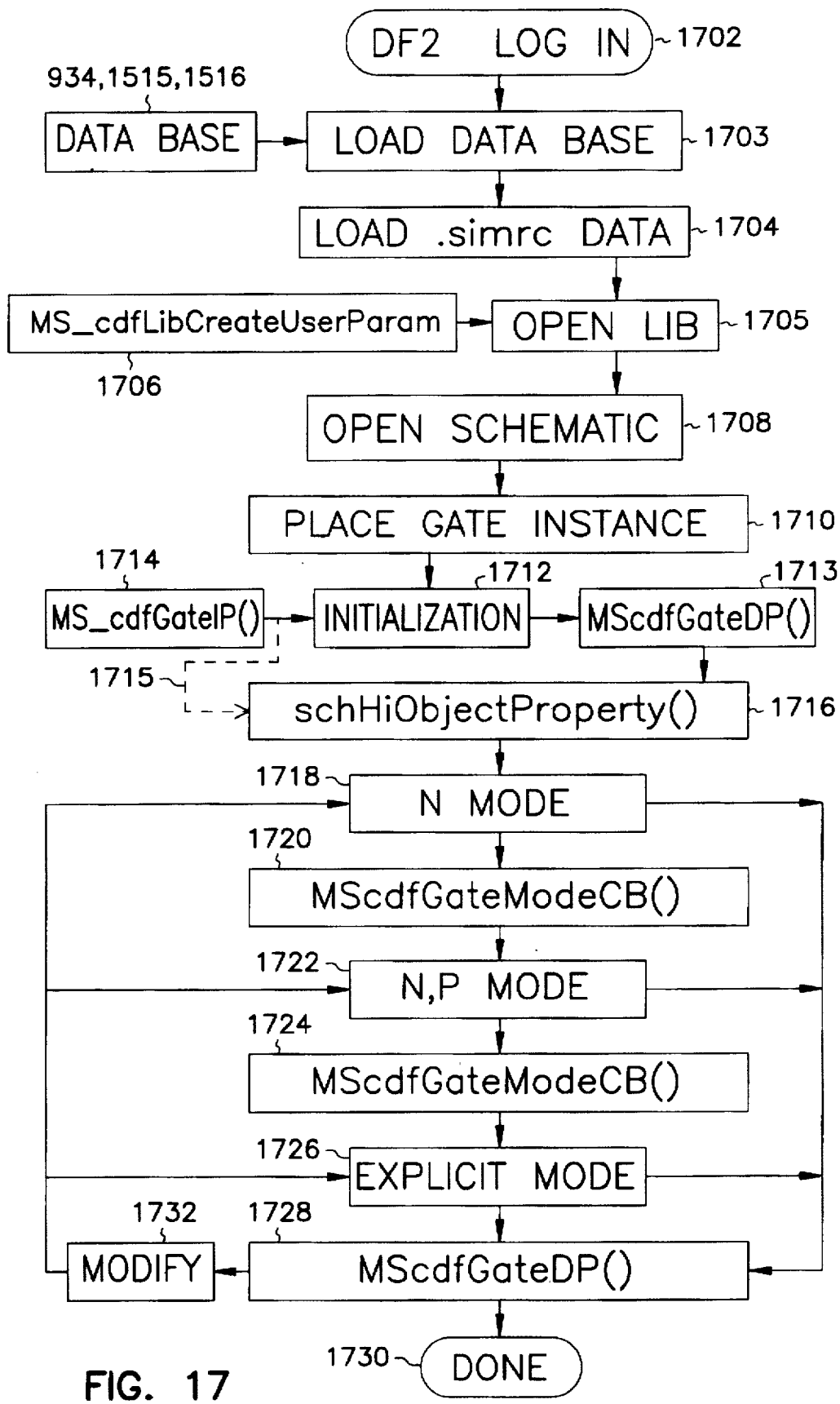
FIG. 17 is a process flow chart illustrating the steps taken by the schematic create engine in creating a property form using the database provided by the invention and in providing different property form formats for different design modes in accordance with the invention.

FIG. 17 is a process flow chart illustrating the steps taken by the schematic create engine 1605 in creating a property form for a design schematic wherein the property forms that are required are produced using the gate cdf database 935 and the library cdf database 936 and the user level stored in the user level data storage 937. In one embodiment, the schematic is created by a CAD system, using a circuit schematic design tool, such as the referenced Cadence DF2 schematic design tool.

Referring to FIGS. 9, 16 and 17, initially, the schematic design tool 1605 is logged in at step 1702. Step 1703 loads the database which, for example, includes the form transformer 1615, the database compactor 1616 and the form displayer 1620, and parameter data contained in the gate cdf database 935 and the library cdf database 936 that have been created by the procedure MScdfGateCreate as described above with reference to FIG. 11. Step 1704 reads the central text file 939 ".simrc" to obtain any cdf parameter and/or global variable customizing values that are stored in the central text file. This information is stored in temporary memory, such as miscellaneous storage 940, to be accessible.

Digressing, each library cdf parameter that is defined in the central text file can be customized to customize the form display. To customize the form display, the circuit designer needs to edit the central text file 939 to enter values for any user-defined library cdf parameters. Values for the global variables NDEFW, NDEFL, PDEFL and PNR also can be entered into the central text file 939 for use in producing numerical displays of default expressions. The global variables are used by callback procedure "MScdfGateCB( )" to display numerical values for the default expressions whenever a change in mode occurs, as will be described. However, the global variables are only used in evaluating the default expressions, such as iPar("NDEFW"), and are not used to customize the form.

In addition, gate level cdf parameters can be customized by the procedure "MScdfGateIP( )", providing another level of customization. In the exemplary embodiment, to customize the form display, the circuit designer can use an interface such as the Cadence Command Interpreter Window (CIW) that is provided as part of the Cadence DF2 schematic design programs. CIW is the very first window to appear when logging into a DF2 schematic design session. The CIW allows the user to open the design window or other windows and can execute Cadence commands, such as the command to load the central text file ".simrc" (step 1704). Moreover, the CIW displays command prompts or error messages and allows the user to quit out of the DF2 schematic design programs.

The CIW allows the user to enter command lines such as Wn=23, or bnN="gnd!" to customize default values for the gate cdf parameters. The user types a command line like Wn="23" and presses the "Return" key on the computer keyboard to enter the command. This is done in the CIW which displays a line box for user entry. The customized gate cdf parameter data is stored in miscellaneous data storage 940. It doesn't matter if command lines such as Wn="23" are entered before or after MScdfLibCreateUserParam( ) has been run because gate cdf parameters are a separate set of cdf parameters from the set of library cdf parameters. However, for library cdf parameters like NDEFW, bnPLib, toolFilter, and etc, which can be customized in the central text file, customizing values must be entered into the central text file .simrc 939 before the central text file is loaded at step 1704, and before the library slib 1030 is opened (step 1705). The procedure "MScdfGateIP( )" uses the customized default values stored in temporary memory by CIW for customizing the form display.

Referring again to FIG. 17, step 1705 opens libraries, including the standard library 1030 and the user design library 1630, and triggers the procedure "MScdfLibCreateUserParam( )", block 1706 which creates "user" level cdf parameter data for property forms that are used in designing a circuit schematic. The user level parameter data that is created is stored in the user level data storage 937 (FIG. 10) which is provided to the form transformer 1615 as shown in FIG. 16. The property forms are customized as to some or all of the default settings for library cdf parameters that are displayed on the property forms. The user level parameter data is dynamic and is not saved when the schematic design session is logged out. The fact that this user level parameter data is not saved provides a handle that allows the circuit designer to customize any or all of the library cdf parameters "m", "toolFilter", "gateSize", "bnPLib", "bnNLib", "paramX", and "paramY". A process flow chart for procedure "MScdfLibCreateUserParam( )" is given in FIG. 18 and illustrates how the form transformer 1615, using parameter values stored in the central text file 939, updates the library cdf parameters that are read from the library cdf database 936 in producing property forms.

The procedure "MScdfLibCreateUserParam( )" is similar to the procedure "MScdfLibCreateBaseParam( )", but differs in that the cdf parameters that are created have specific default values that are established by entering default parameter values into the central text file 939. The procedure MScdfLibCreateUserParam( ) creates only those library cdf parameters being customized with new default values in the central text file. These values provide new default values which are used rather than the default values that are produced by the procedure "MScdfLibCreateBaseParam( )". The cdf parameters created by the procedure "MScdfLibCreateUserParam( )" are referred to as user-level cdf parameters.

The procedure "MScdfLibCreateUserParam( )" accesses the data read from the central text file 939 and, for each of the global variables and each of the library cdf parameters of the parameter group _MS_CDF_LIB_PARAM_ALL, that are defined in the gate cdf database 935 and the library cdf database 936, creates a user-level cdf parameter. Each user-level cdf parameter that is created has the parameter value that is stored in the central text file 939, rather than the default value that is provided for the base level cdf parameters. These customized "user-level" cdf parameters, that are created by the procedure "MScdfLibCreateUserParam( )" are stored in the user level parameter data storage 937.

Figure 18:
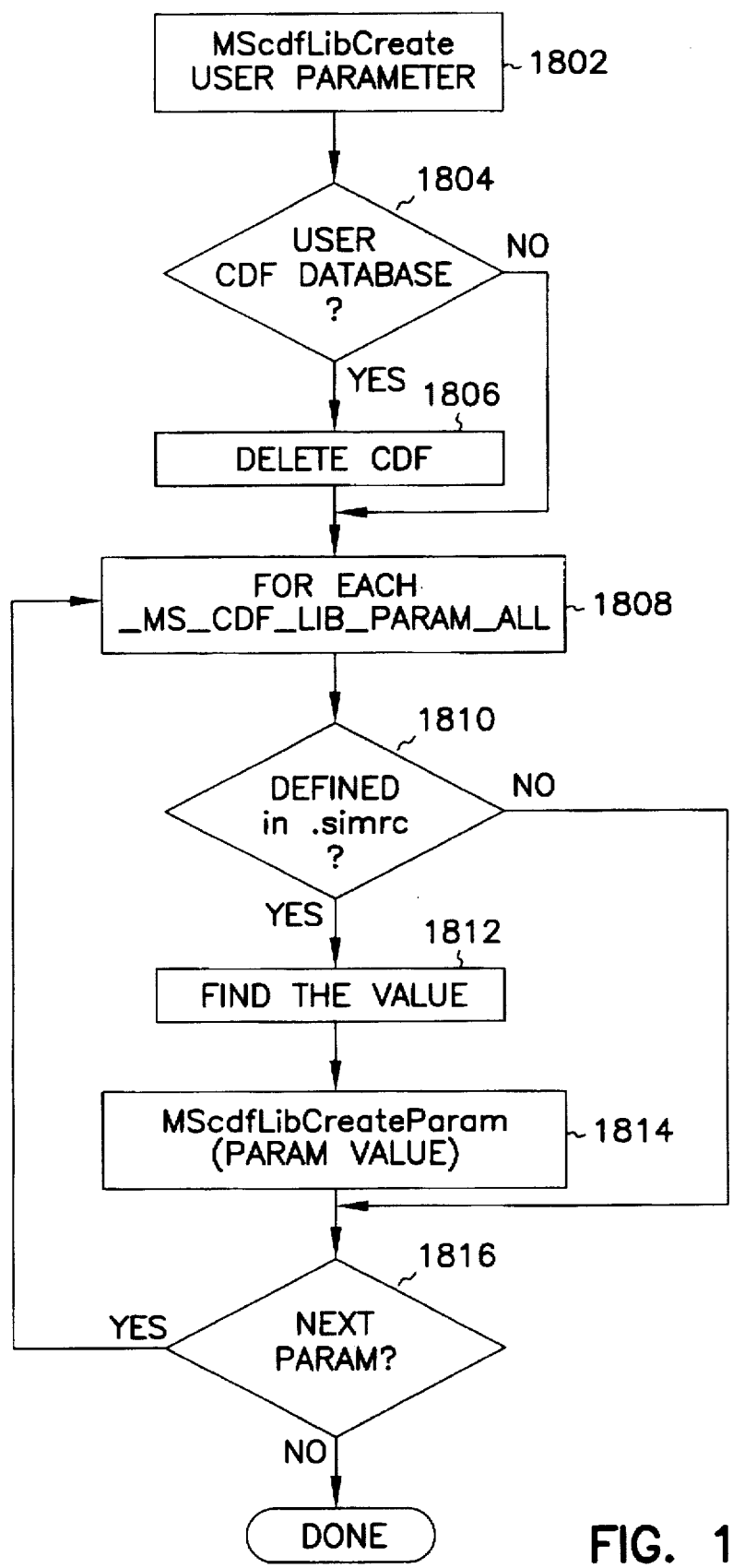
FIG. 18 is a process flow chart illustrating how the form transformer updates parameters that are read from the library cdf parameter database in producing property forms.

Referring to FIG. 18, the procedure "MScdfLibCreateUserParam( )" starts at step 1802. Steps 1804–1806 determine if data is contained in the user-level cdf parameter data storage 937 and if so, deletes the user-level cdf parameter data. Any user-level cdf parameters that were previously created and stored in the user-level cdf parameter database are deleted because steps 1808–1814 of the procedure create all of the user-level cdf parameters that are to be customized. Any library cdf parameters that are not customized are obtained from the library cdf database 936.

Steps 1808–1814 create, one at a time, those ones of the cdf parameters,"m", "gateSize", "toolFilter", "bnPLib", "bnNLib", "paramX" and "paramY", that are to be customized by calling the procedure "MScdfLibCreateParam( )". Step 1810 accesses the user-defined parameter data read from the central text file 939 to determine if the cdf parameter that is being processed is defined in the central text file. It is pointed out that the value stored in the central text file can be a number value or a string value. If the parameter is defined in the central text file, step 1812 finds the value for the parameter. At step 1814, the procedure "MScdfLibCreateParam( )" is run to replace the default value with the customizing value as the parameter is created. Step 1814 saves the user-level cdf parameter in the user cdf database 937 and the procedure advances to step 1816 to obtain the next parameter. If step 1810 determines that the library cdf parameter is not defined in the central text file, the procedure jumps to step 1816 to obtain the next parameter. Any cdf parameter that is not defined in the central text file is not created by the procedure. Rather, the default value for such parameter is determined from the base level definition. Thus, if a circuit designer has no preferences, the library cdf parameter values used are those that are created by the procedure "MScdfLibCreateBaseParam( )" and the parameter values are obtained from the library cdf database 936. When step 1816 determines that all of the cdf parameters have been processed, control is returned to the schematic create driver 1610.

Referring again to FIG. 17, a schematic is opened at step 1708. Then, at step 1710, the circuit designer places a gate instance on the schematic. In response to placing an instance on the schematic, initialization step 1712 obtains cdf parameter data from the user-level cdf parameter data storage 937 for the library parameters that are to be customized and cdf parameter data from the library cdf database 936 for any library cdf parameters that are not being customized, and obtains cdf parameter data from the gate cdf database 935 for all the gate parameters. In addition, step 1712 calls the initialization procedure "MScdfGateIP( )", block 1714, of the form transformer 1615, for initializing an Add Component form that is produced in response to placing an instance on the schematic. An example of an Add Component form is illustrated in FIG. 20.

The procedure "MScdfGateIP( )" is called each time that an instance is placed on the schematic to customize the form display as to library cdf parameters and gate cdf parameters for that instance. For customization of library cdf parameters, the procedure "MScdfGateIP( )" provides an automatic customization of the form display using the values for the user-defined parameters that have been entered into the central text file 939 and transferred to the library user database 937 by the procedure "MScdfLibCreateUserParam( )". For customization of gate cdf parameters, such as parameter Wn="23", these parameters are customized on the fly using the CIW, on the "Add Component" form which is called by a Cadence create instance procedure referred to as the schHiCreateInst( ) procedure when a new instance is to be added displays the customized value. If the form is closed, the user still gets the same customized instance of Wn="23" when adding another new instance by the schHiCreateInst( ) procedure. The customization eliminates the need to select various operating conditions and gate cdf parameters so that the same information does not have to be re-entered every time a new gate instance is placed. Without this gate level customization, users have to manually modify parameters, such as Wn, for every placement.

Figure 19:
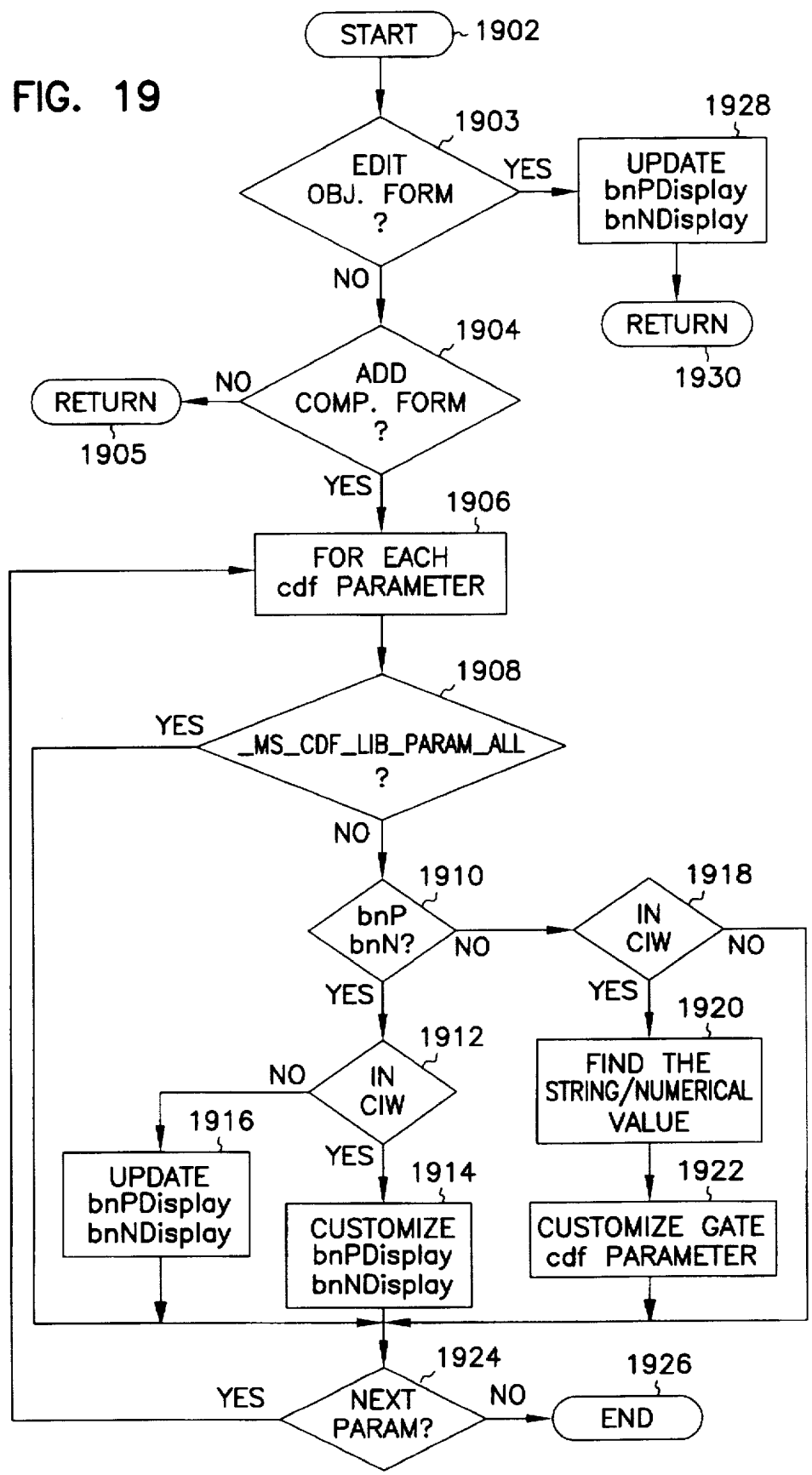
FIG. 19 is a process flow chart illustrating how the form transformer updates property forms as to the display of node potentials and customizes Add Component forms.

The procedure "MScdfGateIP( )" allows the circuit designer to customize parameter default values, thereby customizing the property forms that are displayed during the creation of a circuit schematic. FIG. 19 is a process flow chart illustrating how the initialization procedure "MScdfGateIP( )" of the form transformer customizes an Add Component form so that the property forms produced in connection with the creation of a circuit schematic are customized.

Figure 20:
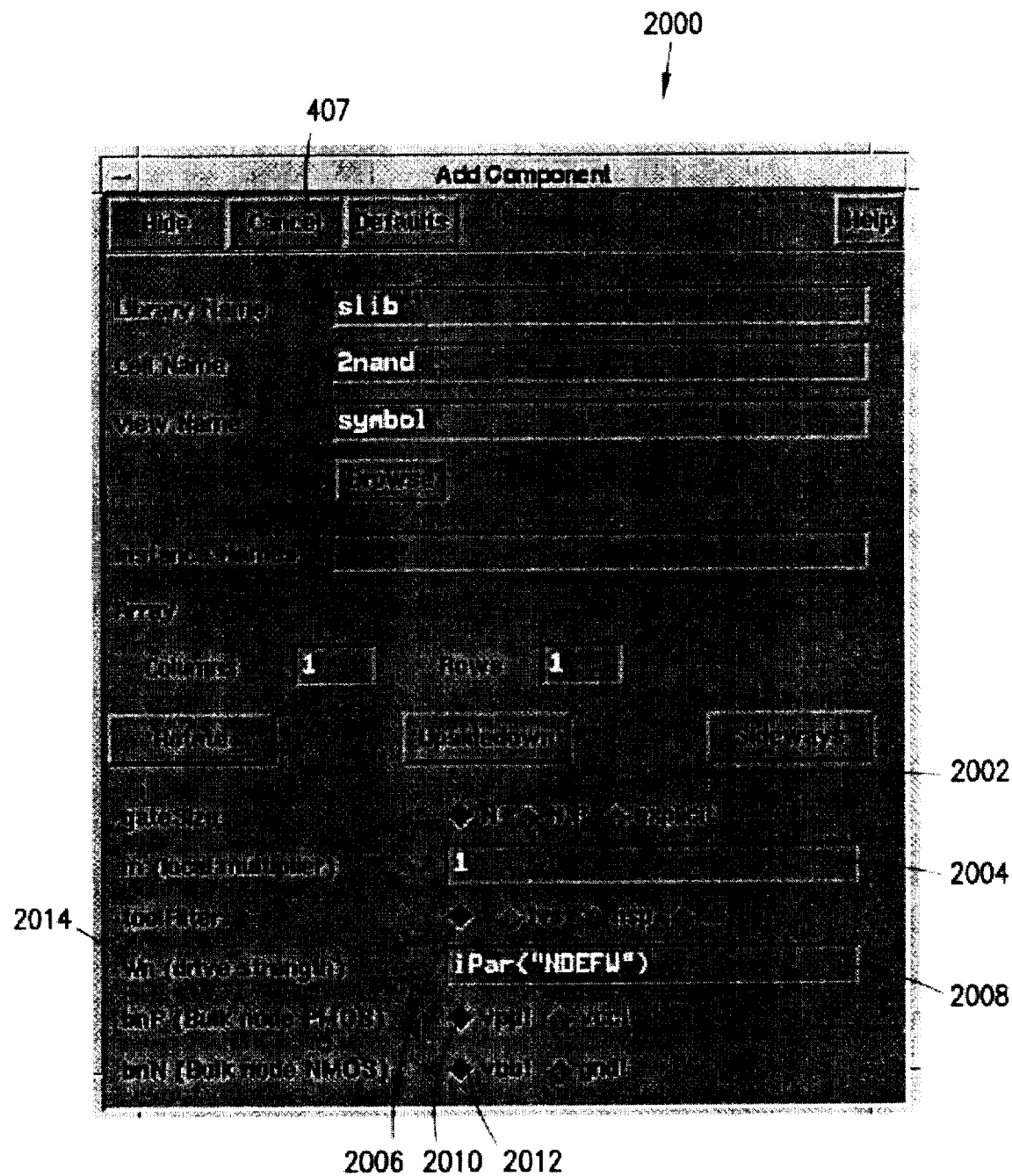
FIG. 20 is a representation of an Add Component form that is produced upon placing a logic gate instance on a schematic.

Digressing, FIG. 20 illustrates an Add Component form 2000 that is displayed in response to a gate instance being placed on the schematic. In the exemplary embodiment, the parameter values that can be specified by the circuit designer include the default mode for gateSize (i.e., mode N, NP, Explicit) 2002, local multiplier "m" 2004, toolFilter (lvs, hsp, all) 2006; the bulk potential bnpLib (vpp! or vcc!) 2010 for PMOS devices; and the bulk potential bnNLib (vbb! or gnd!) 2012 for NMOS devices. The procedure "GateModeIP( )" customizes the display of the gate cdf parameters, such as drive strength (Wn) 2014, which are created using the Gate Create procedure and are stored in the database 935. In addition, the procedure "GateModeIP( )" customizes the Add Component form as to the display of the parameters bnP and bnN because these parameters are more likely to be changed by the circuit designer. The procedure customizes these parameters each time an instance is placed on a schematic.

The bulk node potential parameters bnPLib and bnNLib are library level parameters which are created by the procedure "MS_cdfLibCreateParam( )". The library cdf parameters bnPLIb and bnNLib have default values and are stored in the library cdf parameter database. The bulk node potential parameters are also defined as parameters bnP and bnN, which are gate level parameters which are created by the procedure "MScdfGateCreate". The gate cdf parameters bnP and bnN can have customized values or default values and are stored in the object database for the instance to which the parameters apply. Also, the bulk node potential parameters that are being displayed on a property form are defined as bnPDisplay and bnNDisplay with the values for the parameters bnP and bnN being obtained from the object property database. The purpose of the multiple definition of the bulk node potentials is to provide flexibility for the circuit designer in selecting bulk node potentials for the gates of circuit schematics being designed by providing a flexible default condition for these parameters.

The parameters bnP and bnN are selectable using radio type selectors rather than data boxes that are used for the other gate cdf parameters. This allows the user to see the actual value for the bulk node potentials rather than a default expression, such as "iPar("bnPLib")", as is displayed for the other gate cdf parameters during the initialization procedures. Moreover, the power and ground lists contained in the data structure 934c can be altered to include additional choices for the parameters bnP and bnN without affecting the form and schematic creation procedures.

The procedure "MS_cdfLibCreateUserParam( )" determines if the parameters bnPLib and bnNLib are defined in the central text file and if so, customizes these parameters. However, no change is made in the library cdf parameter database. During initialization, the procedure "MScdfGateIP( )" accesses the customizing data read from the central text file and customizes the parameters bnP and bnN, if customizing values have been entered into the central text file. This information is used to customize the display of these parameters. If customizing values have not been entered into the central text file for these parameters, the parameters are displayed as the default values of bnNLib and bnPLib stored in the library cdf parameter database 936.

In producing an Add Component form, the schematic create engine 1605 (FIG. 16) accesses the library database 1030 to obtain a new schematic. In addition, the schematic create engine accesses the library cdf parameter database contained in database 936 to obtain those parameters needed to display the Add Component form and which are not available from the library slib 1030. Also, user level data in the user-level parameter data storage 937 is accessed to obtain any customized parameter values that have been produced by the procedure "MScdfLibCreateUserParam( )".

Producing the Add Component form includes displaying default values for the cdf parameters, substituting customizing values for the default values depending upon what data is stored in the central text file. In the exemplary embodiment, the Add Component form 2000 displays default values that are obtained from the library cdf parameter database. Thus, N mode is the default mode for the procedure as is indicated at 2002 for gateSize on the form 2000. The multiplier "m" is the default value of "1" as is indicated at 2004. No tool filter is selected as is indicated at 2006. In addition, the drive strength Wn (2014), as displayed, is represented by the default expression "iPar ("NDEFW")" shown in data box 2008 if the parameter is not customized. Also, the PMOS bulk potential is vpp! as is indicated at 2010 and the NMOS bulk potential is vbb! as is indicated at 2012.

Referring to FIGS. 19 and 20, the procedure "GateModeIP( )" starts at step 1902. Step 1903 determines if an Edit Object Property form is being displayed. It is pointed out that the Add Component form, such as Add Component form 2000, is produced before the Edit Object Properties form. Accordingly, the first time that the procedure "GateModeIP( )" is run for a given instance, the procedure continues to step 1904 which determines whether or not an Add Component form is being displayed. If step 1904 confirms that the form being displayed is an Add Component form, the procedure continues to step 1906. Otherwise, step 1905 returns control to the schematic create driver 1610.

When step 1904 determines that an Add Component form is being created, then, steps 1906-1922 process, in sequence, each of the cdf parameters, including the library cdf parameters, the global variables, and the gate cdf parameters. As each cdf parameter is obtained at step 1906, step 1908 determines if the parameter being processed is contained in the group _MS_CDF_LIB_PARAM_ALL, i.e., is one of the library cdf parameters or one of the global variables. The form display default values for the parameters in this group have already been customized using the procedure "MScdfLibCreateUserParam( )". Accordingly, for each cdf parameter that is contained in the group _MS_CDF_LIB_PARAM_ALL, the procedure jumps to step 1924. Step 1924 determines if there is another cdf parameter to be processed. If so, the procedure returns to step 1906 to process the next cdf parameter. The gate cdf parameters are not contained in the group _MS_CDF_LIB_PARAM_ALL. Examples of gate cdf parameters for which default settings can be changed include drive strength Wp, Lp, Ln, bnP, bnN, wpA, wnA, lpA, lnA, etc. The gate cdf parameters are produced by the procedure MS_cdfGateCreate and the parameter data is stored in the gate cdf parameter database 935. The values for these parameters are stored in the object database 1635 for the instance to which the values apply. In addition to the automatic customization provided by the procedure "MScdfGateIP( )", the circuit designer can manually customize the default settings for the user-defined parameters that are being displayed on the Add Component form.

Step 1910 determines if the cdf parameter being processed is either one of the cdf gate parameters bnP or bnN. If so, step 1912 determines if the cdf gate parameter bnP (or bnN) is defined in CIW. If so, step 1914 customizes the bnPDisplay (or bnNDisplay) to correspond to the value stored in CIW. The customized value is stored in the object database 1635 when the circuit designer places the current instance. The process continues to step 1924 which determines if there are any more cdf parameters to be processed and if so, returns to step 1906. If step 1912 determines that the parameter is not defined in CIW, then step 1916 updates the parameter bnPDisplay (or bnNDisplay) to have the default value stored in the library cdf parameter database. In updating the parameter bnPDisplay or bnNDisplay, the procedure obtains the value for the parameter from the instance database if the parameter has been customized by step 1914 or from the parameter database, i.e., the default value, if the parameter has not been customized. The parameters bnPDisplay and bnNDisplay are stored in temporary storage and are not saved when a form is closed. Accordingly, values for these parameters are updated when an Add Component form or a property form is brought up.

The process continues to step 1924 which determines if there are any more cdf parameters to be processed and if so, returns to step 1906. If step 1910 determines that the cdf parameter is neither bnP nor bnN, the procedure continues to step 1918 which determines whether the cdf parameter is defined in CIW. For each gate cdf parameter, other than parameters bnP and bnN, that is defined in the database, step 1920 finds the string value or the numerical value for the parameter, and step 1922 uses the value to customize these gate cdf parameters for use in providing numerical values for display when the procedure MScdfGateCB( ) is run. If step 1918 determines that the cdf gate parameter is not defined in CIW, then the process continues to step 1924 which determines if there are any more cdf parameters to be processed and if so, returns to step 1906. When step 1924 determines that there are no further cdf parameters to process, step 1926 returns control to the schematic create driver 1610.

Any one of the modes N, NP or Explicit can be selected as the default mode and appropriate default expressions are displayed on the Add Component form that is brought up, depending upon the default mode that has been selected. For example, when NP mode is selected as the default mode, the default expressions for parameters Wp, Wn, Lp and Ln are displayed. Also, when Explicit mode is selected, in addition to the default expressions for parameters Wp, Wn, Lp and Ln, default expressions are displayed for parameters wp, wn, lp, and ln for each of the devices that comprise the logic gate that is placed on the schematic. Likewise, the settings for drive strength, tool filter and bulk potentials can be changed on the Add Component form.

It is pointed out that when the Add Component form has been brought up, even if customizing parameter values have not been entered into CIW, the circuit designer can manually change the settings for the multiplier, the operating mode, the tool filter, drive strength or bulk potentials, as desired. The information that has been entered onto the Add Component form manually is not saved in the library cdf parameter database that is used to create the forms when the Add Component form is closed. However, the circuit designer can save information entered onto the form by clicking the mouse prior to closing the form. This causes the entered information to be saved to the object property database for the current instance. Thus, unless the circuit designer saves the information to the object database, upon reopening of the design library, the form displays the default values that have been created through procedures MS_LibCreateBaseParam( ) and MS_cdfLibCreateUserParam( ).

Referring to FIG. 17, when customization of the Add Component form is done and any changes in the default settings have been entered onto the form, the circuit designer places the gate instance using one of the input devices 925 (FIG. 9), such as by a click of the mouse. This causes the customized form display information to be stored in the object database 1635 of the user schematic database 1638 that is created for the current instance. In addition, at step 1713, a procedure "MScdfGateDP( )" of the database compactor 1616 is run to update the object database 1635. The manner in which the procedure "MScdfGateDP( )" updates the schematic database is described below with reference to FIG. 22. Then, the circuit designer closes the Add Component form 2000 by selecting "Cancel" 407 on the form 2000. The customized parameter settings that have been chosen by the designer are established for future access. When customization of the Add Component form is complete, the initialization process (step 1712) is complete and step 1918 returns control to the schematic create driver 1610.

Subsequently, as each instance is placed on the schematic, a procedure "schHiObjectProperty( )" of the form displayer 1620 is called at step 1716. The procedure "schHiObjectProperty( )" enables the circuit designer to change any property for an instance. The procedure "schHiObjectProperty( )" produces the Edit Object Properties form, hereinafter "property form", for the selected instance. The property form that is brought up is customized in correspondence with the customization of the Add Component form 2000. The procedure "schHiObjectProperty( )" accesses the object data contained in the object database 1635 to get the saved property parameter values for the library cdf parameters for the current instance. The procedure "schHiObjectProperty( )" also runs the procedure MScdfGateIP( ), as represented by the dashed line 1715. However, as is illustrated in FIG. 19, when step 1903 determines that an Edit Object Properties form is being created, the procedure branches to step 1928 which updates the cdf parameters bnPDisplay and bnNDisplay for the component bulk connections. Step 1930 then returns control to the schematic create driver 1610.

Figure 24:
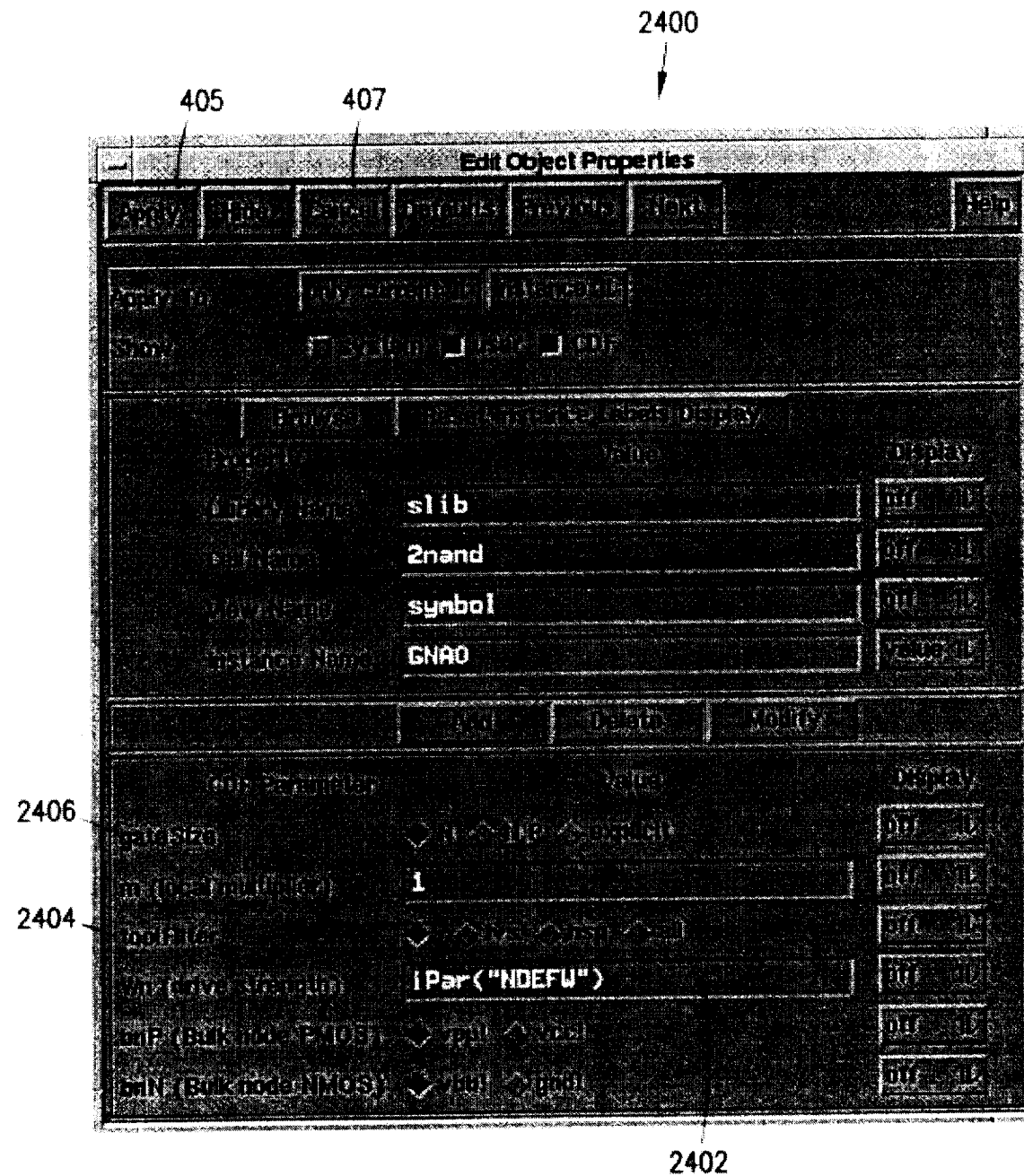
FIG. 24 is a representation of the initial property form that is displayed upon entering N mode.

Referring to FIG. 17, because N mode (step 1718) is the default mode in the example, the initial property form that is displayed on the screen 960 of the display unit (FIG. 9) corresponds to property form 2400 that is shown in FIG. 24. Note that the drive strength is expressed as "iPar(NDEFW)" as indicated at 2402. The circuit designer can specify any value for "NDEFW" and, for example, initially the value is selected to be "10" and this value is displayed on the property form, as for property form 400 which is shown in FIG. 4. When "Apply" 405 is selected, the parameter value is stored in the object database 1635.

Figure 21:
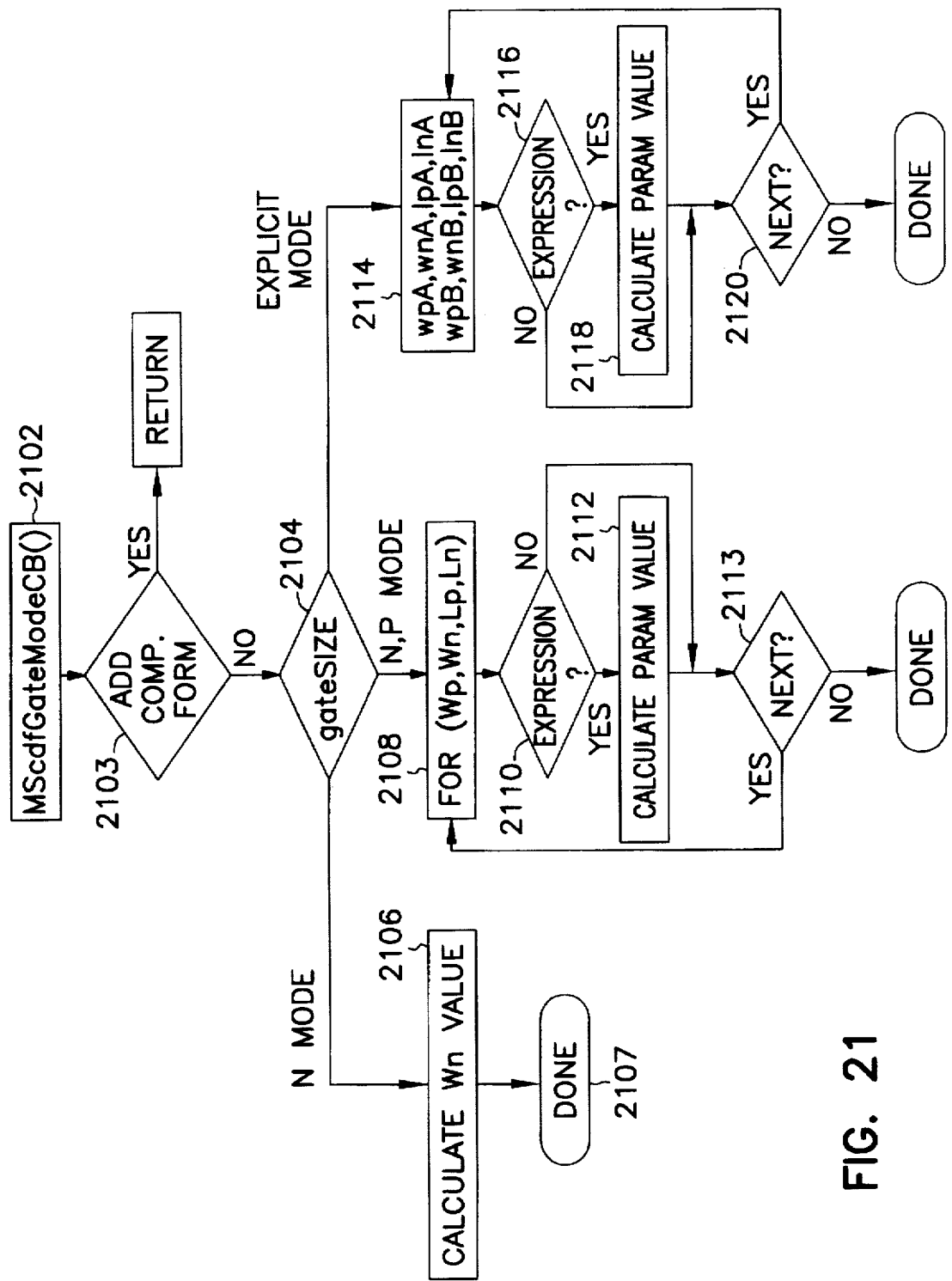
FIG. 21 is a process flow chart illustrating how the form transformer updates parameter values being displayed on a property form.

Whenever "gateSize" is changed on the active property form at steps 1718, 1722 or 1726 (FIG. 17), a procedure "MScdfGateModeCB( )" is called by steps 1720 and 1724, for example. The procedure "MScdfGateModeCB( )" updates all of the parameter values that are being displayed on the active property form, including calculating numerical values for the parameters based upon default values if default values exist, as will be described. In addition, the schematic create engine 1605 causes creation of the labels, data boxes, etc. that are required for the mode that has been selected. The information needed to display the appropriate prompts, default expressions, and data boxes is obtained from the gate cdf parameter database 935, the cdf library parameter database 936 and the user level parameter data storage 937. The procedure MS_cdfGateCreate, the source code of which is provided in FIGS. 30A, 30B and 30C, includes query functions such as "?display" (see for example, lines 3013 and 3024 in FIG. 30A) that are interpreted by the Cadence driver for displaying the appropriate form as a function of the mode that is selected. That is, parameter labels, data boxes, and numerical default values are added to the property form when changing from N mode to NP or Explicit mode (or from NP to Explicit) or deleted from the property form when changing from Explicit mode to NP or N mode (or NP mode to N mode). FIG. 21 is a process flow chart illustrating how the form transformer 1615 updates parameter values being displayed on a property form.

Referring to FIG. 21, the procedure "MScdfGateModeCB( )" updates all of the parameter values on the active property form whenever the gateSize is changed. The procedure begins at step 2102, and step 2103 determines if the Add Component form is being displayed. If so, control is returned to the schematic design driver 1610 because the procedure "MScdfGateModeCB( )" is not run for the Add Component form. If step 2103 determines that the Add Component form is not being displayed, then, step 2104 determines which mode is currently selected. For the N mode, step 2106 calculates the value for Wn. Step 2107 returns control to the schematic create driver 1610.

For NP mode, steps 2108–2110 determine, for each of the parameters "Wn", "Wp", "Lp" and "Ln", if the parameter displayed by Cadence form displayer 1620 is an expression-type string whose value cannot be determined by evaluating the string. If so, step 2112 uses a Cadence SKILL command cdsParam( ) to calculate the corresponding value of the expression by using the global variables which have been converted into library cdf parameters by MScdfLibCreateUserParam( ) as described above. See, for example, the property form 2500 shown in FIG. 25 where a non-default value of "10" is displayed for parameter Wn and numerical default values are displayed for parameters Wp, Lp and Ln. The value for parameter Wp is "15" which is obtained by evaluating the default expression "iPar("PNR") *iPar("Wn")", where "NDEFW" is equal to "10" and "PNR" is equal to 1.5. The values for Lp and Ln are obtained by evaluating respective default expressions "iPar ("PDEFL")" and "iPar("NDEFL")". When all four parameters have been processed, as determined by step 2113, control is returned to the schematic create driver 1610.

Figure 28:
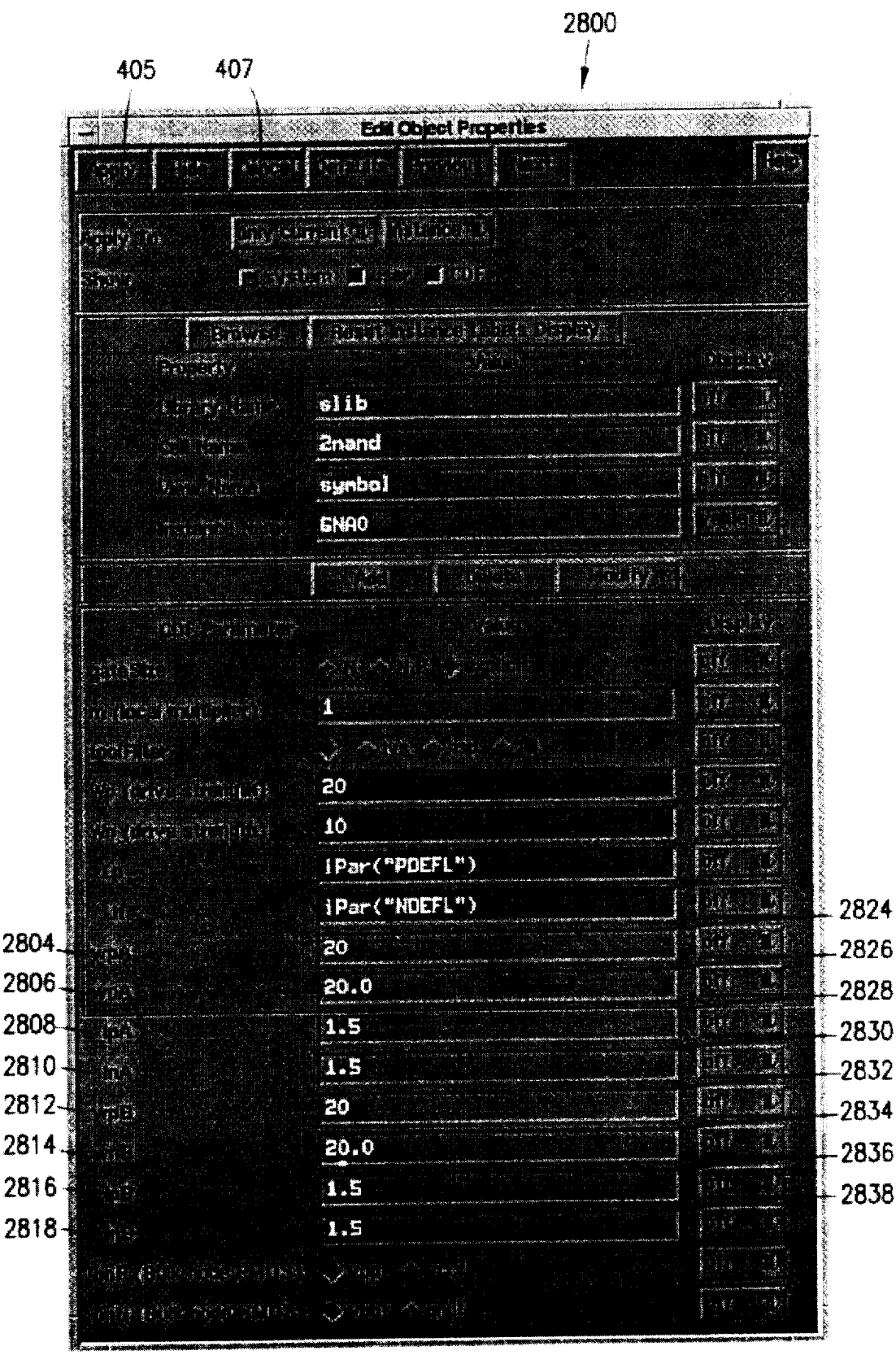
FIG. 28 is a representation of the property form that is displayed upon entering Explicit mode after drive strengths have been specified for n-channel and p-channel devices.

Similarly, for Explicit mode, steps 2114–2116 determine, for each of the parameters wpA, wnA, lpA, lnA, wpB, wnB, lpB, lnB, etc., if the parameter displayed by Cadence form displayer 1620 is an expression-type string whose value cannot be determined by evaluating the string. If so, step 2118 uses Cadence SKILL command cdsParam( ) to calculate the corresponding value of the expression by using the global variables which have been converted into library cdf parameters by MScdfLibCreateUserParam( ) as described above. The property form 2800, shown in FIG. 28, shows numerical values displayed for the parameters wpA, wnA, lpA, lnA, wpB, wnB, lpB, lnB, etc. Step 2120 determines when all of the parameters have been processed and then returns control to the schematic create driver 1610.

Figure 22:
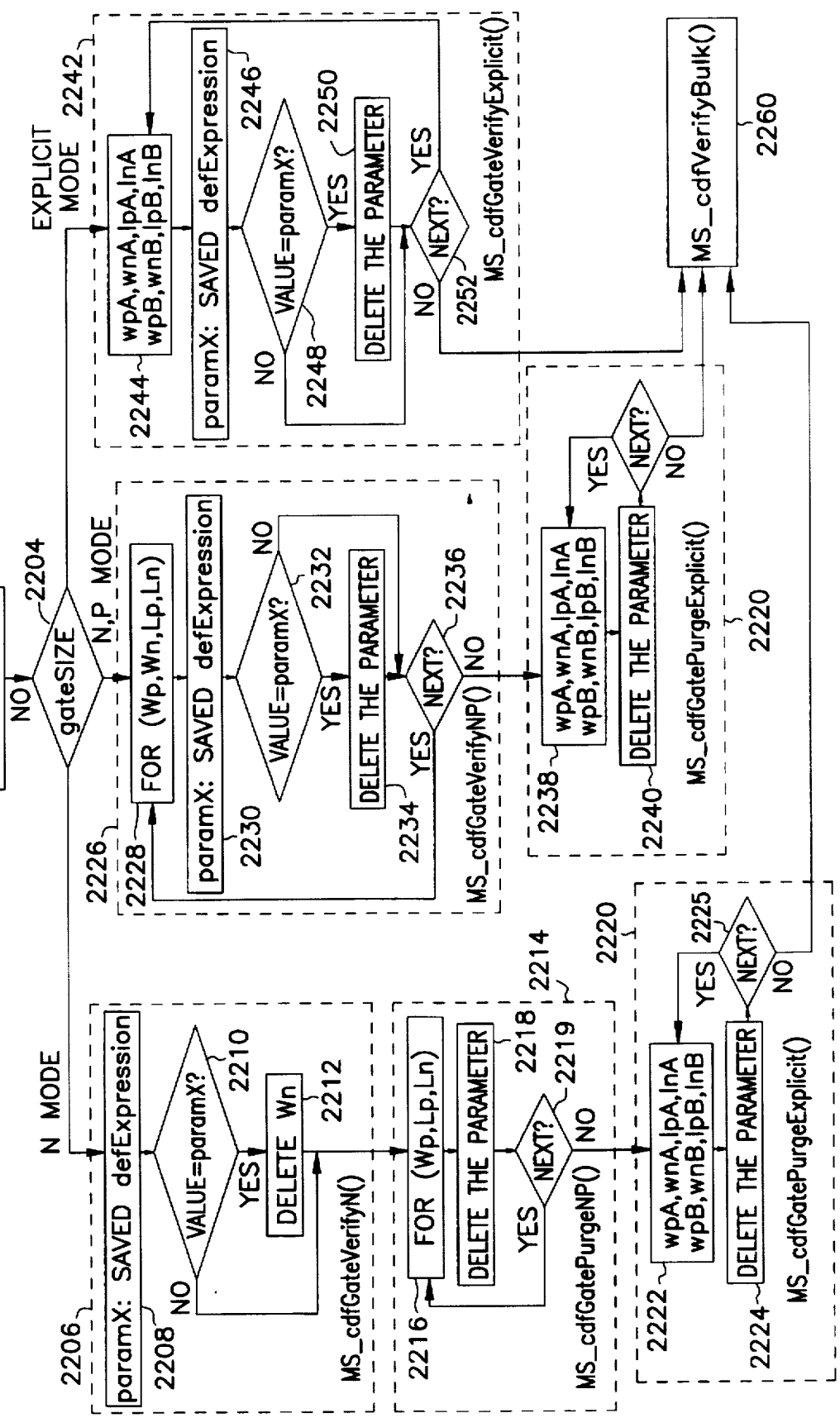
FIG. 22 is a process flow chart illustrating how the database compactor screens parameter default values and purges parameters when parameter data is being saved to the instance database.

Referring again to FIG. 17, also, when "Apply" 407 (FIG. 25) is selected, the procedure advances to step 1728 which calls a procedure "MScdfGateDP( )" of the database compactor 1616 to update the schematic object database 1635. Procedure "MScdfGateDP( )" includes procedures that conform the values of parameters, such as "Wn", "Wp", "Ln" and "Lp", stored in the schematic object database 1635 to the current state of the active property form and saves, or deletes, size and netlist properties when necessary. FIG. 22 is a process flow chart illustrating how the database compactor 1616 screens parameter default values and purges parameters when parameter data has been saved to the object database by the Cadence "Apply" function.

Referring now to FIG. 22, the procedure "MScdfGate DP( )" of the database compactor 1616 includes procedures "MS_cdfGateVerifyN( )" 2206, "MS_cdfGateVerifyNP( )" 2226, "MS_cdfGateVerifyExplicit( )" 2242, and "MS_cdfGateVerifyBulk( )" 2260, the functions of which are to screen out parameter values that are equal to default values as will be described. The procedure "MScdfGateDP( )" also includes the procedure "MS_cdfGatePurgeNP( )" 2214 and the procedure "MS_cdfGatePurgeExplicit( )" 2220, the functions of which are to delete parameters, absolutely, in response to a change in mode, as will be described. It is pointed out that although the procedure "MS_cdfGatePurgeNP( )" 2214 and the procedure "MS_cdfGatePurgeExplicit( )" 2220 are carried out whenever gateSize is changed to the N mode or the NP mode, these procedures are effective only when changing from Explicit mode to NP mode or N mode, or from NP mode to N mode because the function of these procedures is to delete parameters that are not to be used in the new mode selected.

The procedure "MScdfGateDP( )" includes a separate branch for each of the modes. The mode that is currently selected is determined by step 2204. For N mode, the procedures "MS_cdfGateVerifyN( )" 2206, "MS_cdfGatePurgeNP( )" 2214 and "MS_cdfGatePurge Explicit( )" 2220 are preformed. The procedure "MS_cdfGateVerifyN( )" 2206 screens out parameter values that are equal to default values by comparing the value of each parameter with the default expression for the parameter. The procedure "MS_cdfGateVerifyN( )" 2206 begins at step 2208 which stores the default expression iPar("NDEFW") as a temporary variable, which is identified as "paramX".

After "paramX" has been stored, at step 2210, the expression "paramX" is evaluated using a Cadence SKILL command cdsParam( ), using default values stored in the gate cdf parameter database and compares "paramX" with parameter Wn that is being displayed on the active property form to determine if the value of the parameter Wn being displayed is the default value. It is pointed out, Wn can be an expression, iPar(NDEFW) or a numerical value, such as "10" in the example. If the value of parameter Wn is "5" which is equal to the corresponding default expression iPar("NDEFW") saved in "paramX" in this case, step 2212 deletes the parameter value for Wn from the object database 1635 because the default value can be obtained from the library cdf parameter database when required. However, if the value of parameter Wn is not the default value, the currently active value of the parameter Wn is saved in the schematic object database 1635 for the current instance.

The procedure "MScdfGateDP( )" continues to step 2216 and executes procedure "MS_cdfGatePurgeNP( )" 2214. Steps 2216-2219 delete any parameter values for Wp, Lp, and Ln that have been stored in the object database 1635 for each of these parameters because these parameters are not displayed for N mode. This procedure is executed when changing from NP mode to N mode, or from the Explicit mode to N mode. The procedure continues to step 2222 which executes procedure "MS_cdfGatePurgeExplicit( )" 2220. Steps 2222-2225 delete the parameter values wpA, wnA, lpA, and lnA, etc., for each of the parameters wp, wn, lp, and ln because these parameters are not displayed for N mode. This procedure is executed when changing from Explicit mode to N mode, for example.

For NP mode, the procedure "MS_cdfGateVerifyNP( )" 2226 and the procedure "MS_cdfGatePurgeExplicit( )" 2220 are performed. The procedure "MS_cdfGateVerifyNP( )" 2226 is similar to procedure "MS_cdfGateVerifyN( )" 2206, except that the procedure is carried out in sequence for each of the parameters "Wp", "Wn", "Lp" and "Ln". Whenever the procedure "MS_cdfGateVerifyNP( )" is called, the default expression for each parameter of the set of parameters "Wp", "Wn", "Lp" and "Ln" that is to be verified is stored as "paramX" for use in verifying that the value of the parameters being verified match the corresponding default value. The parameters of a set of parameters, such as the parameter set Wp Wn, Lp and Ln, are verified one after another for each parameter of the set. The parameters are verified using Cadence SKILL command cdsParam( ) to evaluate the appropriate default expression, stored as "paramX", and comparing the numerical value with the parameter value that has been entered into the object database. The procedure "MS_cdfGatePurgeExplicit( )" 2220 has been described above.

For Explicit mode, the procedure "MS_cdfGateVerifyExplicit( )" 2242 is performed. Procedure "MS_cdfGateVerifyExplicit( )" 2242 is similar to procedure "MS_cdfGateVerifyNP( )" 2226, except that the procedure is carried out in sequence for each of the parameters of a set of device parameters. For the exemplary logic gate, the set of parameters includes the parameters wpA, wnA, lpA, lnA, wpB, wnB, lpB, lnB. The parameters processed are a function of the logic gate that has been placed on the schematic.

The procedure "MScdfGateDP( )" also calls the procedure "MS_cdfVerifyBulk( )" 2260 to screen out values for the bulk node connection parameters "bnP" and "bnN" that are equal to default values. The procedure "MS_cdfVerifyBulk( )" is similar to the procedure "MS_cdfGateVerifyNP( )" and screens out default values by comparing the value of each of the gate cdf parameters "bnP" and "bnN" that is being displayed with the default expression for the parameter. A process flow chart for the procedure "MS_cdfVerifyBulk( )" is given in FIG. 23.

Figure 23:
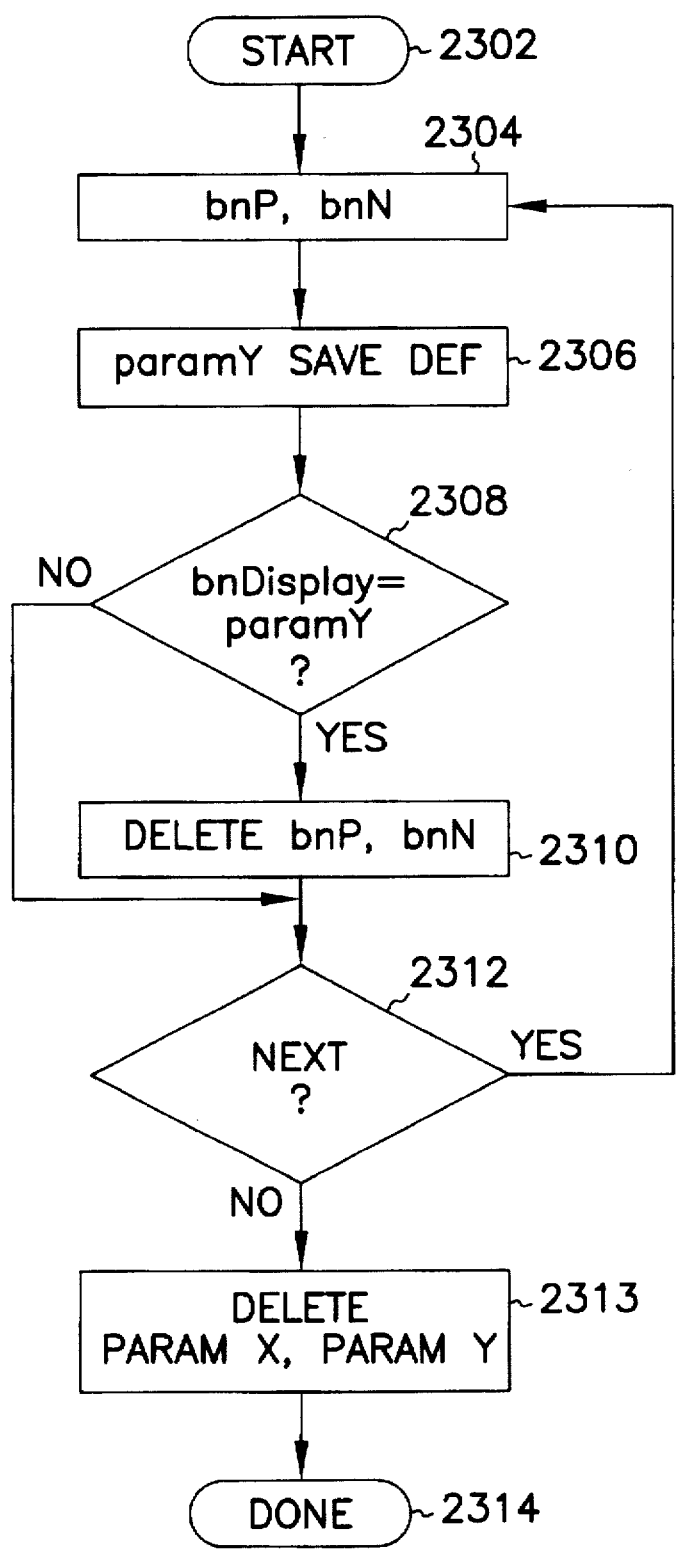
FIG. 23 is a process flow chart illustrating how the database compactor screens parameter default values for the bulk node connection parameter when an instance is placed on the schematic.

Referring to FIG. 23, the procedure "MS_cdfVerify Bulk( )" begins at step 2302. Steps 2304-2312 process the two gate cdf parameters bnP and bnN in sequence. When parameter bnP is being processed, step 2306 stores the default expression iPar("bnPLib") as a temporary variable that is identified as "paramY". This temporary variable is used in verifying that the value of the parameter being verified matches the corresponding default value.

After "paramY" has been stored, then at step 2308, the expression "paramY" is evaluated using Cadence SKILL command cdsParam( ) and compared "paramY" with the display value for the parameter "bnP" to determine if the value of the parameter "bnP" that is being displayed is the default value. It is pointed out the expression "iPar(bnPLib)" is evaluated as the default value "vcc!", in the example. If the parameter bnP is the default value, and thus is equal to "paramY", step 2310 deletes the parameter value for bnP from the object database 1635 because the default value can be obtained from the library cdf parameter database when required. However, if the value of parameter bnP is not the default value, the currently active value of the parameter bnP is maintained in the schematic object database 1635 for the current instance. Step 2312 then returns to step 2324 and a similar process is carried out for the parameter "bnN" using the default expression "iPar("bnNLib")". When both of the parameters bnP and bnN have been processed, step 2313 deletes "paramX" and "paramY". Then, step 2314 returns control to the schematic create engine 1605.

Referring again to FIG. 17, from step 1728, further changes can be made in parameters of the current instance, as represented by the step 1732 which is labeled "Modify". Step 1732 represents re-entering one of the steps 1718, 1722 or 1724, and the function "MScdfGateModeCB( )" updates the property form, depending on the mode selected. Alternatively, new parameter data can be entered into the active property form without change in operating mode. The object database 1635 is updated when "Apply" is selected.

Figure 29:
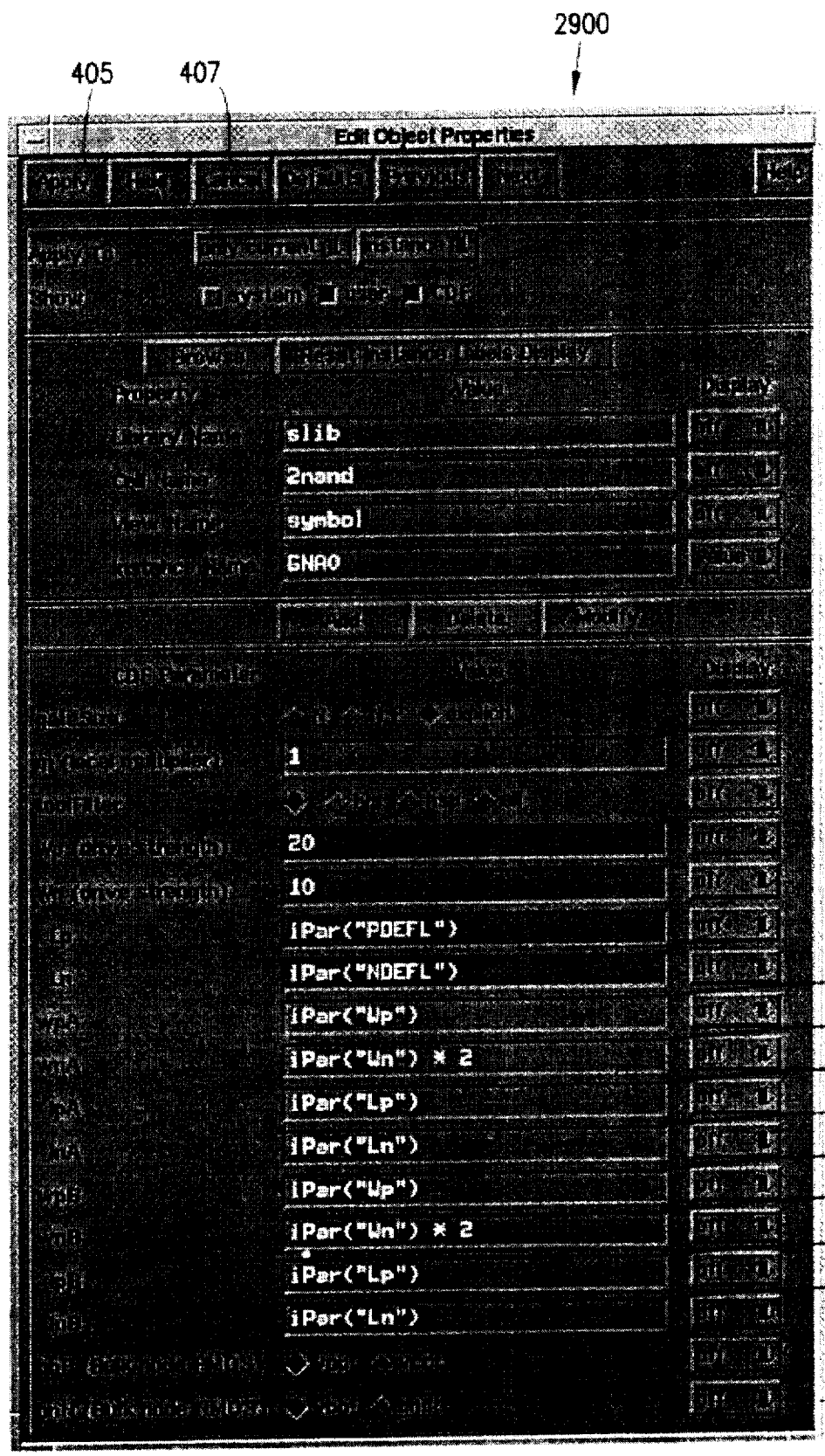
FIG. 29 is a representation of the property form of FIG. 28 after screening out default parameter values.

If no further changes are made, control is returned to the schematic create driver 1610, at step 1710, in response to the circuit designer closing the active property form by selecting "Cancel" 407 (FIG. 29). The procedure is reentered if the circuit designer reopens a previously created property form or places a further gate instance on the schematic. This results in the creation of a further property form by steps 1712–1716, and the selection of the default mode, N mode, at which time, the circuit designer can enter parameter data for the new instance, or select a different mode, as desired, following the flow of steps 1718–1732. It is pointed out that the initialization procedure "MScdfGateIP( )" is called each time a new instance is placed on the schematic by the circuit designer. The procedure "schHiObjectProperty( )" is called when a previously created form is reopened, and this procedure also calls the procedure "MScdfGateIP( )".

In summary, the procedures "MScdfGateModeCB( )" and "MScdfGateDP( )" provide dynamic form display. In response to a change in mode, the procedure "MScdfGateModeCB( )" automatically transforms expressions into numerical values for gate cdf parameters, such as Wn, Wp, Ln and Lp. When the user clicks the Cadence "Apply" button 405 (FIG. 4, for example) all numerical data displayed on the form is saved in the object database. However, the procedure "MScdfGateDP( )" deletes from the object database any gate cdf parameter values that are equivalent to their corresponding default expressions. Thus, this dynamic property form generation provides a convenient function that allows a circuit designer to see calculated final numerical values, instead of raw expressions, for gate cdf parameters whenever a mode change is effected. In addition, this dynamic property form generation maintains the object database compact by deleting parameters whose values are equivalent to their corresponding default expressions after data has been saved to the object database.

The following description illustrates the dynamic property form generation according to the invention using the gate cdf database 935 and the library cdf parameter database 936. In the example, it is assumed that no customizing parameter values have been entered into the central text file 939 for the library cdf parameters, "gateSize", "m", "toolFilter", "bnPLib" and "bnNLib". Thus, the Add Component form (FIG. 20) that is produced displays the default mode as being mode N as indicated at 2002; the local multiplier "m" as being "1" as indicated at 2004; the toolFilter as indicating none selected as indicated at 2006; the bulk potential bnPLib as being vpp! as indicated at 2010; and the bulk potential bnNLib as being vbb! 2012 as indicated at 2012.

As to the global variables NDEFW", "PNR", "NDEFL" and "PDEFL", the default values for these expressions can be changed by entering the appropriate data into the central text file. For example, a value of "5" has been entered into the central text file for global variable "NDEFW" and that a value of 1.5 has been entered into the central text file for global variable "PNR". Values of 1.5 have been entered for global variables "NDEFL" and "PDEFL" and are stored in the central text file.

Customization of the library level parameters in this manner provides for fill form customization, including gateMode-triggered callback. However, because these are library level parameters, these default values will customize form displays for all of the instances placed into a schematic. To provide more flexibility, gate level parameters are customized on the fly using the Cadence Command Interpreter Window (CIW) and are stored in temporary memory. In the example, only gate cdf parameter Wn is customized in this manner. These default value(s) for parameters customized by CIW are used in producing numerical value displays until manually changed back to the library default values or another value. Such change can be made in placing any instance and without having to edit the central text file which would require either closing and reopening the library and reloading the central text file after changing the stored default values (steps 1704 and 1705) or reloading of the databases, such as by relogging in the schematic design programs. Neither of these methods is as convenient as using the CIW.

Referring to FIGS. 9, 16 and 17, step 1702 logs in the schematic create programs. Step 1703 loads the databases including the gate create formatters 934, the Gate Count data structure 934a, the Gate Stack data structure 934b, the data structure 934c, the form transformer 1615 and the compactor 1616. Step 1704 reads the central text file 939. At step 1705, the library slib 1030 is opened and the library cdf parameter database 936 is loaded. Also, the procedure "MScdfLibCreateUserParam( )" is called to create a user level database 937 for use in customizing the form display.

Referring to FIG. 18, the procedure starts at step 1802. Steps 1804–1806 delete any data stored in the user level parameter data storage 937. Steps 1808–1814 process each parameter contained in group _MS_CDF_LIB_PARAM_ALL to determine which of these parameters is defined in the central text file, and thus is to be customized. As has been indicated, this group of parameters includes the global variables "NDEFW", "PNR", "NDEFL" and "PDEFL" and the library cdf parameters "m", "gateSize", "toolFilter", "bnPLib", "bnNLib", "paramX" and "paramY". For global variable "NDEFW", a parameter value of "5" has been stored in the central text file and this data was read from the central text file by step 1703. Also, a value of 1.5 was read from the central text file for global variable "PNR", and values of 1.5 have been read for global variables "NDEFL" and "PDEFL".

Step 1808 processes parameter "NDEFW". Step 1810 accesses the parameter data for the parameter "NDEFW" and determines that this parameter is defined in the central text file. Accordingly, step 1812 finds the value for the parameter. Then, step 1814 calls the procedure MScdfLibCreateParam( ).

Referring to the process flow chart of FIG. 15 and to the source code for the procedure MScdfCreateLibParam( ) illustrated in FIG. 33, the procedure starts at step 1502 and step 1504 determines that the parameter "NDEFW" being processed is a global variable from the set MS_CDF_GLOBAL_VAR and step 1506 calls the procedure "cdfCreateParam( )" which creates the parameter.

Step 1506 creates the parameter to have a default value of "5". Referring to FIG. 33 at line 3314, in creating the parameter, the value of "5" is used as the customized default value, rather than the default value of "1". Referring again to FIG. 18, the parameter data for the cdf parameter that has been created is stored in the user level parameter data storage 937 as user-level data. Step 1816 returns the procedure to step 1808 to process the next cdf parameter.

A similar process is carried out for global variable "PNR", resulting in the value "1.5" being substituted for the default value of 1. For the global variables "NDEFL" and "PDEFL", a value of 1.5 exists in the central text file and so, at step 1808, these parameters are created. For each of the library cdf parameters "m", "gateSize", "toolFilter", "bnPLib", "bnNLib", "paramX" and "paramY" a value does not exist in the central text file and so the default values defined by the procedure "MScdfLibCreateBaseParam( )" are used. When all of the parameters contained in the group have been processed, the procedure is done and control is returned to the schematic create engine at step 1708.

At step 1708, a design schematic is opened. At step 1710, the circuit designer places an instance on the schematic, which, in the example, is assumed to be instance GNA0 of the NAND gate which is illustrated in FIG. 1. Step 1712 calls the initialization procedure "MScdfGateIP( )".

Referring to FIGS. 19 and 20, the procedure "MScdfGateIP( )" begins at step 1902. Step 1903 determines that a property form is not being created and step 1904 determines that an Add Component form, such as Add Component form 2000, is being created. Step 1906 receives the cdf parameters one at a time. For each of the global variables "NDEFW", "PNR", "PDEFL" and "NDEFL", and for each of the library cdf parameters, "m", "gateSize", "toolFilter", "bnPLib", "bnNLib", "paramX" and "paramY", step 1908 bypasses the form customizing steps 1910–1922 because form customizing information provided by these parameters has been done by the procedure "MScdfLibCreateUserParam( )".

However, for each gate cdf parameter, such as gate cdf parameters bnP, bnN, Wn, Wp, Ln and Lp, for example, steps 1910–1922 customize the cdf parameter if a customizing value has been entered using the CIW. Thus, when step 1908 determines that the parameter being processed is not a global variable or a library cdf parameter, the procedure continues to step 1910 which determines whether the parameter being processed is bnP or bnN. If the parameter being processed is either one of these parameters, the procedure continues to step 1912. In the example, neither of these parameters is defined in CIW and so the procedure continues to step 1916 which updates the parameter bnPDisplay (and then parameter bnNDisplay) by obtaining the default values bnPLib (or bnNLib) from the library cdf parameter database if the parameter has not been customized, or from the object database 1635 if the parameter has been customized.

However, if a customizing value such as "gnd!" has been entered using the CIW, step 1912 determines that the parameter is defined in the CIW and so the procedure continues to step 1914 to customize the display parameter bnNDisplay. For example, the value displayed for the parameter bnN will be "gnd!" rather than the default value of "vbb!". In either case, the procedure continues to step 1924 which returns to step 1906 to process the next parameter.

When step 1908 determines that the parameter being processed is parameter Wn, at step 1910, the procedure continues to step 1918 which determines whether the parameter Wn is defined in CIW. If a value, such as Wn="23", has been entered using the CIW, step 1920 finds the value and 1922 causes the number "23" to be stored in temporary memory for use by the procedure MS_cdfGateModeCB( ). In this case, the numerical value of "23" would be displayed on the Add Component form 2000 (FIG. 20) rather than the default expression "iPar("NDEFW")". However, in the present example, no customizing value for parameter Wn has been entered using the CIW and so the Add Component form displays the default expression for the parameter Wn.

When the gate parameters "Wp" "Lp" and "Ln" are processed, the step 1918 determines that these parameters are not defined in CIW and so these gate parameters are not customized.

When customization of the Add Component form has been completed and any changes in the default settings have been entered, the circuit designer places the gate instance using one of the input devices 925 (FIG. 9), such as by a click of the mouse. This causes the customized form display information to be stored in the object database portion of the schematic object database 1635 that is created for the current instance. In addition, at step 1713, the procedure "MScdfGateDP( )" of the database compactor 1616 is run to update the schematic object database 1635. The manner in which the procedure "MScdfGateDP( )" updates the schematic database has described above with reference to FIG. 22. In the example, the value for parameter Wn is a default value and so the value is not saved in the object database 1635. However, if a non-default value, such as "23", had been entered onto the Add Component form for the parameter Wn, using the CIW, the parameter would be saved in the object database.

Then, the circuit designer closes the Add Component form 2000 by selecting "Cancel" 407 on the form 2000. The customized parameter settings that have been chosen by the designer are established for future access. When customization of the Add Component form is complete, the initialization process (step 1712) is complete and step 1926 returns control to the schematic create driver 1610.

To illustrate the use of the property form created by the invention, it is assumed that the circuit designer selects a logic gate, such as NAND gate GNA0, and presses a "bind" key on the computer keyboard in the conventional manner, to initiate the object property editing function. This causes the procedure schHiObjectProperty( )" to be called at step 1716, which in turn calls the procedure MScdfGateIP( )". The procedure begins at step 1902 and step 1903 determines that the Edit Object Properties form is being produced. Accordingly, the procedure "MScdfGateIP( )" steps directly to step 1928 which updates the parameters bnPDisplay and the bnNDisplay. Step 1930 returns control to the schematic create driver 1610.

The procedure "schHiObjectProperty( )" displays the property form 2400 (FIG. 24). The information contained on property form 2400 corresponds to the information that has been entered onto the Add Component form. Thus, as can be seen, on the property form 2400, drive strength Wn is displayed in data box 2402 as the default expression "iPar ("NDEFW")". If drive strength Wn had been customized using the CIW, the value, such as "23" would be displayed in data box 2402. No tool filter has been selected and this is indicated at 2404. N mode is the default mode as indicated at 2406. The bulk node potentials for PMOS and NMOS devices are vpp! and vbb!, respectively at 2410 and 2412.

In the example, it is assumed that the circuit designer enters a value "10" for the parameter drive strength Wn onto data box 2402 and then selects "Apply" 405 to store this parameter value in the schematic object database 1635.

In response to selection of "Apply", the procedure jumps to step 1728 and calls the procedure "MScdfGateDP( )" to screen out the default values. Referring to FIG. 22, the procedure begins at step 2202. Step 2204 determines that N mode is active. Consequently, procedure "MScdfGateVerifyN( )" 2206 is called, beginning at step 2208 which stores the default expression for Wn, namely "iPar(NDEFW)" as "paramX". At step 2210, a numerical value is calculated for "paramX" using Cadence SKILL command cdsParam( ). In the example, the numerical value is "5". This value is compared with the value "10" for the parameter Wn that has been entered onto the active property form, and which just has been stored in the object database 1635 in response to selection of "Apply". Because the value of the parameter being displayed is not the default value, the parameter value for Wn is saved in the schematic object database 1635.

The flow continues to procedure "MScdfGatePurgeNP( )" 2214, the function of which is to delete from the schematic object database 1635 parameter values for any parameters, such as Wp, Lp and Ln, that are not displayed in N mode. In the example, NP mode has not been selected previously and so none of these values has been entered onto the property form. The procedure continues to procedure "MScdfGatePurgeExplicit( )" 2220, the function of which is to delete from the schematic object database 1635 parameter values for any parameters, such as wpA, wnA, etc. that are not displayed in N mode. Again, in the example, Explicit mode has not been selected and so values have not been entered onto the property form for parameters, such as wpA, wnA, etc. In the example, the property form now displayed corresponds to property form 400 (FIG. 4) wherein the parameter value for drive strength Wn is shown to be "10". Flow continues to step 2260 which runs the procedure MS_cdfVerifyBulk( ) to update the cdf parameters bnP and/or bnN.

Referring to FIG. 23, the procedure "MS_cdfVerify Bulk( )", which is similar to procedure MS_cdfGate Verify( ), begins at step 2302. Step 2304 processes the two parameters bnP and bnN in sequence. As parameter bnP is obtained, step 2306 stores the default expression iPar ("bnPLib") as a temporary variable that is identified as "paramY". This temporary variable is used in verifying that the value of the parameter being verified matches the corresponding default value.

After "paramY" has been stored, at step 2308, Cadence SKILL command cdsParam( ) is used to evaluate the expression "iPar("bnPLib")", that is stored as "paramY", and compares the value for "paramY" with the value for parameter "bnP" that is being displayed on the active property form. In the example, "paramY" evaluates to "vpp!" and the value of the parameter "bnP" is "vpp!". Thus, it is determined that the value for parameter bnP being displayed is the default value. Step 2310 deletes the parameter value for bnP from the object database because the default value can be obtained from the parameter database when required. However, for the case where the value of parameter bnP is "vcc!", which is not the default value, the currently active value of the parameter bnP is maintained in the schematic object database 1635 for the current instance. Step 2312 then returns to step 2304 and a similar process is carried out for the parameter "bnN" using the default expression "iPar ("bnNLib")". When both of the parameters bnP and bnN have been processed, step 2313 deletes "paramX" and "paramY". Then, step 2314 returns control to the schematic create engine 1605.

Figure 25:
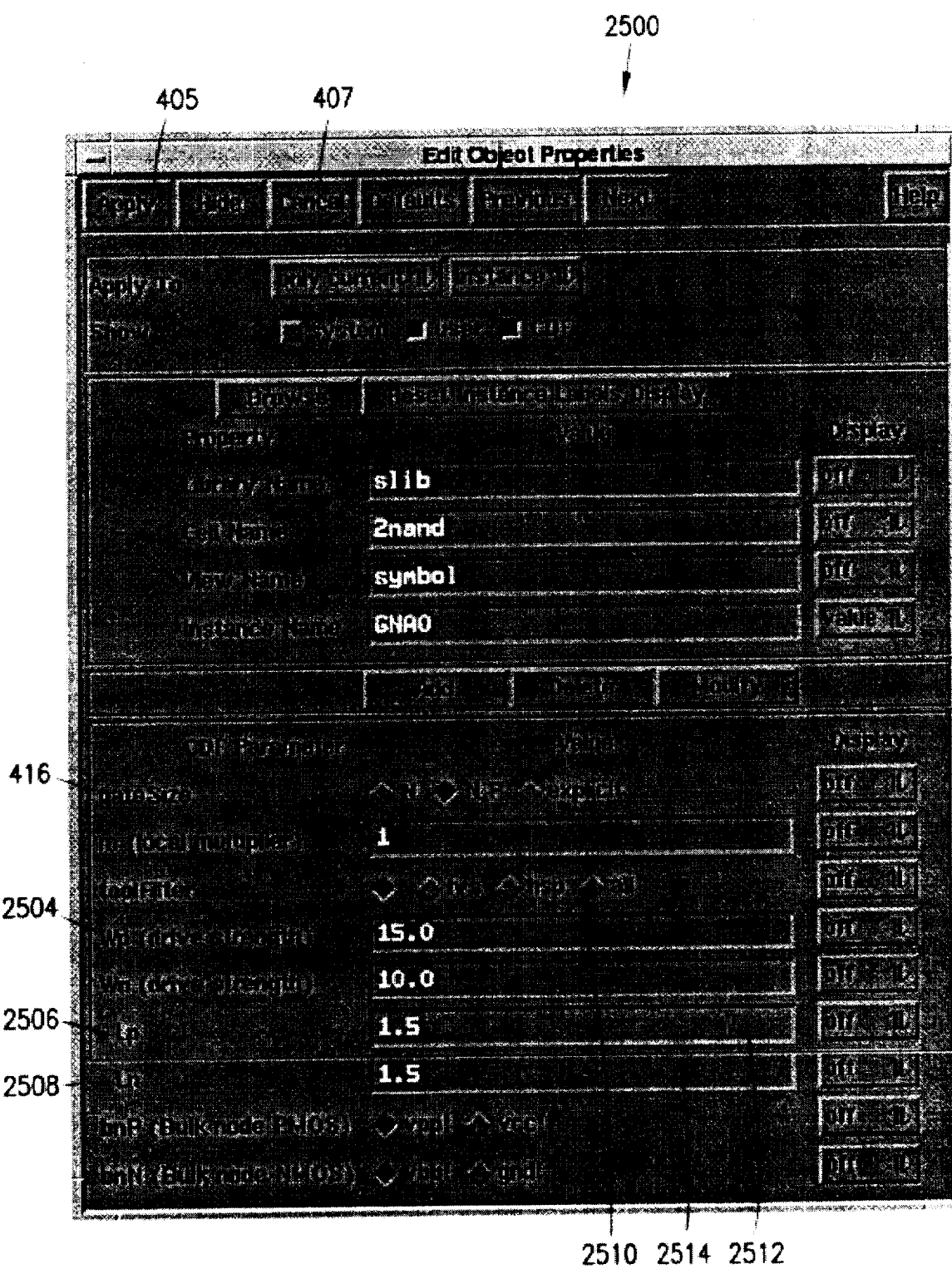
FIG. 25 is a representation of the property form that is displayed upon entering NP mode after drive strength has been specified.

The circuit designer can select a different mode by changing "gateSize" 414 (FIG. 4) on the active property form 400. For example, if the circuit designer selects NP mode, then step 1720 calls procedure "MScdfGateModeCB( )" of the form transformer 1615 to update all of the parameter values on the active property form, and the procedure continues to step 1722. The procedure "MScdfGateModeCB( )" determines if the parameter displayed by Cadence form displayer 1620 is an expression-type string whose value cannot be determined by evaluating the string. If so, Cadence SKILL command cdsParam( ) is used to calculate the corresponding value of the expression by using the global variables. Referring also to FIG. 25, in the example, labels 2504, 2506 and 2508 have been provided to indicate the default values for the parameters Wp, Lp and Ln. The numerical value of "10" is displayed for parameter Wn. In addition, the procedure "MScdfGateModeCB( )" provides numerical values for parameters Wp, Lp and Ln and displays these values as the number "15" in data box 2510, the number "1.5" in data box 2512, and the number "1.5" in data box 2514, respectively.

More specifically, with reference to FIG. 21, the procedure "MScdfGateModeCB( )" begins at step 2102. Step 2103 determines that an Add Component form is not being produced and flow continues to step 2104. Step 2104 determines that NP mode has been selected. Step 2108 selects parameter Wp and step 2110 determines that a default expression is being displayed. Step 2112 calculates a numerical value for the default value for parameter Wp by evaluating for default expression for the parameter Wp, which in the example is given by Wp=iPar(PNR)*iPar(Wn). In the example, the value for parameter "Wn" is "10" and the default value "PNR" is 1.5. Accordingly, step 2112 uses Cadence SKILL command cdsParam( ) to calculate a default value of "15" for the parameter Wp. This value is displayed in data box 2510 of the active property form 2500. The procedure returns to step 2108 which now selects parameter Wn. Step 2110 determines that a value of "10" is being displayed for parameter Wn and so the procedure jumps to step 2113 which returns to step 2108. In a similar manner, parameters Lp and Ln are processed in succession, and a numerical value is calculated by evaluating expressions, iPar("PDEFL") and iPar("NDEFL"), for parameters Lp and Ln, respectively, using the stored default values PDEFL and NDEFL. The numerical values of "1.5" for the parameters Lp and Ln are entered into data boxes 2512 and 2514 of the property form 2500.

Continuing with the illustration, it is now assumed that the circuit designer does not change any of these parameter values on the active property form 2500 and selects "Apply". When "Apply" 405 is selected, the procedure loops from step 1722 to step 1728 which calls procedure "MScdfGateDP( )" to screen out any default values that are being displayed on the active property form. In the example, the values of parameters Wp, Lp and Ln are all default values.

Referring additionally to FIG. 22, step 2204 determines that NP mode is selected. The procedure "MScdfGateVerifyNP( )" 2226 is called. Step 2228 selects parameter Wp and step 2230 stores the default expression for Wp, namely, "iPar(PNR)*iPar(Wn)". Then, at step 2232, Cadence SKILL command cdsParam( ) is used to evaluate this expression and the numerical value for the default expression "paramX" is compared with the numerical value for Wp that is being displayed on the active property form. In the example, the value "15" for the parameter Wp is the default value, and so, step 2234 of the procedure deletes this value from the schematic object database 1635. The procedure returns to step 2228 which selects parameter Wn. This parameter is processed in a similar manner, but the comparison operation performed by step 2232 determines that the value "10" is not the default value and accordingly, this value is maintained in the object database 1635. The procedure also determines that parameter values "1.5" for parameters Lp and Ln are default values and so these values are removed from the object database 1635. It is pointed out that although these parameter values have been deleted from the object database 1635, at this time, these parameters are still being displayed on the active property form, as shown in FIG. 25.

When all of the parameters have been processed, the procedure continues to procedure "MScdfGatePurgeExplicit( )" steps 2238–2240 which is effective only in response to a change to mode NP from mode Explicit. Thus, in the example, the parameters, wpA, wnA, lpA and lnA, etc. have not yet been displayed for the current instance and so parameter values have not been applied to any of these parameters. The procedure is done, step 1730, unless the circuit designer modifies the design at step 1732 (FIG. 17).

Figure 26:
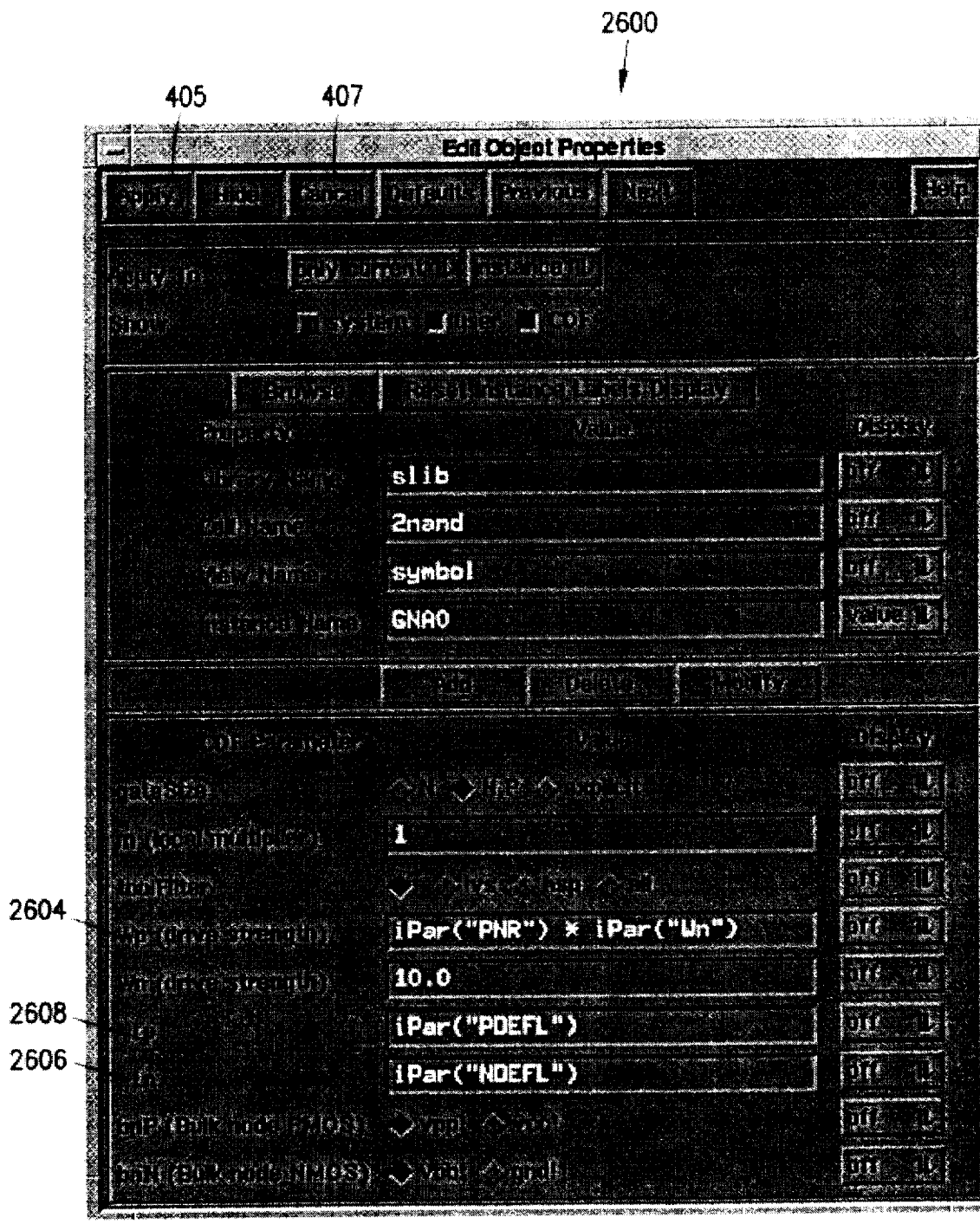
FIG. 26 is a representation of the property form of FIG. 25 after screening out default parameter values.

Digressing, if for any reason, the circuit designer now closes the property form 2500 by selecting "Cancel" 407 on the active property form 2500, and then subsequently reopens property form 2500, the parameters for which values have been deleted are displayed as the appropriate default expressions on the active property form. Thus, the property form appears as property form 2600 which is illustrated in FIG. 26. Note that parameter Wn is displayed as having the numerical value of "10" and parameters Wp, Lp and Ln are displayed in terms of their default expressions.

Referring again to FIG. 17 and to the property form 2500 shown in FIG. 25, after selecting "Apply" 405 on the property form 2500, the circuit designer can make changes in the value of one or more parameters of the current instance, if desired. In response to the entry of a further parameter value or values, from step 1728, the procedure, at step 1732, loops back to whatever mode was active at the time design of the current instance was complete. In the example, NP mode at step 1722 was active. The circuit designer can make any additional changes in the current instance of the design that are desired.

Figure 27:
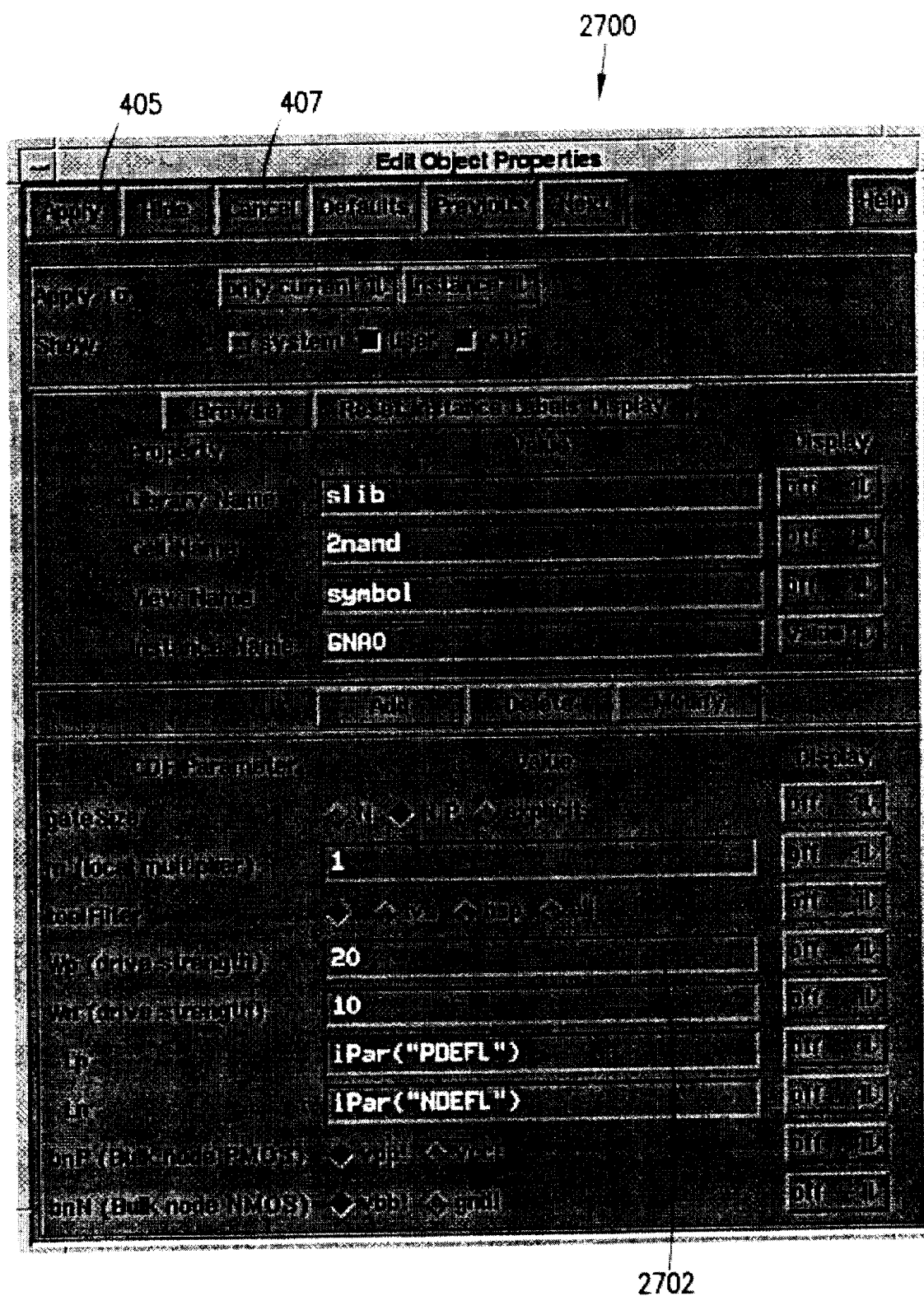
FIG. 27 is a representation of the property form of FIG. 26 after a parameter value has been entered for drive strength of p-channel devices.

For example, it is assumed that while in NP mode, at step 1722, the circuit designer now enters a non-default value of "20" for the drive strength parameter Wp as is illustrated into data box 2702 on the property form 2700 shown in FIG. 27. When "Apply" 405 is selected, this value is stored in the schematic object database 1635 and the procedure loops to step 1728 which calls the procedure "MScdfGateGate DP( )", beginning at step 2202 (FIG. 22). The procedure continues as has been described above to screen out any parameter values that are default values. In the present example, the parameter values for Wn and Wp are retained in the schematic object database 1635. If the property form 2700 is closed and subsequently reopened, the form appears as shown in FIG. 27. When the design of the current instance is completed, control is returned to the schematic create driver 1605 at step 1730. The procedure can be reentered at step 1710 in response to the circuit designer placing another instance on the schematic.

Digressing once again, assuming, that while in NP mode and after the non-default parameter values for Wp and Wn have been entered on property form 2700 as has been described, the circuit designer selects N mode, from either step 1722 or step 1728. Procedure "MScdfGateModeCB( )" is called, beginning at step 2102 (FIG. 21). The procedure passes through step 2103 and continues to step 2104 which determines that N mode is now selected and causes the property form for N mode to be displayed. Step 2106 causes the value for Wn to be displayed. In this embodiment, the non-default value for the parameter Wp is retained in the database, but is not displayed in N mode. When the circuit designer subsequently selects NP mode, the previously entered non-default value for Wp exists in the object database 1635 and will be displayed along with the non-default value for Wn. However, if "Apply" had been selected before switching to NP mode, the value for parameter Wp would have been deleted by MS_cdfGatePurgeNP( ) when the procedure MScdfGateDP( ) is called in response to selection of "Apply".

Referring again to FIG. 17, it is assumed now that while in NP mode, and for the property form 2700 shown in FIG. 27, the circuit designer selects Explicit mode. From step 1722, the procedure continues to step 1724 which calls procedure "MScdfGateModeCB( )" to update the display, and the Explicit mode is entered at step 1726. The property form that is displayed is property form 2800, shown in FIG. 28. Referring additionally to FIG. 28, selection of Explicit mode causes the property form to be changed to additionally include parameter labels 2804–2818 and data boxes 2824–2838, resulting in a property form that is similar to property form 700 (FIG. 7). A portion of the form 2800 includes the information displayed on the property form 2700 that is illustrated in FIG. 27, including labels for parameters Wp, Wn, Lp and Ln, the corresponding data boxes that contain parameter values "20" and "10" and default expressions iPar("PDEFL") and iPar("NDEFL"). Note that parameter labels 2804–2810 have the suffix "A" and parameter labels 2812–2818 have the suffix "B". Note also that the data boxes 2824, 2827, 2832 and 2834 contain numerical values, all of which are "20" in the example, for the channel width parameter data for both p-channel and n-channel devices. Also, data boxes 2828, 2830, 2836, and 2838 contain numerical values, all of which are "1.5" in the example, for the channel length parameter data for both p-channel and n-channel devices.

More specifically, with reference to FIG. 21, the procedure "MScdfGateModeCB( )" begins at step 2102 and step 2103 determines that an Add Component form is not being produced and flow continues to step 2104. Step 2104 determines that Explicit mode has been selected. It is pointed out that the library cdf parameter data contained in the database 936 from which the property forms for the current instance are created, includes the data needed to create parameter labels and data boxes for all of the parameters wpA, wnA, lpA, lnA, wpB, wnB, lpB, and lnB required for logic gate GNA0 for Explicit mode. Step 2114 of the procedure processes each of these parameters in sequence to determine for which, if any, of these parameters a parameter value exists, either obtaining the value from the object database 1635, or calculating the value using the appropriate default expressions and default values.

Step 2114 first selects the parameter "wpA". Step 2116 determines that no value for parameter "wpA" is stored in the object database 1635 and accordingly, step 2118 uses Cadence SKILL command cdsParam( ) to calculate a default value using the default expression iPar("Wp"), which evaluates to "20" in the example. This parameter value of "20" is displayed in data box 2824 for parameter wpA. A similar procedure is followed for each of the other parameters wnA, lpA, lnA, wpB, wnB, lpB, and lnB, calculating and displaying default values for these parameters as shown in FIG. 28. It is pointed out that in the case of wnA and wnB, the value of Wn is multiplied by "two" because their default expressions are "iPar(Wn)*2" for reasons discussed above.

Consequently, parameters wnA and wnB both have a parameter value of "20". In the example, in addition to the non-default values for Wp and Wn, the procedure has entered a value "20" for parameters "wpA and wpB", as shown in data boxes 2824 and 2832 on property form 2800 and has entered a value "20" for parameters "wnA" and "wnB", as shown in data boxes 2826 and 2734 on property form 2800. Also, a value of "1.5" has been entered for parameters "lpA","lnA", "lpB" and "lnB" as shown in respective data boxes 2828, 2830, 2836, and 2838.

As has already been described above with reference to NP mode and the property form 2500 shown in FIG. 25, when "Apply" 405 is selected on the property form 2800, the procedure "MScdfGateDP( )" (FIG. 22) is called to update the object database 1635 using the procedure MS_cdfGateVerify Explicit( ). This procedure is similar to the procedures MS_cdfGateVerifyN( ) and MS_cdfGateNP( ), except that at step 2248, "paramX" is stored for the default expression for each of the parameters wpA, wnA, lpA, lnA, wpB, wnB, lpB, and lnB, evaluated, and compared with the corresponding value displayed on the active property form. Because in the example all of these values correspond to the default values, step 2250 deletes these parameter values from the object database. If the property form is closed and subsequently reopened, the form appears as form 2900 (FIG. 29) because "Apply" has been selected calling procedure "MS_cdfGateVerifyExplicit( )" 2242. Referring to FIG. 29, as can be seen, the data boxes 2924-2938 display the default expressions for the parameters wpA, wnA, lpA, lnA, wpB, wnB, lpB, and lnB.

Referring to FIG. 21, continuing with the illustration of the procedure, it is assumed that the circuit designer now selects NP mode. The procedure "MScdfGateModeCB( )" is called to update the display of parameters. Step 2104 determines that NP mode is selected and steps 2108-2110 determine, sequentially, that numerical values are being displayed for parameters Wp and Wn. Also, step 2110 calculates numerical values for the default expressions for the parameters Lp and Ln and these values are displayed on the form.

Referring to FIG. 22, if, when NP mode is selected, the circuit designer selects "Apply", the procedure "MS_cdfGateVerifyNP( )" 2226 is called, beginning at step 2228. The procedure "_MS_cdfGateVerifyNP( )" screens, the values of parameters Wp, Wn, Lp and Ln, in sequence, to remove from the object database 1635, those parameter values that are equal to respective default values as has been described. Then, at steps 2238-2241, procedure "MS_cdfGatePurgeExplicit( )" 2220 deletes the parameter values for wpA, wnA, lpA, and lnA, and the parameter values for wpB, wnB, lpB, and lnB from the object database 1635 because these values are not displayed on the property form for NP mode.

If, on the other hand N mode is selected, the procedure is similar except that only parameter Wn is displayed. In the example, parameter Wn is displayed having a numerical value of "10". Initially, the non-default value for parameter Wp is retained in the database so that if the mode is changed back to the NP mode, for example a numerical value of "20" is displayed for parameter Wp. However, if "Apply" is selected, the parameter values for all of the parameters, other than parameter Wn, displayed while the Explicit mode was active are deleted from the object database 1635 by the procedures "MS_cdfGatePurgeNP( )" 2214 and "MS_cdfGatePurgeExplicit( )" 2220.

FIG. 30 is a listing of an exemplary code segment for the procedure "MScdfGateCreateBaseParam( )". FIGS. 30A, 30B and 30C provide a listing of an exemplary code segment for the procedure "MS_cdfGateCreate". FIGS. 31 and 31A provide a listing of an exemplary code segment for the procedure "MS_cdfGateExplicit". The lines of the code are numbered consecutively in FIGS. 30A, 30B and 30C and in FIGS. 31 and 31A, and the lines of the code that begin with the notation ";" are comments.

FIG. 32 is a listing of an exemplary code segment for the procedure MScdfLibCreateBaseParam( ). FIGS. 33, 33A and 33B provide a listing of an exemplary code segment for the procedure MScdfLibCreateParam( ). FIG. 34 is a listing of an exemplary code segment for procedure MScdfLibCreateUserParam( );

FIG. 35 is a listing of an exemplary code segment for the procedure MScdfGateIP( ). FIG. 36 is a listing of an exemplary code segment for the procedure MScdfGateModeCB( ). FIG. 37 is a listing of an exemplary code segment for the procedure MScdfGateDP( ). FIGS. 38 and 38A are a listing of an exemplary code segment for the procedures MS_cdfGateVerifyN; MS_cdfGateVerifyNP; and MS_cdfGateVerifyExplicit. The lines of the code are numbered consecutively in FIGS.38 and 38A. FIG.39 is a listing of an exemplary code segment for the procedure MS_cdfGatePurgeNP. FIG. 40 is a listing of an exemplary code segment for the procedure MS_cdfGatePurgeExplicit. FIG. 41 is a listing of an exemplary code segment for the procedure MS_cdfGateVerifyBulk( ). In FIGS. 35-41, any lines that begin with the notation ";" are comments.

What is claimed is:

1. A method for producing a property form for use in the creation of a design schematic for an integrated circuit that is being designed using a computer-aided design apparatus, wherein the property form includes a plurality of component description format parameters, each of the parameters having a default value, said method comprising:

providing a parameter database storing parameter data representing at least parameter labels and default expressions for component description format parameters for the devices that form each of a plurality of circuits defined in a cell library and for each of a plurality of design modes;

selecting one of the design modes;

selecting from the design library a circuit to be placed on the design schematic;

accessing the parameter database to obtain parameter data representing the parameter labels and the default expressions for component description format of the selected circuit and for the selected design mode; and providing the parameter data obtained to the property form so that the property form includes parameter labels and default expressions for component description format parameters of the current instance of the selected circuit for the selected design mode.

2. The method according to claim 1, wherein providing the parameter database includes specifying in a first one of said design modes, the component description format parameters of each circuit in terms of one single drive strength for the circuit, specifying in a second one of said design modes the component description format parameters of each circuit in terms of drive strengths for two types of devices that form the circuit, and specifying in a third one of said design modes the component description format parameters of each circuit in terms of a plurality of parameters of all of the devices that form the circuit.

3. The method according to claim 2, wherein providing the parameter database further includes accessing at least one data structure to obtain first data indicating the number of devices that form each of the circuits defined in the cell library and second data indicating the number of inputs for each of the circuits defined in the cell library; using said first and second data for creating for each of the circuits defined in the cell library, a first set of component description format parameters, each set of said first sets of parameters being unique to a different one of said circuits; and creating for each of the circuits defined in the cell library, a second set of component description format parameters for each of said plurality of circuits, the parameters of said second sets of parameters being the same for all of the circuits defined in the cell library.

4. The method according to claim 2, including specifying, in said third design mode, component description format parameters in terms of component description format parameters that are specified in said second design mode and specifying, in said second design mode, at least one component description format parameter in terms of a component description format parameter that is specified in said first design mode.

5. The method according to claim 1, including changing from said selected design mode to a different one of said design modes, and wherein the step of providing the parameter data to the property form includes the steps of obtaining numerical values for the default expressions, and displaying the numerical values on the property form that is produced for said different mode in response to changing to said different mode.

6. The method according to claim 5, including entering onto the property form a value for at least one component description format parameter that is indicated by a default expression on the property form to produce design data for the current instance of the selected circuit, and saving the design data in a further database, wherein saving the design data includes compacting the further database.

7. The method according to claim 6, wherein compacting the further database includes the steps of screening the parameter values for at least certain ones of the component description format parameters displayed on the property form to determine parameter values that are default values, and saving in the further database only non-default parameter values.

8. The method according to claim 7, wherein screening the parameter values includes the steps of calculating a numerical value for the default expressions for parameters being displayed on the property form, and comparing the numerical values calculated for the default expressions with numerical values for component description format parameters that have been entered onto the property form.

9. The method according to claim 8, including changing from said one design mode to a different one of said design modes prior to saving the design data, and wherein the step of providing the parameter data to the property form includes deleting from the further database parameter values for certain ones of the component description format parameters after changing from the third mode to one of said other modes or from the second mode to the first mode.

10. A method for producing a property form for use in the creation of a design schematic for an integrated circuit that is being designed using a computer-aided design apparatus, wherein the property form includes a plurality of component description format parameters, each of the parameters having a default value, said method comprising:

providing a parameter database storing parameter data representing at least parameter labels, default expressions for parameter values, and standard default values for component description format parameters for devices that form each of a plurality of circuits that are contained in a cell library and for each of a plurality of design modes;

providing a data structure for storing data for customizing the default values;

selecting one of the circuits contained in the cell library;

selecting one of the design modes;

accessing the parameter database to obtain the parameter data for the selected circuit for the selected design mode so that the property form includes parameter labels and default expressions for the current instance of the selected circuit and for the selected design mode;

entering into the data structure a customizing value for the standard default value for at least one of the component description format parameters of the selected circuit; and replacing the standard default value for said one parameter with the customizing value.

11. The method according to claim 10, including changing from the selected design mode to a different one of said design modes, including the step of providing the parameter data to the property form which includes the steps of calculating numerical values for the default expressions, and displaying the numerical values on the property form that is produced for said different design mode in response to changing to said different design mode.

12. The method according to claim 11, wherein a value for at least one of the default expressions is entered onto the property form to produce design data for the current instance of the circuit and the design data is saved in an object database, and wherein saving the design data in the object database includes the steps of screening the parameter values for all of the parameters for which design data has been entered onto the property form to determine parameter values that are default values for parameters, so that only non-default parameter values are retained in the object database.

13. A method for producing a property form for use in the creation of a design schematic for an integrated circuit that is being designed using a computer-aided design apparatus, wherein the property form includes a plurality of component description format parameters each having a default value, said method comprising:

providing a parameter database storing base level parameter data representing at least parameter labels and standard default values for the component description format parameters for devices that form each of a plurality of circuits that are contained in a cell library;

providing a customizing database for storing customizing values for default values for the parameters;

creating a user level parameter database by accessing the parameter database to obtain the base level parameter data for a selected circuit;

for each parameter having a customizing value stored in the customizing database, replacing the standard default value for the parameter with the customizing value so that the user level parameter database contains the customized value for the parameter; and providing the user level parameter data to the property form being produced.

14. A method for creating a parameter database for producing a property form that is used in the creation of a design schematic for an integrated circuit that is being designed using a computer-aided design apparatus, wherein the property form includes a plurality of component description format parameters each having a default value; said method comprising:

accessing at least one data structure to obtain first data indicating the number of devices that form each of a plurality of logic gates defined in a cell library and second data indicating the number of inputs for each of the logic gates defined in the cell library;

using said first and second data to create for each of the logic gates, and for each of a plurality of design modes, a first set of component description format parameters, each set of said first sets of parameters being unique to a different one of said logic gates;

creating for each of said logic gates, and for each of the design modes, a second set of component description format parameters for each of said plurality of logic gates, the parameters of said second sets of parameters being the same for all of said logic gates.

said first sets of parameters and said second sets of parameters providing parameter data representing at least parameter labels, default expressions for parameter values, and default values for the devices that form each of a plurality of logic gates defined in a cell library and for each of a plurality of design modes and for said plurality of design modes; and storing the parameter data in a storage device to provide the parameter database.

15. A method for creating a parameter database for use in producing property forms that are used in the creation of a design schematic for an integrated circuit that is being designed using a computer-aided design apparatus, wherein the property form includes a plurality of component description format parameters each having a default value, said method comprising the steps of:

producing parameter data representing at least parameter labels, default expressions for parameter values and default values for component description format parameters for devices that form each of a plurality of logic gates defined in a cell library and for at least first, second, and third design modes;

including specifying in the first design mode, the component description format parameters of each logic gate in terms of one single drive strength for the logic gate.

specifying in the second design mode the component description format parameters of each logic gate in terms of drive strengths for two types of devices that form the logic gate, and specifying in the third design mode the component description format parameters of each logic gate in terms of a plurality of component description format parameters of all of the devices that form the logic gate; and storing the parameter data in a storage device to provide the parameter database.

16. A system for producing a property form for use in the creation of a design schematic for an integrated circuit that is being designed using a computer-aided design apparatus, said system comprising:

a processing unit;
a display screen;
a data structure providing a parameter database including parameter data representing at least parameter labels and default value expressions for parameter values for component description format parameters for the devices that form each of a plurality of circuits defined in a cell library and for each of a plurality of design modes;

a mode selector for selecting one of the design modes;

a data accessor for accessing the parameter database to obtain parameter data representing the parameter labels and the default value expressions for parameter values for component description format parameters for devices that form a selected circuit and for the selected design mode; and a schematic create engine for producing a property form that includes component description format parameters for a circuit placed on the schematic and for displaying the property form on said display screen, the schematic create engine performing the steps of:

placing a selected circuit on the design schematic; and
using the parameter data obtained from the parameter database to produce the property form for the current instance of the selected circuit, so that the property form includes parameter labels and the default value expressions for the selected design mode.

17. The system according to claim 16, wherein the component description format parameters of each circuit are specified in terms of one single drive strength of the circuit for a first one of said design modes, wherein the component description format parameters of each circuit are specified in terms of the drive strengths for two types of devices that form the circuit in a second one of said design modes, and the component description format parameters of each circuit are specified in terms of a plurality of parameters of all of the devices of the circuit in a third one of said design modes.

18. The system according to claim 17, and including a form create engine for providing the first data structure, said form create engine performing the steps of:

accessing at least one data structure to obtain first data indicating the number of devices that form each of the circuits defined in the cell library and second data indicating the number of inputs for each of the circuits defined in the cell library;

using said first and second data for creating for each of the circuits defined in the cell library a first set of component description format parameters, each set of said first set of parameters being unique to a different one of said circuits; and creating for each of the circuits defined in the cell library, a second set of component description format parameters for each of said plurality of circuits, the parameters of said second set of parameters being the same for all of the circuits defined in the cell library.

19. The system according to claim 18, wherein, in providing parameter data to the property form in response to a change from said one design mode to a different one of said design modes, the schematic create engine performs the additional steps of obtaining numerical values for the default expressions; and displaying the numerical values on the property form that is produced for said different mode in response to changing to said different mode.

20. The system according to claim 17, and including an input device for entering parameter data for specifying a value for at least one component description format parameter that is indicated by a default expression on the property form to provide design data for the current instance of the selected circuit; and a further database for saving the design data, and wherein, in saving the design data in the further database, the schematic create engine performs the additional step of compacting the further database.

21. The system according to claim 20, wherein in compacting the further database, said schematic create engine performs the additional step of screening the parameter values for at least certain ones of the component description format parameters displayed on the property form to determine parameter values that are default values; and saving in the further database only non-default parameter values.

22. The system according to claim 21, wherein, in screening the parameter values, said schematic create engine performs the additional steps of calculating a numerical value for the default expressions for component description format parameters that have been entered onto the property form; and comparing the numerical values calculated for the default expressions with numerical values for component description format parameters that have been entered onto the property form.

23. The system according to claim 17, wherein, in providing the parameter data to the property form, said schematic create engine performs the additional step of removing from the further database parameter values for certain ones of the parameters after changing from the third mode to one of said other modes or from the second mode to the first mode.

24. A system for producing a property form for use in the creation of a design schematic for an integrated circuit that is being designed using a computer-aided design apparatus, said system comprising:

a processing unit;

a display screen;

a data structure providing a database including base level parameter data representing at least parameter labels and default value expressions for parameter values for component description parameters for the devices that form each of a plurality of circuits defined in a cell library;

a customizing database for storing customizing values for default values;

an input device for entering customizing values for the default values; and a schematic create engine for producing a property form that includes parameter values for a circuit placed on the schematic and for displaying the property form on said display screen, the schematic create engine performing the steps of: opening the schematic;

creating a user level database by accessing the parameter database to obtain base level parameter data for a selected circuit;

for each parameter having a customizing value in the customizing database, replacing a default value for the parameter with the customizing value so that the user level parameter database contains the customized value for the parameter; and providing the user level parameter data to the property form being produced.

25. A computer program product comprising computer useable medium having computer readable program code means embodied thereon for use in controlling a computer in the creation of a property form for use in the creation of design schematic using computer-aided design apparatus; the computer readable program code means in said computer program product comprising:

computer readable program code means for causing a computer to provide a parameter database storing parameter data representing at least parameter labels and default expressions for parameter values for component description format parameters for the devices that form each of a plurality of circuits defined in a cell library and for each of a plurality of design modes;

computer readable program code means for causing a computer to select one of the design modes;

computer readable program code means for causing a computer to select a circuit to be placed on the design schematic;

computer readable program code means for causing a computer to access the parameter database to obtain parameter data representing the parameter labels and the default expressions for the component description format parameters of the selected circuit and for the selected design mode; and computer readable program code means for causing a computer to provide the parameter data obtained to the property form so that the property form includes parameter labels and default expressions for component description format parameter of the current instance of the selected circuit for the selected design mode.

26. The computer program product according to claim 25, further comprising computer readable program code means for causing a computer to specify in a first one of said design modes, the component description format parameters of each circuit in terms of one single drive strength of the circuit;

computer readable program code means for causing a computer to specify in a second one of said design modes, the component description format parameters of each circuit in terms of drive strengths for two types of devices that form the circuit; and computer readable program code means for causing a computer to specify in a third one of said design modes, the component description format parameters of each circuit in terms of a plurality of component description format parameters of all of the devices that form the circuit.

27. The computer program product according to claim 26, further comprising computer readable program code means for causing a computer to obtain first data indicating the number of devices that form each of the circuits defined in the cell library and second data indicating the number of inputs for each defined in the cell library;

computer readable program code means for causing a computer to use said first and second data for creating for each of the circuits defined in the cell library, a first set of component description format parameters, each set of said first set of parameters being unique to a different one of said circuits; and computer readable program code means for causing a computer to create for each of the circuits defined in the cell library, a second set of component description format parameters for each of said plurality of circuits, the parameters of said second set of parameters being the same for all of the circuits defined in the cell library.

28. The computer program product according to claim 26, further comprising computer readable program code means for causing a computer to obtain numerical values for the default expressions; and computer readable program code means for causing a computer to display the numerical values on the property form that is produced for said different mode in response to changing to said different mode.

29. The computer program product according to claim 26, wherein a value is entered onto the property form for at least one of the component description format parameters that is indicated by a default expression on the property form to produce design data for the current instance of the selected circuit; and further comprising computer readable program code means for causing a computer to compact the further database.

30. The computer program product according to claim 29, further comprising computer readable program code means for causing a computer to screen the parameter values for parameters on the property form to determine parameter values that are default expressions for parameters; and computer readable program code means for causing a computer to save in the further database only non-default parameter values.

31. The computer program product according to claim 30, further comprising computer readable program code means for causing a computer to calculate a numerical value for the default expressions for parameters that have been entered onto the property form, and computer readable program code means for causing a computer to compare the numerical values calculated for the default expressions with numerical values for component description format parameters that have been entered onto the property form.

32. The computer program product according to claim 26, further comprising computer readable program code means for causing a computer to remove from the further database parameter values for certain ones of the parameters after changing from the third mode to one of said other modes or from the second mode to the first mode.

33. A computer program product comprising computer useable medium having computer readable program code means embodied thereon for use in controlling a computer in the creation of a property form for use in the creation of design schematic using computer-aided design apparatus; the computer readable program coded means in said computer program product comprising:

computer readable program code means for causing a computer to provide a parameter database storing base level parameter data representing at least parameter labels and standard default values for the component description format parameters for devices that form each of a plurality of circuits that are contained in a cell library;

computer readable program code means for causing a computer to provide a customizing database for storing customizing values for default values for the parameters;

computer readable program code means for causing a computer to create a user level parameter database by accessing the parameter database to obtain the base level parameter data for a selected circuit;

for each parameter having a customizing value stored in the customizing database, computer readable program code means for causing a computer to replace the standard default value for the parameter with the customizing value so that the user level parameter database contains the customized value for the parameter; and computer readable program code means for causing a computer to provide the user level parameter data to the property form being produced.

* * * * *

UNITED STATES PATENT AND TRADEMARK OFFICE
CERTIFICATE OF CORRECTION

PATENT NO. : 5,757,655
DATED : May 26, 1998
INVENTOR(S) : Bohr-Winn Shih et al.

It is certified that error appears in the above-identified patent and that said Letters Patent is hereby corrected as shown below:

At Col. 42, line 44, please insert "of the circuits" after --each--.

At Col. 44, line 3, please delete "coded" and insert --code--.

At Col. 1, line 60, please insert "to" after "able".

At Col. 6, line 41, please delete first ""A"" after "suffix".

At Col. 6, line 43, please delete first ""B"" after "suffix".

At Col. 7, line 41, please delete "programs" and insert --program--.

At Col. 15, line 1, please delete "whuch" and insert --which--.

Signed and Sealed this

Third Day of November, 1998

*Attest:*

BRUCE LEHMAN

*Attesting Officer*   *Commissioner of Patents and Trademarks*